US012772690B2

(12) United States Patent
Yue et al.

(10) Patent No.: US 12,772,690 B2
(45) Date of Patent: Oct. 20, 2026

(54) DISPLAY PANEL AND DISPLAY DEVICE

(71) Applicant: Wuhan Tianma Microelectronics Co., Ltd., Wuhan (CN)

(72) Inventors: Qin Yue, Wuhan (CN); Yangzhao Ma, Wuhan (CN); Wei Huang, Wuhan (CN); Enxia Wang, Wuhan (CN); Shengxiong Chen, Wuhan (CN); Ming Tang, Wuhan (CN); You Gao, Wuhan (CN); Gaojun Huang, Wuhan (CN); Zhongjie Zhang, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 342 days.

(21) Appl. No.: 18/652,532

(22) Filed: May 1, 2024

(65) Prior Publication Data

US 2024/0284745 A1 Aug. 22, 2024

(30) Foreign Application Priority Data

Dec. 29, 2023 (CN) ......................... 202311871033.9

(51) Int. Cl.
*H10K 59/35* (2023.01)
*H10K 59/122* (2023.01)

(52) U.S. Cl.
CPC ......... *H10K 59/353* (2023.02); *H10K 59/122* (2023.02); *H10K 59/352* (2023.02)

(58) Field of Classification Search
None
See application file for complete search history.

(56) References Cited

U.S. PATENT DOCUMENTS

2022/0310710 A1* 9/2022 Hu ........................ H10K 59/353

* cited by examiner

*Primary Examiner* — Kyoung Lee
(74) *Attorney, Agent, or Firm* — KDW Firm PLLC

(57) ABSTRACT

A display panel includes multiple first sub-pixels, multiple second sub-pixels and multiple third sub-pixels. The multiple first sub-pixels and the multiple second sub-pixels form first virtual quadrilaterals. The multiple third sub-pixels form second virtual quadrilaterals. A circumscribed parallelogram of a first sub-pixel is a first virtual shape. The center of the first sub-pixel does not coincide with the center of the first virtual shape. A circumscribed parallelogram of a second sub-pixel is a second virtual shape. The center of the second sub-pixel does not coincide with the center of the second virtual shape. At least one edge of the first sub-pixel that does not coincide with the first virtual shape includes a first edge. At least one edge of the second sub-pixel that does not coincide with the second virtual shape includes a second edge.

42 Claims, 19 Drawing Sheets

DISPLAY PANEL AND DISPLAY DEVICE

CROSS-REFERENCE TO RELATED APPLICATION

This application claims priority to Chinese Patent Application No. CN 202311871033.9, filed on Dec. 29, 2023, the disclosure of which is incorporated herein by reference in its entirety.

TECHNICAL FIELD

The present disclosure relates to the field of display technology and, in particular, to a display panel and a display device.

BACKGROUND

With the development of display technology, electronic products having a display function are widely applied in various fields, such as televisions, mobile phones, computers and personal digital assistants which are all electronic products having the display function, and have become an indispensable part of people's life and work. A display panel is a core structure for fulfilling a display function in an electronic product.

In the related art, an organic light-emitting diode (OLED) display panel has characteristics of self-luminescence, low power consumption, high brightness and fast response and thus has attracted wide attention. However, affected by the arrangement manner of sub-pixels in the OLED display panel, pixels in the display panel have undesired light emission, thereby affecting the overall display effect of the display panel.

SUMMARY

The present disclosure provides a display panel and a display device to improve undesired light emission of pixels, thereby improving the display effect of the display panel.

According to an aspect of the present disclosure, a display panel is provided. The display panel includes a plurality of first sub-pixels, a plurality of second sub-pixels and a plurality of third sub-pixels.

The plurality of first sub-pixels and the plurality of second sub-pixels form first virtual quadrilaterals, centers of the plurality of first sub-pixels are located at first vertices of the first virtual quadrilaterals, centers of the plurality of second sub-pixels are located at second vertices of the first virtual quadrilaterals, the first vertices and the second vertices are alternated and spaced apart, and the plurality of third sub-pixels are located within the first virtual quadrilaterals.

The plurality of third sub-pixels form second virtual quadrilaterals, centers of the plurality of third sub-pixels are located at vertices of the second virtual quadrilaterals, and one of a first sub-pixel of the plurality of first sub-pixels or a second sub-pixel of the plurality of second sub-pixels is located within a second virtual quadrilateral of the second virtual quadrilaterals.

A circumscribed parallelogram of the first sub-pixel is a first virtual shape, at least one edge of the first sub-pixel does not coincide with the first virtual shape, a center of the first sub-pixel does not coincide with a center of the first virtual shape, a circumscribed parallelogram of the second sub-pixel is a second virtual shape, at least one edge of the second sub-pixel does not coincide with the second virtual shape, and a center of the second sub-pixel does not coincide with a center of the second virtual shape.

The at least one edge of the first sub-pixel that does not coincide with the first virtual shape includes a first edge, the at least one edge of the second sub-pixel that does not coincide with the second virtual shape includes a second edge, and in at least part of adjacent first sub-pixels and second sub-pixels among the plurality of first sub-pixels and the plurality of second sub-pixels, an included angle between the first edge and the second edge is denoted as $\alpha 1$, and $0° \leq \alpha 1 \leq 45°$.

According to another aspect of the present disclosure, a display device is provided. The display device includes the preceding display panel.

It is to be understood that the content described in this section is neither intended to identify key or critical features of the embodiments of the present disclosure nor intended to limit the scope of the present disclosure. Other features of the present disclosure become easily understood through the description hereinafter.

BRIEF DESCRIPTION OF DRAWINGS

To illustrate technical solutions in embodiments of the present disclosure more clearly, drawings used in the description of the embodiments are briefly described below. Apparently, the drawings described below only illustrate part of the embodiments of the present disclosure, and those of ordinary skill in the art may obtain other drawings based on the drawings on the premise that no creative work is done.

DETAILED DESCRIPTION

Figure 1:
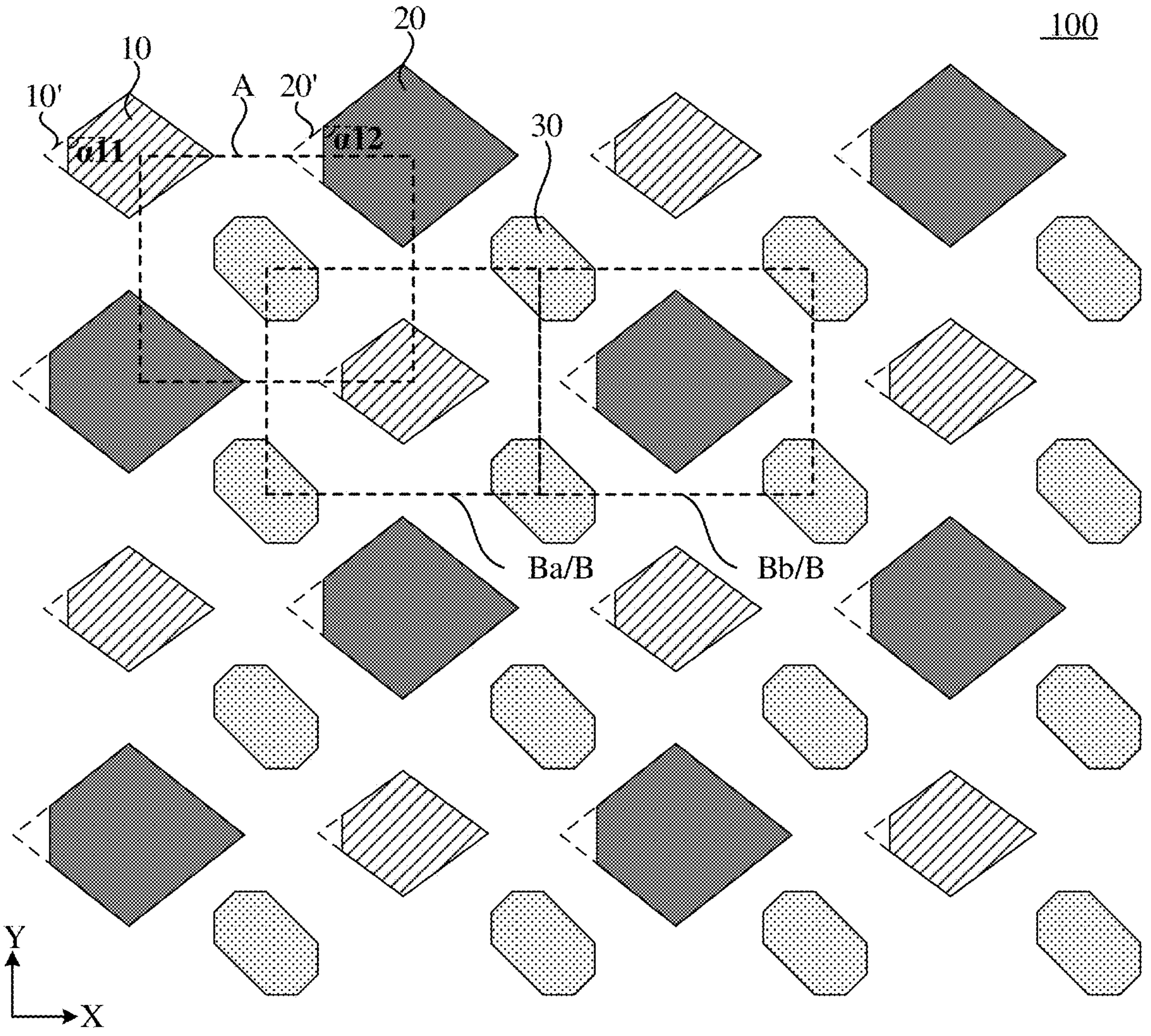
FIG. 1 is a diagram illustrating the structure of a display panel according to an embodiment of the present disclosure.

To make technical solutions of the present disclosure be better understood by those skilled in the art, the technical solutions in embodiments of the present disclosure are described below clearly and completely in conjunction with drawings in the embodiments of the present disclosure. Apparently, the embodiments described below are part, not all, of the embodiments of the present disclosure. Based on the embodiments of the present disclosure, all other embodiments obtained by those of ordinary skill in the art on the premise that no creative work is done are within the scope of the present disclosure.

The term "first", "second" and the like used in the embodiments of the present disclosure are used for distinguishing different components but not used for describing any order, quantity or significance. Similarly, the term "one", "a", "the" or the like does not mean a quantitative limit but indicates the existence of at least one. The term "including", "comprising", or the like means that elements or objects in front of the term cover elements or objects and their equivalents listed in the back of the term, but does not exclude other elements or objects. The term "connected", "connected to each other", or the like is not limited to physical or mechanical connections, but may include electrical connections, whether it is direct or indirect. "On", "below", "left", "right" and the like are only used for indicating the relative positional relationship, and when the absolute position of a described object is changed, the relative positional relationship may also change accordingly. In addition, the description of the same and equal involved in the embodiments of the present disclosure does not mean that two objects are completely equal in size and the same in shape. The two objects are allowed to be roughly the same or roughly equal within a certain error range.

It is to be noted that if not in collision, the embodiments of the present disclosure may be combined with each other.

Pixel arrangements of the current OLED display panel include "RGBG" arrangement, "delta" arrangement and "diamond" arrangement. Through the "RGBG" arrangement, the text is blurred, the strokes are relatively thick, and the picture display is relatively blurred. Through the "delta" arrangement, the displayed text has a relatively noticeable font aliasing. Through the "diamond" arrangement, the displayed text is clear, the strokes are relatively thin, and the sense of aliasing is relatively slight. However, the "diamond" arrangement still has some technical problems to be solved. For example, as the display resolution increases, distances between different sub-pixels in the display panel become smaller and smaller, resulting in a leakage current in a process of displaying the different sub-pixels. That is, a display current in a certain sub-pixel flows to a sub-pixel adjacent to the certain sub-pixel, which leads to the crosstalk between the different sub-pixels and the undesired light emission of sub-pixels, thereby affecting the display effect of the display panel.

To solve the preceding technical problems, an embodiment of the present disclosure provides a display panel. The display panel includes multiple first sub-pixels, multiple second sub-pixels and multiple third sub-pixels. The multiple first sub-pixels and the multiple second sub-pixels form first virtual quadrilaterals, centers of the multiple first sub-pixels are located at first vertices of the first virtual quadrilaterals, centers of the multiple second sub-pixels are located at second vertices of the first virtual quadrilaterals, the first vertices and the second vertices are alternated and spaced apart, and the multiple third sub-pixels are located within the first virtual quadrilaterals. The multiple third sub-pixels form second virtual quadrilaterals, centers of the multiple third sub-pixels are located at vertices of the second virtual quadrilaterals respectively, and one of a first sub-pixel or a second sub-pixel is located within a second virtual quadrilateral. A circumscribed parallelogram of the first sub-pixel is a first virtual shape, and at least one edge of the first sub-pixel does not coincide with the first virtual shape. The center of the first sub-pixel does not coincide with the center of the first virtual shape. A circumscribed parallelogram of the second sub-pixel is a second virtual shape, and at least one edge of the second sub-pixel does not coincide with the second virtual shape. The center of the second sub-pixel does not coincide with the center of the second virtual shape. The at least one edge of the first sub-pixel that does not coincide with the first virtual shape includes a first edge. The at least one edge of the second sub-pixel that does not coincide with the second virtual shape includes a second edge. In at least part of adjacent first sub-pixels and second sub-pixels, an included angle between the first edge and the second edge is denoted as $\alpha 1$, and $0° \leq \alpha 1 \leq 45°$.

With the preceding technical solutions adopted, the at least one edge of the first sub-pixel does not coincide with the circumscribed first virtual shape of the first sub-pixel, and the at least one edge of the second sub-pixel does not coincide with the circumscribed second virtual shape of the second sub-pixel so that the distance from the first sub-pixel to the second sub-pixel can be increased, display leakage current between the first sub-pixel and the second sub-pixel can be reduced, and the crosstalk between different sub-pixels and undesired light emission of sub-pixels can be improved, thereby improving the display effect of the display panel. Meanwhile, in at least part of the adjacent first sub-pixels and second sub-pixels, a relatively small included angle is provided between the first edge and the second edge so that a shape of the first sub-pixel and a shape of the second sub-pixel can be ensured to be consistent, and so that at least part of the adjacent first sub-pixels and second sub-pixels can have consistent display light emission situations, thereby facilitating the improvement in the display uniformity of the display panel.

The preceding is the core idea of the present disclosure. The technical solutions in the embodiments of the present disclosure are described clearly and completely hereinafter in conjunction with the drawings in the embodiments of the present disclosure.

FIG. 1 is a diagram illustrating the structure of a display panel according to an embodiment of the present disclosure. As shown in FIG. 1, the display panel 100 includes multiple first sub-pixels 10, multiple second sub-pixels 20 and multiple third sub-pixels 30. The multiple first sub-pixels 10 and the multiple second sub-pixels 20 form first virtual quadrilaterals A, centers of the multiple first sub-pixels 10 are located at first vertices of the first virtual quadrilaterals A, centers of the multiple second sub-pixels 20 are located at second vertices of the first virtual quadrilaterals A, the first vertices and the second vertices are alternated and spaced apart, and the multiple third sub-pixels 30 are located within the first virtual quadrilaterals A. The multiple third sub-pixels 30 form second virtual quadrilaterals B, centers of the multiple third sub-pixels 30 are located at vertices of the second virtual quadrilaterals B respectively, and one of a first sub-pixel 10 or a second sub-pixel 20 is located within a second virtual quadrilateral B. A circumscribed parallelogram of a first sub-pixel 10 is a first virtual shape 10', and at least one edge of the first sub-pixel 10 does not coincide with the first virtual shape 10'. The center of the first sub-pixel 10 does not coincide with the center of the first virtual shape 10'. A circumscribed parallelogram of a second sub-pixel 20 is a second virtual shape 20', and at least one edge of the second sub-pixel 20 does not coincide with the second virtual shape 20'. The center of the second sub-pixel 20 does not coincide with the center of the second virtual shape 20'. The at least one edge of the first sub-pixel 10 that does not coincide with the first virtual shape 10' includes a first edge 11. The at least one edge of the second sub-pixel 20 that does not coincide with the second virtual shape 20' includes a second edge 21. In at least part of adjacent first sub-pixels 10 and second sub-pixels 20, an included angle between the first edge 11 and the second edge 21 is denoted as $\alpha 1$, and $0° \leq \alpha 1 \leq 45°$.

The first sub-pixel 10, the second sub-pixel 20 and the third sub-pixel may have different emitted colors. For example, the first sub-pixel 10 may be a red sub-pixel whose emitted color is red, the second sub-pixel 20 may be a blue sub-pixel whose emitted color is blue, and the third sub-pixel 30 may be a green sub-pixel whose emitted color is green. However, the emitted colors of the first sub-pixel 10, the second sub-pixel 20 and the third sub-pixel 30 are not limited to this and may be designed according to actual requirements. In other optional embodiments, the colors of the first sub-pixel 10, the second sub-pixel 20 and the third sub-pixel 30 may also be the same or may also be not the same. On the premise that the core inventive points of the embodiment of the present disclosure can be achieved, the emitted colors of the first sub-pixel 10, the second sub-pixel 20 and the third sub-pixel 30 are not specifically limited in the embodiment of the present disclosure. For ease of description, the technical solution of the embodiment of the present disclosure is described exemplarily using an example in which the first sub-pixel 10, the second sub-pixel 20 and the third sub-pixel 30 have different emitted colors.

With continued reference to FIG. 1, the multiple first sub-pixels 10 and the multiple second sub-pixels 20 form the first virtual quadrilaterals A, the centers of the multiple first sub-pixels 10 are located at the first vertices of the first virtual quadrilaterals A, the centers of the multiple second sub-pixels 20 are located at the second vertices of the first virtual quadrilaterals A, and the first vertices and the second vertices are alternated and spaced apart. That is, two first sub-pixels 10 and two second sub-pixels 20 whose centers are located at four vertices of the same first virtual quadrilateral A respectively may be arranged in a standardized or a non-standardized 2*2 array, the same row of two sub-pixels may be a first sub-pixel 10 and a second sub-pixel 20 that have different emitted colors, and the same column of two sub-pixels may also be a first sub-pixel 10 and a second sub-pixel 20 that have different emitted colors so that each row and each column cannot have a single colored first sub-pixel 10 or a single colored second sub-pixel 20, and so that when a white picture is displayed, a single emitted color of the first sub-pixels 10 or the second sub-pixels 20 can be prevented from being displayed due to the edge of the display panel, thereby improving the color edge effect. Meanwhile, the third sub-pixel 30 is located within the first virtual quadrilateral A so that light rays emitted by the third sub-pixel 30 can simultaneously be mixed with light rays emitted by the two first sub-pixels 10 and light rays emitted by the two second sub-pixels 20, thereby facilitating the improvement in the display resolution of the display panel.

Correspondingly, the multiple third sub-pixels 30 form the second virtual quadrilaterals B, and the centers of the multiple third sub-pixels 30 are located at the vertices of the second virtual quadrilaterals B respectively, that is, third sub-pixels 30 that are located at four vertices of a respective second virtual quadrilateral B respectively are arranged in an array of 2*2, and one of a first sub-pixel 10 or a second sub-pixel 20 is located within a second virtual quadrilateral B. In this case, the second virtual quadrilaterals B may include two types. A first sub-pixels 10 of the multiple first sub-pixels 10 is located within a first-type second virtual quadrilateral Ba of the first-type second virtual quadrilaterals Ba, and a second sub-pixels 20 of the multiple second sub-pixels 20 is located within a second-type second virtual quadrilateral Bb of the second-type second virtual quadrilaterals Bb so that light rays emitted by third sub-pixels 30 located at vertices of the first-type second virtual quadrilateral Ba can be mixed with the light rays emitted by the first sub-pixel 10, and light rays emitted by third sub-pixels 30 located at vertices of the second-type second virtual quadrilateral Bb can be mixed with the light rays emitted by the second sub-pixel 20, thereby facilitating the improvement in the display resolution of the display panel.

It is to be understood that the centers of the multiple first sub-pixels 10, the centers of the multiple second sub-pixels 20 and the centers of the multiple third sub-pixels 30 that are mentioned in the embodiment of the present disclosure may be light emission centers of the multiple first sub-pixels 10, light emission centers of the multiple second sub-pixels 20 and light emission centers of the multiple third sub-pixels 30, respectively. The shapes of the first sub-pixel 10, the second sub-pixel 20 and the third sub-pixel 30 that are shown in FIG. 1 may be the shapes of light-emitting regions of the first sub-pixel, the second sub-pixel 20 and the third sub-pixel 30, respectively, and a light-emitting region of a sub-pixel is generally a region at which a light-emitting layer of the sub-pixel is located, and the light-emitting layer is generally formed in a pixel opening, so that the shapes of the first sub-pixel 10, the second sub-pixel 20 and the third sub-pixel 30 that are shown in FIG. 1 are the shapes of pixel openings of the first sub-pixel 10, the second sub-pixel 20 and the third sub-pixel 30, respectively. For ease of description, unless otherwise limited, the shapes of the first sub-pixel 10, the second sub-pixel 20 and the third sub-pixel 30 that are mentioned in the embodiment of the present disclosure are the shapes of the pixel openings of the first sub-pixel 10, the second sub-pixel 20 and the third sub-pixel 30 respectively.

The at least one edge of the first sub-pixel does not coincide with the first virtual shape, that is, one, two, or more edges of the first sub-pixel may not coincide with the first virtual shape. Similarly, the at least one edge of the second sub-pixel does not coincide with the second virtual shape, that is, one, two, or more edges of the second sub-pixel may not coincide with the second virtual shape. On the premise that the core inventive points of the present disclosure can be achieved, this is not specifically limited in the present disclosure.

Figure 2:
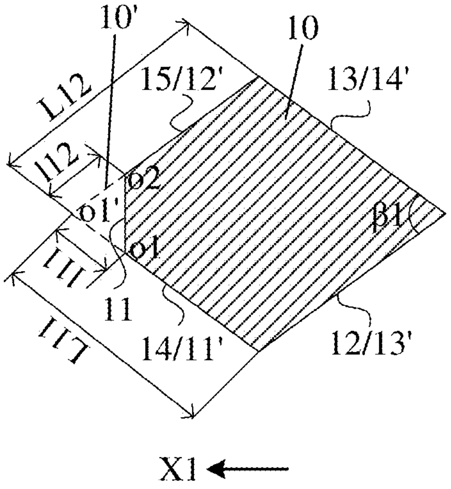
FIG. 2 is a diagram illustrating the structure of a first sub-pixel according to an embodiment of the present disclosure.

FIG. 2 is a diagram illustrating the structure of a first sub-pixel according to an embodiment of the present disclosure. As shown in FIG. 2, the circumscribed parallelogram of the first sub-pixel 10 is the first virtual shape 10', that is, the first sub-pixel 10 is located within the first virtual shape 10', so that at least three points of the first sub-pixel 10 can be located on the first virtual shape 10', and the at least one edge of the first sub-pixel 10 cannot coincide with the first virtual shape 10'. For example, the first virtual shape 10' may include four virtual edges 11', 12', 14' and 13' that are sequentially connected, the virtual edge 11' is parallel and equal to the virtual edge 14', and the virtual edge 12' is parallel and equal to the virtual edge 13'. The first sub-pixel 10 may include the first edge 11, a third edge 12, a fourth edge 13, a seventh edge 14 and an eighth edge 15. The first edge 11 does not coincide with the first virtual shape 10', that is, the first edge 11 is located within the first virtual shape 10', the third edge 12 and the fourth edge 13 coincide with the virtual edges 13' and 14' of the first virtual shape 10' respectively, and the seventh edge 14 and the eighth edge 15 partially coincides with the virtual edges 11' and 12' of the first virtual shape 10' respectively. In this case, the area of the first sub-pixel 10 is less than the area of a region surrounded by the first virtual shape 10', that is, with respect to the first virtual shape 10', the first sub-pixel 10 has a chamfer. If the minimum distance from the first edge 11 of the first sub-pixel 10 to other sub-pixels that are adjacent to the first sub-pixel 10 and are located on one side of the first edge 11 is the first distance, and the minimum distance from the first virtual shape 10' to the other sub-pixels that are adjacent to the first sub-pixel 10 and are located on the side of the first edge 11 is the second distance, the first distance is greater than the second distance, that is, the distance from the first sub-pixel 10 to the sub-pixels adjacent to the first sub-pixel 10 is increased, so that light emission interferences between the first sub-pixel 10 and the sub-pixels adjacent to the first sub-pixel 10 can be reduced, thereby improving the display effect of the display panel.

Figure 3:
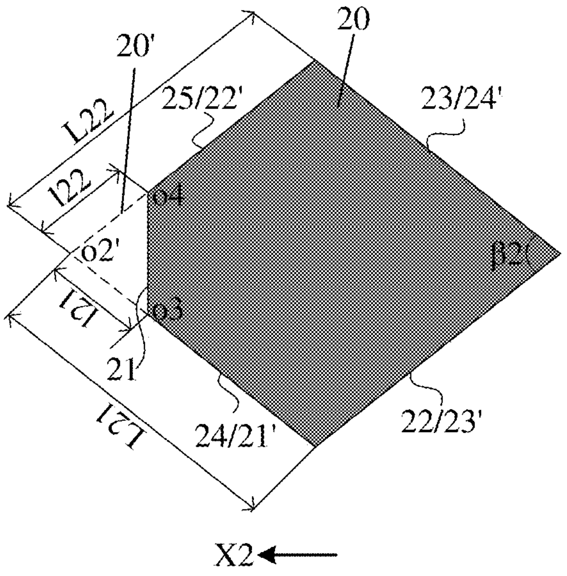
FIG. 3 is a diagram illustrating the structure of a second sub-pixel according to an embodiment of the present disclosure.

Similarly, FIG. 3 is a diagram illustrating the structure of a second sub-pixel according to an embodiment of the present disclosure. As shown in FIG. 3, the circumscribed parallelogram of the second sub-pixel 20 is the second virtual shape 20', that is, at least three points of the second sub-pixel 20 may be located on the second virtual shape 20', and the at least one edge of the second sub-pixel 20 does not coincide with the second virtual shape 20'. For example, the second virtual shape 20' may include four virtual edges 21', 22', 24' and 23' that are sequentially connected, the virtual edge 21' is parallel and equal to the virtual edge 24', and the virtual edge 22' is parallel and equal to the virtual edge 23'. The second sub-pixel 20 may include the second edge 21, a fifth edge 22, a sixth edge 23, a ninth edge 24 and a tenth edge 25. The second edge 21 does not coincide with the second virtual shape 20', that is, the second edge 21 is located within the second virtual shape 20', the fifth edge 22 and the sixth edge 23 coincide with the virtual edges 23' and 24' of the second virtual shape 20' respectively, and the ninth edge 24 and the tenth edge 25 partially coincide with the virtual edges 21' and 22' of the second virtual shape 20' respectively. With respect to the second virtual shape 20', the second sub-pixel 20 has a chamfer. If the minimum distance from the second edge 21 of the second sub-pixel 20 to other sub-pixels that are adjacent to the second sub-pixel 20 and are located on one side of the second edge 21 is the third distance, and the minimum distance from the second virtual shape 20' to the other sub-pixels that are adjacent to the second sub-pixel 20 and are located on the side of the second edge 21 is the fourth distance, the third distance is greater than the fourth distance, that is, the distance from the second sub-pixel 10 to some sub-pixels adjacent to the second sub-pixel 20 is increased, so that light emission interferences between the second sub-pixel 10 and the some sub-pixels adjacent to the second sub-pixel 10 can be reduced, thereby improving the display effect of the display panel.

It is to be understood that, with continued reference to FIG. 1, since the two first sub-pixels 10 and the two second sub-pixels 20 whose centers are located at the vertices of the same first virtual quadrilateral A respectively are arranged in the array of 2*2, that is, the multiple first sub-pixels 10 and the multiple second sub-pixels 20 may be alternately arranged along a first direction X or along a second direction Y. The first direction X and the second direction Y that are described herein are two directions intersecting, that is, the first direction X may be a row direction of an array formed by the multiple first sub-pixels 10 and the multiple second sub-pixels 20, and the second direction Y may be a column direction of the array formed by the multiple first sub-pixels 10 and the second sub-pixels 20. Therefore, the sub-pixels adjacent to the first sub-pixel 10 include a second sub-pixel 20, the sub-pixels adjacent to the second sub-pixel 20 include a first sub-pixel 10, and when the sub-pixel located on the side of the first edge of the first sub-pixel 10 is second sub-pixel 20, and the sub-pixel located on the side of the second edge of the second sub-pixel 20 is first sub-pixel 10, light emission interferences between the multiple first sub-pixel 10 and the multiple second sub-pixels 20 can be reduced.

It is also to be understood that lateral leakage currents are present between sub-pixels of the display panel, and the distance between two adjacent sub-pixels is the lateral leakage current distance between the two adjacent sub-pixels. Generally, the smaller the lateral leakage current distance, the smaller a potential barrier required for carriers to overcome when the carriers are transmitted between the two adjacent sub-pixels so that the larger the number of directional carriers moving between the two adjacent sub-pixels, the larger the lateral leakage current generated. On the contrary, the larger the lateral leakage current distance between the two adjacent sub-pixels, the smaller the lateral leakage current generated.

In conjunction with FIGS. 1 to 3, an example is used in which the sub-pixel located on the side of the first edge 11 of the first sub-pixel 10 is the second sub-pixel 20, and the sub-pixel located on the side of the second edge 21 of the second sub-pixel 20 is the first sub-pixel 10. In this case, the maximum distance between adjacent first sub-pixel 10 and second sub-pixel 20 is relatively large so that the lateral leakage current distance between the adjacent first sub-pixel 10 and second sub-pixel 20 can be relatively large, facilitating the reduction in the lateral leakage current between the adjacent first sub-pixel 10 and second sub-pixel 20 and improving the undesired light emission and optical crosstalk of the sub-pixels. In this way, the multiple first sub-pixels 10 and the multiple second sub-pixels 20 can be ensured to have relatively high display light emission accuracy, thereby facilitating the improvement in the display quality of the display panel.

Figure 4:
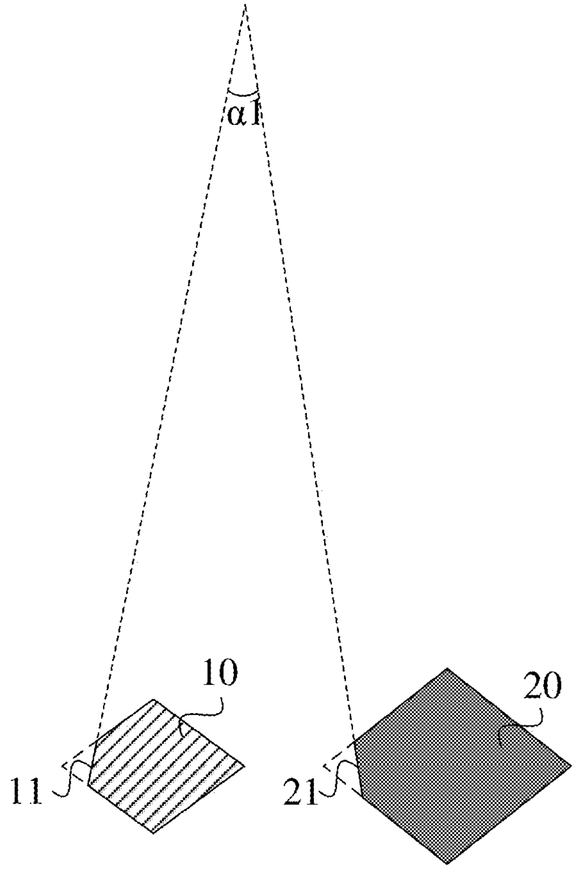
FIG. 4 is a diagram illustrating the structure of adjacent first sub-pixel and second sub-pixel according to an embodiment of the present disclosure.

In addition, FIG. 4 is a diagram illustrating the structure of adjacent first sub-pixel and second sub-pixel according to an embodiment of the present disclosure. In conjunction with FIGS. 1 to 4, in the at least part of adjacent first sub-pixels 10 and second sub-pixels 20, the included angle $\alpha 1$ between the first edge 11 and the second edge 21 is an included angle between an extension line of the first edge 11 and an extension line of the second edge 21, or when an included angle between the first edge 11 and the first direction X is denoted as $\alpha 11$, and an included angle between the second edge 21 and the first direction X is denoted as $\alpha 12$, the included angle $\alpha 1$ between the first edge 11 and the second edge 21 may be equal to $|\alpha 11-\alpha 12|$, that is, that the included angle $\alpha 1$ is provided between the first edge 11 and the second edge 21 does not indicate that the first edge 11 and the second edge 21 intersect. In other words, first edges 11 of all first sub-pixels 10 do not overlap second edges 21 of all second sub-pixels 20.

The value range of $\alpha 1$ is $0° \leq \alpha 1 \leq 45°$ so that in the at least part of adjacent first sub-pixels 10 and second sub-pixels 20, the first edge 11 and the second edge 21 can be parallel to each other or can have a relatively small included angle, that is, in the at least part of adjacent first sub-pixels 10 and second sub-pixels 20, the included angle $\alpha 1$ between the first edge 11 and the second edge 21 may be 0°, 5°, 10°, 20°, 30°, 40°, or 45°. On the premise that the core inventive points of the embodiment of the present disclosure can be achieved, this is not specifically limited in the embodiment of the present disclosure. In an optional embodiment, in the at least part of adjacent first sub-pixels 10 and second sub-pixels 20, extension directions of the first edge 11 and the second edge 21 are roughly the same so that the shapes of the multiple first sub-pixels 10 and the multiple second sub-pixels 20 can remain consistent. In this way, in the at least part of adjacent first sub-pixels 10 and second sub-pixels 20, the value range of the included angle $\alpha 1$ between the first edge 11 and the second edge 12 is $0° \leq \alpha 1 \leq 45°$ so that the shapes of the multiple first sub-pixels 10 and the shapes of the multiple second sub-pixels 20 can be similar, and so that the adjacent first sub-pixel 10 and second sub-pixel 20 can have consistent display light emission situations, thereby facilitating the improvement in the display uniformity of the adjacent first sub-pixel 10 and second sub-pixel 20 and the display effect of the display panel 100.

In conclusion, the at least one edge of the first sub-pixel does not coincide with the circumscribed first virtual shape of the first sub-pixel, and the at least one edge of the second sub-pixel does not coincide with the circumscribed second virtual shape of the second sub-pixel so that the distances from the multiple first sub-pixels to the multiple second sub-pixels can be increased, the display leakage currents between the multiple first sub-pixels and the multiple second sub-pixels can be reduced, and the crosstalk between the different sub-pixels and the undesired light emission of the sub-pixels can be improved, thereby improving the display effect of the display panel. Meanwhile, in at least part of the adjacent first sub-pixels and second sub-pixels, a relatively small included angle is provided between the first edge and the second edge so that the shapes of the multiple first sub-pixels and the shapes of the multiple second sub-pixels can be ensured to be consistent, and so that at least part of the adjacent first sub-pixels and second sub-pixels can have consistent display light emission situations, thereby facilitating the improvement in the display uniformity of the display panel.

Optionally, with continued reference to FIG. 2, the first sub-pixel 10 further includes the third edge 12 and the fourth edge 13 that coincide with the first virtual shape 10', that is, the first virtual shape 10' has virtual edges 13' and 14' so that the third edge 12 can coincide with the virtual edge 13', and the fourth edge 13 can coincide with the virtual edge 14'. The third edge 12 is connected to the fourth edge 13, a first included angle $\beta 1$ is formed at a joint between the third edge 12 and the fourth edge 13, and the first included angle $\beta 1$ is opposite to the first edge 11. In this case, the first edge 11 in the first sub-pixel 10 may be a cutting line for a chamfer in the first sub-pixel 10, and the magnitude of the chamfer may be determined by the length and inclination degree of the first edge 11 so that the distance increment between the first sub-pixel 10 and the other sub-pixels adjacent to the first sub-pixel 10 can be determined, thereby designing the length and inclination degree of the first edge 11 according to actual requirements to ensure a relatively large distance between the first sub-pixel 10 and the other sub-pixels adjacent to the first sub-pixel 10, reduce the lateral leakage current between the first sub-pixel 10 and the other sub-pixels adjacent to the first sub-pixel 10 and improve the optical crosstalk between the different sub-pixels and the undesired light emission of the sub-pixels.

Similarly, with continued reference to FIG. 3, the second sub-pixel 20 further includes the fifth edge 22 and the sixth edge 23 that coincide with the second virtual shape 20', that is, the second virtual shape 20' has virtual edges 23' and 24' so that the fifth edge 22 can coincide with the virtual edge 23', and the sixth edge 23 can coincide with the virtual edge 24'. The fifth edge 22 is connected to the sixth edge 23, a second included angle $\beta 2$ is formed at a joint between the fifth edge 22 and the sixth edge 23, and the second included angle $\beta 2$ is opposite to the second edge 21. In this case, the second edge 21 in the second sub-pixel 20 may be a cutting line for a chamfer in the second sub-pixel 20, and the magnitude of the chamfer may be determined by the length and inclination degree of the second edge 21 so that the distance increment between the second sub-pixel 20 and the other sub-pixels adjacent to the second sub-pixel 20 can be determined, thereby designing the length and inclination degree of the second edge 21 according to actual requirements to ensure a relatively large distance between the second sub-pixel 20 and the other sub-pixels adjacent to the second sub-pixel 20, reduce the lateral leakage current between the second sub-pixel 20 and the other sub-pixels adjacent to the second sub-pixel 20 and improve the optical crosstalk between the different sub-pixels and the undesired light emission of the sub-pixels.

In addition, the first edge 11 of the first sub-pixel 10 and the second edge 21 of the second sub-pixel 20 are cutting lines of the chamfers of the first sub-pixel 10 and the second sub-pixel 20 respectively so that when a relatively small included angle is provided between the first edge of the first sub-pixel 10 and the second edge 20 of the second sub-pixel 20 for at least part of adjacent first sub-pixels and second sub-pixels, the shapes of the multiple first sub-pixels 10 and the shapes of the multiple second sub-pixels 20 can remain consistent after the multiple first sub-pixels 10 and the multiple second sub-pixels 20 are chamfered, and the multiple first sub-pixels 10 and the multiple second sub-pixels 20 can have consistent light emission situations, thereby facilitating the improvement in the display uniformity of the display panel.

In an optional embodiment, in conjunction with FIGS. 1 to 3, a direction pointed from the first included angle $\beta 1$ to the first edge 11 is a first pointing direction X1; a direction pointed from the second included angle $\beta 2$ to the second edge 21 is a second pointing direction X2; and in the at least part of adjacent first sub-pixels 10 and second sub-pixels 20, the first pointing direction X1 is the same as the second pointing direction X2, that is, the chamfer orientation of the first sub-pixel 10 is the same as the chamfer orientation of the second sub-pixel 20, so that each of these first sub-pixels 10 and second sub-pixels 20 can have relatively a large distance to adjacent sub-pixel in the chamfer orientation direction of the first sub-pixel 10 or the second sub-pixel 20 respectively. In this way, lateral leakage currents between each of the first sub-pixels 10 and the second sub-pixels 20 and the adjacent sub-pixels of the first sub-pixel 10 or the second sub-pixel 20 can be reduced synchronously, and the display uniformity of the display panel can be improved while the optical crosstalk between the sub-pixels and the undesired light emission of the sub-pixels can be improved so that the display effect of the display panel can be improved.

It is to be noted that in the embodiment of the present disclosure, the first pointing direction and the second pointing direction in at least part of the adjacent first sub-pixels and second sub-pixels are the same. That is, as shown in FIG. 1, the first pointing direction and the second pointing direction of any adjacent first sub-pixel 10 and second sub-pixel 20 are the same. In this case, compared with before chamfering, center offset directions of the multiple first sub-pixels 10 and the multiple second sub-pixels 20 remain consistent so that a shape of the first virtual quadrilateral formed by lines connecting the centers of the first sub-pixels 10 and the second sub-pixels 20 can be rectangular. Alternatively, in other optional embodiments, the first pointing directions and the second pointing directions of only part of adjacent first sub-pixels 10 and second sub-pixels 20 may be the same while the first pointing directions and the second pointing directions of other part of adjacent first sub-pixels 10 and second sub-pixels 20 are different.

Figure 5:
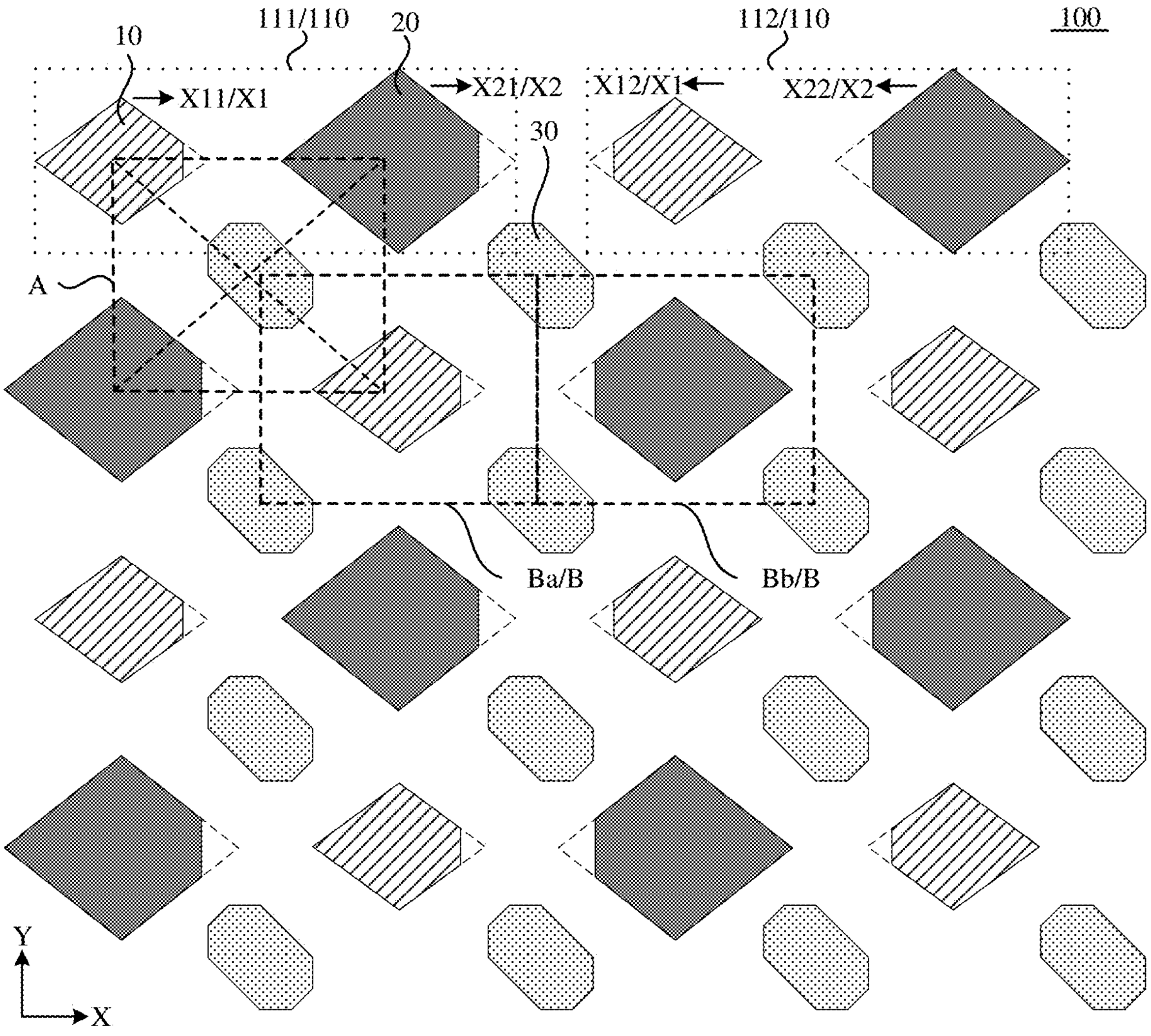
FIG. 5 is a diagram illustrating the structure of another display panel according to an embodiment of the present disclosure.

As a feasible embodiment, FIG. 5 is a diagram illustrating the structure of another display panel according to an embodiment of the present disclosure. As shown in FIG. 5, when the multiple first sub-pixels 10 and the multiple second sub-pixels 20 are alternately arranged along the first direction X, and a first sub-pixel 10 and a second sub-pixel 20 that are adjacent and arranged along the first direction X form a first pixel group 110, in the same first pixel group 110, the first pointing direction X1 is the same as the second pointing direction X2; and both first pointing directions X1 and second pointing directions X2 between two first pixel groups 110 that are adjacent and arranged along the first direction X are opposite.

In an exemplary embodiment, the two first pixel groups 110 that are adjacent and arranged along the first direction X are a first pixel group 111 and a second first pixel group 112. In this case, in the first pixel group 111, the first pointing direction X11 of the first sub-pixel 10 is the same as the first pointing direction X21 of the second sub-pixel 20, and in the second first pixel group 112, the first pointing direction X12 of the first sub-pixel 10 is the same as the first pointing direction X22 of the second sub-pixel 20 so that in the same first pixel group 110 (111 or 112), the chamfer orientations of the first sub-pixel 10 and the second sub-pixel 20 can remain consistent, and the first sub-pixel 10 and the second sub-pixel 20 can have consistent light emission situations, thereby improving the display uniformity of the first sub-pixel 10 and the second sub-pixel 20 in the same first pixel group 110 (111 or 112).

In addition, the first pointing direction X11 of the first sub-pixel 10 in the first pixel group 111 is opposite to the first pointing direction X12 of the first sub-pixel 10 in the second first pixel group 112 so that the chamfer orientations of the first sub-pixels 10 in the adjacent first pixel group 111 and second first pixel group 112 can be different, that is, compared with the situation in which the first sub-pixels 10 are not chamfered, light rays center offset directions of light rays emitted by the first sub-pixels 10 in the first pixel group 111 and the second first pixel group 112 are opposite, that is, light rays emitted by any two adjacent first sub-pixels 10 are ensured to have different light rays center offset directions in the first direction X to prevent the display light emission effect in the first direction X from being affected due to that the light rays centers of light rays emitted by first sub-pixels 10 in the first direction X offset toward the same side, thereby facilitating the uniform distribution of the light rays emitted by the first sub-pixels 10 in the first direction X, further improving the display color deviation in the first direction X and improving the display uniformity in the first direction X. Similarly, the second pointing direction X21 of the second sub-pixel 20 in the first pixel group 111 is opposite to the second pointing direction X22 of the second sub-pixel 20 in the second first pixel group 112 so that light rays center offset directions of light rays emitted by second sub-pixels 20 in the first pixel group 111 and the second first pixel group 112 can be opposite, that is, light rays emitted by any two adjacent second sub-pixels 20 are ensured to have different light rays center offset directions in the first direction X to prevent the display light emission effect in the first direction X from being affected due to that the light rays centers of light rays emitted by second sub-pixels 20 in the first direction X offset toward the same side, thereby facilitating the uniform distribution of the light emitted by the second sub-pixels 20 in the first direction X, further improving the display color deviation in the first direction X and improving the display uniformity in the first direction X.

It is to be understood that in addition to that the multiple first sub-pixels 10 and the multiple second sub-pixels 20 are alternately arranged along the first direction X, the multiple first sub-pixels 10 and the multiple second sub-pixels 20 may also be alternately arranged along the second direction Y intersecting the first direction X so that the multiple first sub-pixels 10 and the multiple second sub-pixels 20 can be arranged in an array in the first direction X and the second direction Y, and in the first direction X and the second direction Y, light rays emitted by any adjacent first sub-pixel 10 and second sub-pixel 20 can be mixed with each other, thereby preventing a single-colored color edge of a picture displayed by the display panel and ensuring the display quality of the display panel. In this case, first pointing directions of the multiple first sub-pixels 10 arranged along the second direction Y and second pointing directions of the multiple second sub-pixels 20 arranged along the second direction Y may be the same or different.

Figure 6:
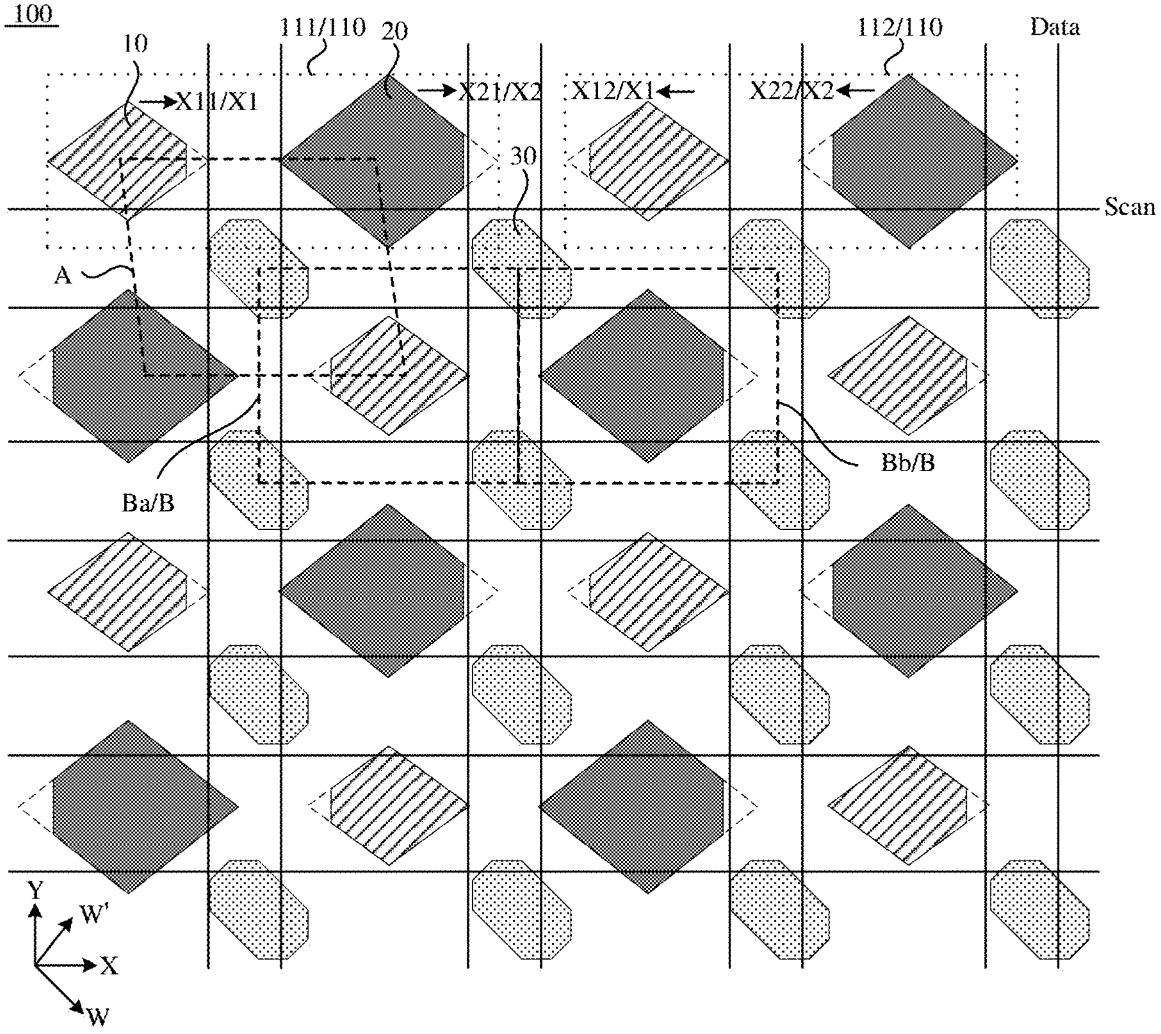
FIG. 6 is a diagram illustrating the structure of yet another display panel according to an embodiment of the present disclosure.

As another feasible embodiment, FIG. 6 is a diagram illustrating the structure of yet another display panel according to an embodiment of the present disclosure. As shown in FIG. 6, when the multiple first sub-pixels 10 and the multiple second sub-pixels 20 are alternately arranged along the first direction X and the second direction Y simultaneously, and the first direction X intersects the second direction Y, in a first sub-pixel 10 and a second sub-pixel 20 that are adjacent and arranged along the second direction Y, the first pointing direction X1 is opposite to the second pointing direction X2. In this way, light rays emitted by any two adjacent first sub-pixel 10 and second sub-pixel 20 are ensured to have different light rays center offset directions in the second direction Y so that the light rays emitted by the any two adjacent first sub-pixel 10 and second sub-pixel 20 can be distributed uniformly in the second direction Y, thereby improving the display color deviation in the second direction Y and improving the display uniformity in the second direction Y.

In an embodiment, with continued reference to FIG. 6, the first pointing directions X1 of the multiple first sub-pixels 10 arranged along the second direction Y are the same so that the light ray center offset directions of light rays emitted by the multiple first sub-pixels 10 arranged along the second direction Y can be the same, thereby facilitating the improvement in the display uniformity of the multiple first sub-pixels 10 arranged along the second direction Y; and/or the second pointing directions X2 of the multiple second sub-pixels 20 arranged along the second direction Y are the same so that the light ray center offset directions of light rays emitted by the multiple second sub-pixels 20 arranged along the second direction Y can be the same, thereby facilitating the improvement in the display uniformity of the multiple second sub-pixels 20 arranged along the second direction Y.

Meanwhile, when the first pointing direction X1 is opposite to the second pointing direction X2 in the first sub-pixel 10 and the second sub-pixel 20 that are adjacent and arranged along the second direction Y, center offset directions of the first sub-pixel 10 and the second sub-pixel 20 that are adjacent and arranged along the second direction are opposite so that the first virtual quadrilateral formed by lines connecting the centers of first sub-pixels 10 and second sub-pixels 20 that are adjacent and arranged along the first direction X, and first sub-pixels 10 and second sub-pixels 20 that are adjacent and arranged along the second direction Y can be a parallelogram.

Optionally, with continued reference to FIG. 6, the center of a first virtual quadrilateral A does not coincide with the center of a third sub-pixel 30 that is located within the first virtual quadrilateral A.

In an embodiment, when the display panel 100 displays an image, there is a color edge effect, that is, noticeable colorful strips deviating from an original image are prone to appear at the edge of the displayed image. For example, when the edge of the image includes red sub-pixels and blue sub-pixels that are arranged sequentially, after mixture, the red sub-pixels and the blue sub-pixels are prone to form a magenta color edge; and when the edge of the image includes green sub-pixels that are arranged sequentially, a green color edge is prone to form. The center of the first virtual quadrilateral A does not coincide with the center of the third sub-pixel 30 that is located within the first virtual quadrilateral A, so the positions of the first sub-pixels 10 and the positions of the second sub-pixels 20 at the vertices of the first virtual quadrilaterals A can be adjusted flexibly. When the edge of a display region includes first sub-pixels 10 and second sub-pixels 20 that are alternately arranged, the positions of the first sub-pixels 10 and/or the second sub-pixels 20 may be adjusted so that the first sub-pixels 10 and the second sub-pixels 20 at the edge of the display region cannot be on a straight line. This reduces the sensitivity of a human eye to rows (or columns) formed by the first sub-pixels 10 and the second sub-pixels 20 at the edge of the display region so that a magenta color edge effect can be weakened.

Optionally, with continued reference to FIG. 6, the center of a second virtual quadrilateral B does not coincide with the center of a first sub-pixel 10 that is located within the second virtual quadrilateral B (Ba); or the center of a second virtual quadrilateral B (Ba) does not coincide with the center of a second sub-pixel 20 that is located within the second virtual quadrilateral B. In this way, the center of the second virtual quadrilateral B does not coincide with the center of a sub-pixel that is located within the second virtual quadrilateral B, so the positions of the multiple third sub-pixels 30 at the vertices of the second virtual quadrilateral B can be adjusted flexibly. When the edge of the display region includes third sub-pixels 30, the positions of the third sub-pixels 30 may be adjusted so that the third sub-pixels 30 at the edge of the display region can be close to adjacent first sub-pixels 10 and second sub-pixels 20, thereby facilitating the mixed display of the third sub-pixels at the edge of the display region and the adjacent first sub-pixels and second sub-pixels to weaken the green color edge effect of the third sub-pixels 30 at the edge of the display region. In addition, the adjustment on the positions of the third sub-pixels 30 at the edge of the display region can further reduce the sensitivity of the human eye to rows (or columns) formed by the third sub-pixels 30 at the edge of the display region so that the green color edge effect can be weakened.

It is to be understood that in the embodiment of the present disclosure, the first direction X intersects the second direction Y so that an included angle can be provided between the first direction X and the second direction Y, and the included angle may be any angle greater than 0° and less than 180°. In this case, a row of sub-pixels may be the first direction X, and a column of sub-pixels may be the second direction Y; or a row of sub-pixels is the second direction Y, and a column of sub-pixels is the first direction X. This is not specifically limited in the embodiment of the present disclosure.

In an optional embodiment, with continued reference to FIG. 6, the display panel 100 further includes multiple scan lines Scan and multiple data lines Data that intersect; and an extension direction of the multiple scan lines Scan is the first direction X, and an extension direction of the multiple data lines Data is the second direction Y. In this case, at least some first sub-pixels 10 and/or at least some second sub-pixels 20 that are arranged along the first direction may share the same scan line, and at least some first sub-pixels 10 and/or at least some second sub-pixels 20 that are arranged along the second direction Y may share the same data line so that when scan signals transmitted by the multiple scan lines Scan are at enable levels, data signals on the multiple data lines Data can be controlled to be written into corresponding first sub-pixels 10 and/or second sub-pixels 20, thereby enabling the first sub-pixels 10 and the second sub-pixels 20 to display light emission according to the data signals received by the first sub-pixels 10 and the second sub-pixels 20.

It is to be noted that FIG. 6 solely exemplifies the arrangement manner of the multiple scan lines Scan and the multiple data lines Data, but in the embodiment of the present disclosure, the arrangement manner of the multiple scan lines Scan and the multiple data lines Data is not limited to this, and the multiple scan lines Scan and the multiple data lines Data may be set according to actual requirements based on that the multiple scan lines Scan extend along the first direction X, and the multiple data lines Data extend along the second direction.

In another optional embodiment, with continued reference to FIG. 6, the display panel 100 may further include a third direction W (W'). The third direction W (W') may intersect the first direction X and the second direction Y, that is, included angles may be present between the third direction W (W') and the first direction X and between the third direction W (W') and the second direction Y respectively, and the degree of the included angle between the third direction W (W') and the first direction X may be the same as or different from the degree of the included angle between the third direction W (W') and the second direction Y. This is not specifically limited in the embodiment of the present disclosure.

It is to be understood that the display panel may include two third directions (W and W'), the two third directions may be a first third direction W and a second third direction W', the first third direction W intersects the second third direction W', the first third direction W and the second third direction W' further intersect the first direction X and the second direction Y, and included angles between the first third direction W and the first direction X (or the second direction Y) may be the same as or different from included angles between the second third direction W' and the first direction X (or the second direction Y). This is not specifically limited in the embodiment of the present disclosure. For ease of description, unless otherwise limited, the third direction mentioned in the embodiments below refers to the first third direction W.

Figure 7:
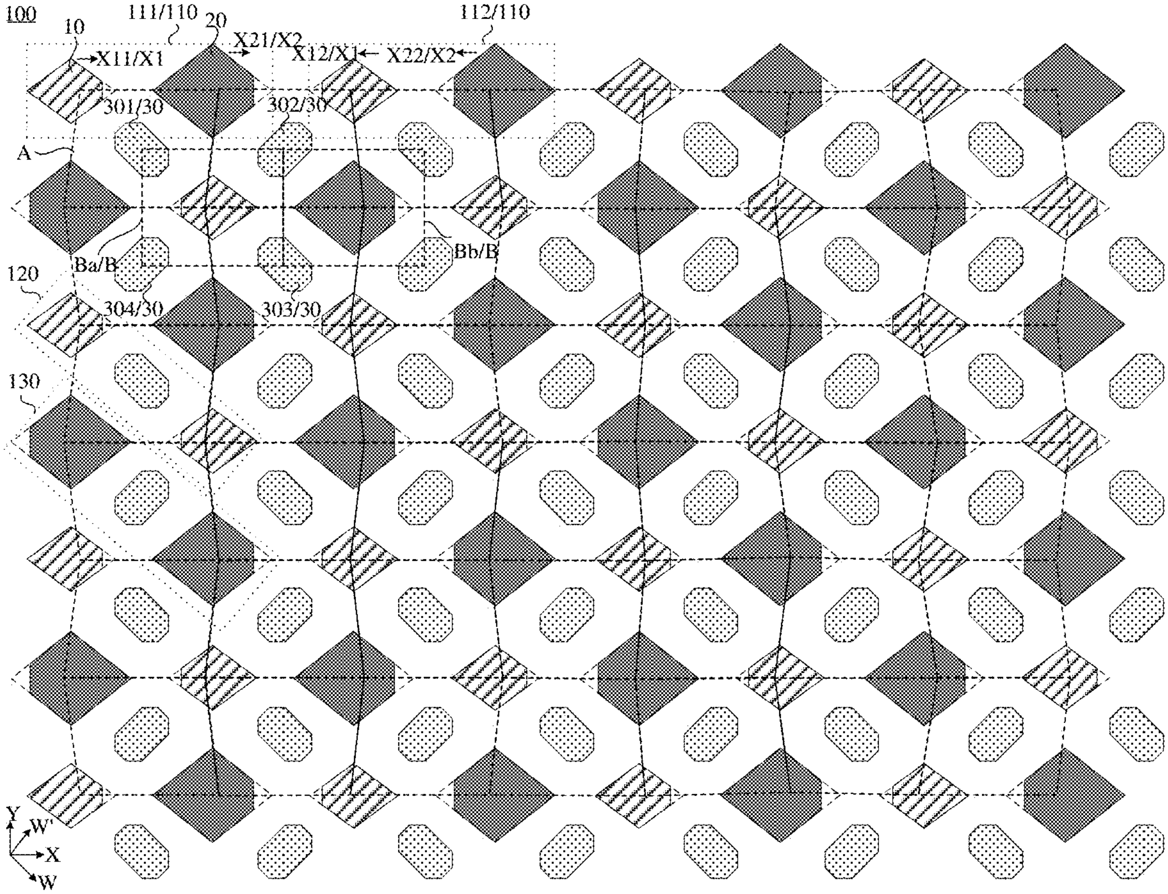
FIG. 7 is a diagram illustrating the structure of yet another display panel according to an embodiment of the present disclosure.

As a feasible embodiment, referring to FIG. 7, the multiple first sub-pixels 10 and the multiple third sub-pixels 30 are alternately arranged along the third direction W; an extension direction of a third sub-pixel 30 located between two adjacent first sub-pixels 10 is parallel to the third direction W; and/or the multiple second sub-pixels 20 and the multiple third sub-pixels 30 are alternately arranged along the third direction W; and an extension direction of a third sub-pixel 30 located between two adjacent second sub-pixels 20 intersects the third direction W. In this way, each row or column in the third direction W (W') is configured with sub-pixels having at least two emitted colors, and sub-pixels having different emitted colors are alternately arranged so that the display effect of the display panel 100 can be prevented from being affected due to that the row or column in the third direction W presents single-colored color light.

The extension direction of the third sub-pixel 30 may be an extension direction of the longest edge in the third sub-pixel 30. Extension directions of third sub-pixels 30 that are arranged along the third direction W and between two adjacent first sub-pixels 10 are enabled to be parallel to the third direction W, and extension directions of the third sub-pixels 30 that are arranged along the third direction W and between two adjacent second sub-pixels 20 are enabled to intersect the third direction so that four adjacent third sub-pixels 30, that is, four third sub-pixels 30 located at four vertices of the same second virtual quadrilateral B, for example, a first third sub-pixel 301, a second third sub-pixel 302, a third sub-pixel 303 and a fourth third sub-pixel 304, can have different orientations, facilitating the display uniformity of the four directions.

Optionally, with continued reference to FIG. 7, when the multiple first sub-pixels 10 and the multiple third sub-pixels 30 are alternately arranged along the third direction W, two first sub-pixels 10 that are adjacent and arranged along the third direction W form a second pixel group 120; first pointing directions X1 of the two first sub-pixels 10 in the same second pixel group 120 are opposite; and/or when the multiple second sub-pixels 20 and the multiple third sub-pixels 30 are alternately arranged along the third direction W, two second sub-pixels 20 that are adjacent and arranged along the third direction W form a third pixel group 130; and second pointing directions X2 of the two second sub-pixels 20 in the same third pixel group 130 are opposite.

In an embodiment, the first pointing directions X1 of the two first sub-pixels 10 in the same second pixel group 120 are opposite so that the two first sub-pixels 10 that are adjacent and arranged along the third direction W can have different chamfer orientations, and light ray center offset directions of light rays emitted by the two first sub-pixels 10 can be opposite, that is, the light rays emitted by the two first sub-pixels 10 in the same second pixel group 120 can be ensured to have different light ray center offset directions in the third direction W to prevent the display light emission effect in the third direction W from being affected due to that light ray centers of light rays emitted by first sub-pixels 10 in the third direction W offset toward the same side, thereby facilitating the uniform distribution of the light rays emitted by the first sub-pixels 10 in the third direction W, further improving the display color deviation in the third direction W and improving the display uniformity in the third direction W.

Similarly, the second pointing directions X2 of the two second sub-pixels 20 in the same third pixel group 130 are opposite so that the two second sub-pixels 20 that are adjacent and arranged along the third direction W can have different chamfer orientations, and light ray center offset directions of light rays emitted by the two second sub-pixels 20 can be opposite, that is, the light rays emitted by the two second sub-pixels 20 in the same third pixel group 130 can be ensured to have different light ray center offset directions in the third direction W to prevent the display light emission effect in the third direction W from being affected due to that light ray centers of light rays emitted by second sub-pixels 20 in the third direction W offset toward the same side, thereby facilitating the uniform distribution of the light rays emitted by the second sub-pixels 20 in the third direction W, further improving the display color deviation in the third direction W and improving the display uniformity in the third direction W.

Further, with continued reference to FIG. 7, when the two first sub-pixels 10 that are adjacent and arranged along the third direction W form the second pixel group 120, first pointing directions X1 of two first sub-pixels 10 that are adjacent and belong to different second pixel groups 120 are the same. In this way, light emission situations of first sub-pixels 10 in two adjacent second pixel groups 120 can remain consistent so that the display uniformity of the display panel 100 in the third direction W can be improved.

Correspondingly, when the two second sub-pixels 20 that are adjacent and arranged along the third direction W form the third pixel group 130, second pointing directions X2 of two second sub-pixels 20 that are adjacent and belong to different third pixel groups 130 are the same. In this way, light emission situations of second sub-pixels 20 in two adjacent third pixel groups 130 can remain consistent so that the display uniformity of the display panel 100 in the third direction W can be improved.

Figure 8:
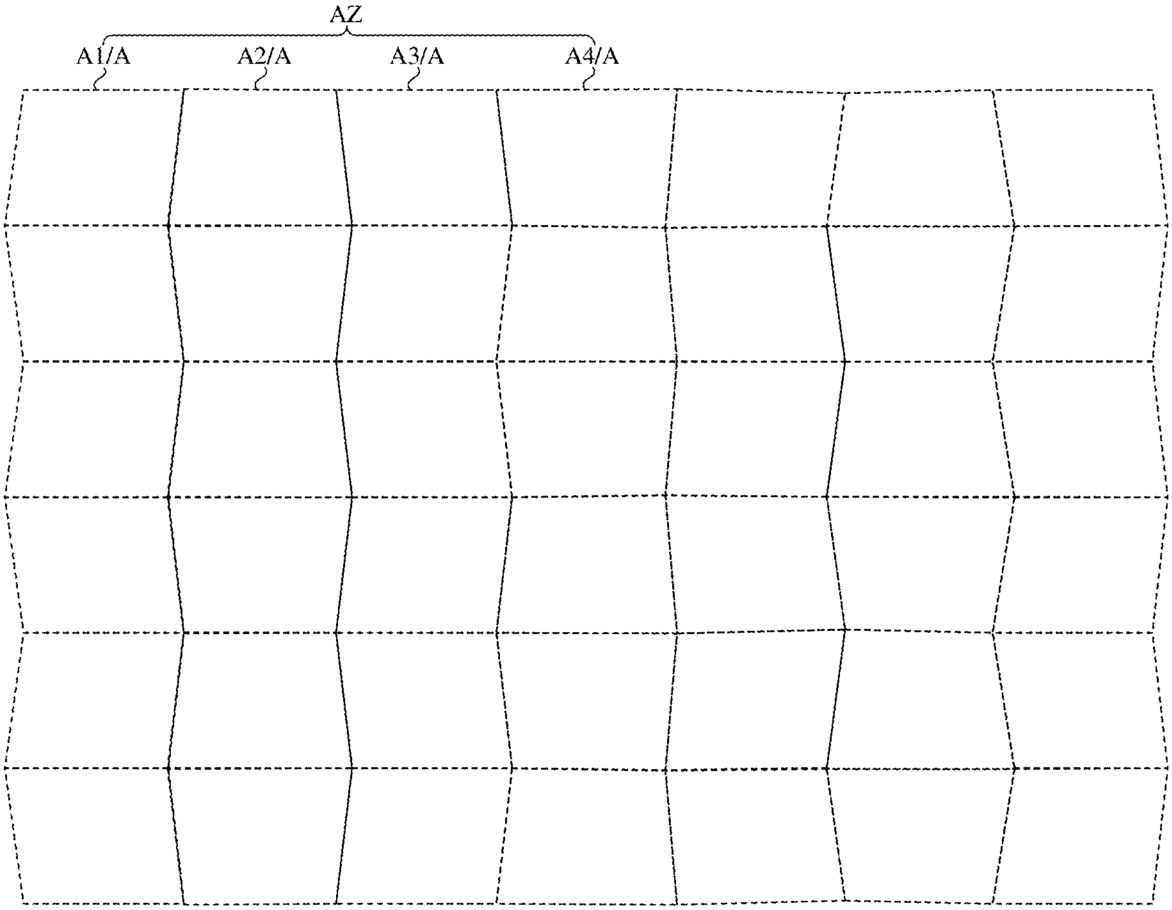
FIG. 8 is a diagram illustrating the structure of the arrangement of first virtual quadrilaterals according to an embodiment of the present disclosure.

Optionally, FIG. 8 is a diagram illustrating the structure of the arrangement of first virtual quadrilaterals according to an embodiment of the present disclosure. In conjunction with FIGS. 7 and 8, when the multiple first sub-pixels 10 and the multiple second sub-pixels 20 are alternately along the first direction X and the second direction Y, and the first direction X intersects the second direction Y, the display panel 100 may include multiple first virtual groups AZ; a first virtual group AZ includes four first virtual quadrilaterals A arranged along the first direction X, and adjacent first virtual quadrilaterals A have common edges; the four first virtual quadrilaterals A in the same first virtual group AZ are a first-type virtual quadrilateral A1, a second-type virtual quadrilateral A2, a third-type virtual quadrilateral A3 and a fourth-type virtual quadrilateral A4 respectively that are arranged along the first direction X; and the first-type virtual quadrilateral A1 and the third-type virtual quadrilateral A3 are each a parallelogram, and the second-type virtual quadrilateral A2 and the fourth-type virtual quadrilateral A4 are each an isosceles trapezoid.

Exemplarily, when two first virtual quadrilaterals A that are adjacent and arranged along the first direction X have a common edge, centers of five first sub-pixels 10 and centers of five second sub-pixels 20 are required to be connected to form one first virtual group AZ. In this case, among two first sub-pixels 10 and two second sub-pixels 20 that are located at four vertices of the first-type virtual quadrilateral A1, center offset directions of a first sub-pixel 10 and a second sub-pixel 20 that are adjacent and arranged along the first direction X are the same, that is, orientations of chamfers are the same, while center offset directions of a first sub-pixel 10 and a second sub-pixel 20 that are adjacent and arranged along the second direction Y are opposite, that is, orientations of chamfers are opposite, so that the first-type virtual quadrilateral A1 can be a parallelogram.

Among two first sub-pixels 10 and two second sub-pixels 20 that are located at four vertices of the second-type virtual quadrilateral A2, chamfer orientations of one group of a first sub-pixel 10 and a second sub-pixel 20 that are adjacent and arranged along the first direction face to each other while chamfer orientations of the other group of a first sub-pixel 10 and a second sub-pixel 20 that are adjacent and arranged along the first direction face away from each other; center offset directions of a first sub-pixel 10 and a second sub-pixel 20 that are adjacent and arranged along the second direction Y are opposite, that is, orientations of chamfers are opposite, and the offset amount of the center of a second sub-pixel 20 located in the previous row (or column) with respect to the center of a first sub-pixel 10 located in the next row in one group of a first sub-pixel 10 and a second sub-pixel 20 that are arranged along the second direction Y is the first offset amount; and when the offset amount of the center of a first sub-pixel 10 located in the previous row (or column) with respect to the center of a second sub-pixel 20 located in the next row in the other group of a first sub-pixel 10 and a second sub-pixel 20 that are arranged along the second direction Y is the second offset amount, the first offset amount may be equal to the second offset amount so that the second-type virtual quadrilateral A2 can be an isosceles trapezoid.

The arrangement manner of two first sub-pixels 10 and two second sub-pixels 20 that are located at four vertices of the third-type virtual quadrilateral A3 is similar to the arrangement manner of the two first sub-pixels 10 and the two second sub-pixels 20 in the first-type virtual quadrilateral A1. A difference lies in that center offset directions of the first sub-pixel 10 and the second sub-pixel 20 that are adjacent and arranged along the first direction X in the third-type virtual quadrilateral A3 are opposite to center offset directions of the first sub-pixel 10 and the second sub-pixel 20 that are adjacent and arranged along the first direction X in the first-type virtual quadrilateral A1 so that the third-type virtual quadrilateral A3 can also be a parallelogram, and the third-type virtual quadrilateral A3 and the first-type virtual quadrilateral A1 can mirror each other.

The arrangement manner of two first sub-pixels 10 and two second sub-pixels 20 that are located at four vertices of the fourth-type virtual quadrilateral A4 is similar to the arrangement manner of the two first sub-pixels 10 and the two second sub-pixels 20 in the second-type virtual quadrilateral A2. A difference lies in that center offset directions of first sub-pixels 10 that are arranged along the first direction X and located within the fourth-type virtual quadrilateral A4 and the second-type virtual quadrilateral A2 respectively are opposite, and center offset directions of second sub-pixels 20 that are arranged along the first direction X and located within the fourth-type virtual quadrilateral A4 and the second-type virtual quadrilateral A2 respectively are opposite so that the fourth-type virtual quadrilateral A4 can also be an isosceles trapezoid, and the fourth-type virtual quadrilateral A4 and the second-type virtual quadrilateral A2 can mirror each other.

In this way, the first-type virtual quadrilateral A1 and the third-type virtual quadrilateral A3 form parallelograms mirroring each other, and the second-type virtual quadrilateral A2 and the fourth-type virtual quadrilateral A4 form isosceles trapezoids mirroring each other so that first pointing directions X1 of any two first sub-pixels 10 that are adjacent and arranged along the first direction X can be opposite, and second pointing directions of any two second sub-pixels 20 that are adjacent and arranged along the first direction X can be opposite, thereby facilitating the improvement in the display uniformity in the first direction X and the color deviation in the first direction X. Meanwhile, the interval of centers of a first sub-pixel 10 and a second sub-pixel 20 on a short edge of each of the second-type virtual quadrilateral A2 and the fourth-type virtual quadrilateral A4 is relatively small so that chamfer orientations of the first sub-pixel 10 and the second sub-pixel 20 can face to each other to enable relatively long distance to be provided between the first sub-pixel 10 and the second sub-pixel 20, and relatively large space can be provided between the first sub-pixel 10 and the second sub-pixel 20. Therefore, a relatively large space can also be provided for configuring other structures such as a support column while lateral leakage current between the first sub-pixel 10 and the second sub-pixel 20 can be reduced so that an additional space is not required for configuring other structures, thereby facilitating the improvement in the resolution of the display panel.

Figure 9:
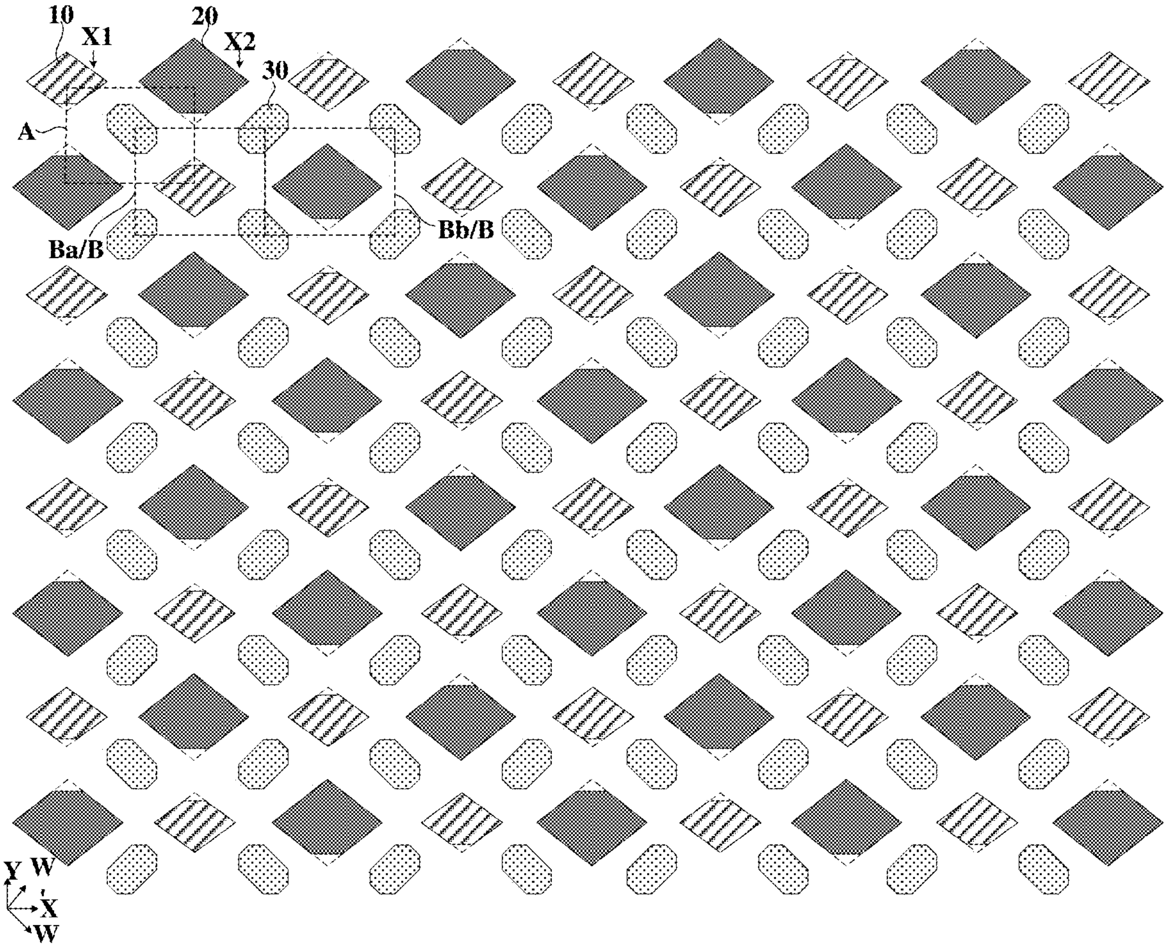
FIG. 9 is a diagram illustrating the structure of yet another display panel according to an embodiment of the present disclosure.

It is to be understood that the preceding is solely described using an example in which the first pointing direction X1 and the second pointing direction X2 are parallel to the first direction X, while in the embodiment of the present disclosure, as shown in FIG. 9, the first pointing direction X1 and the second pointing direction X2 may also be parallel to the second direction Y. In other optional embodiments, part of the first pointing directions and part of the second pointing directions are parallel to the first direction while the other part of the first pointing directions and the other part of the second pointing directions are parallel to the second direction.

Figure 10:
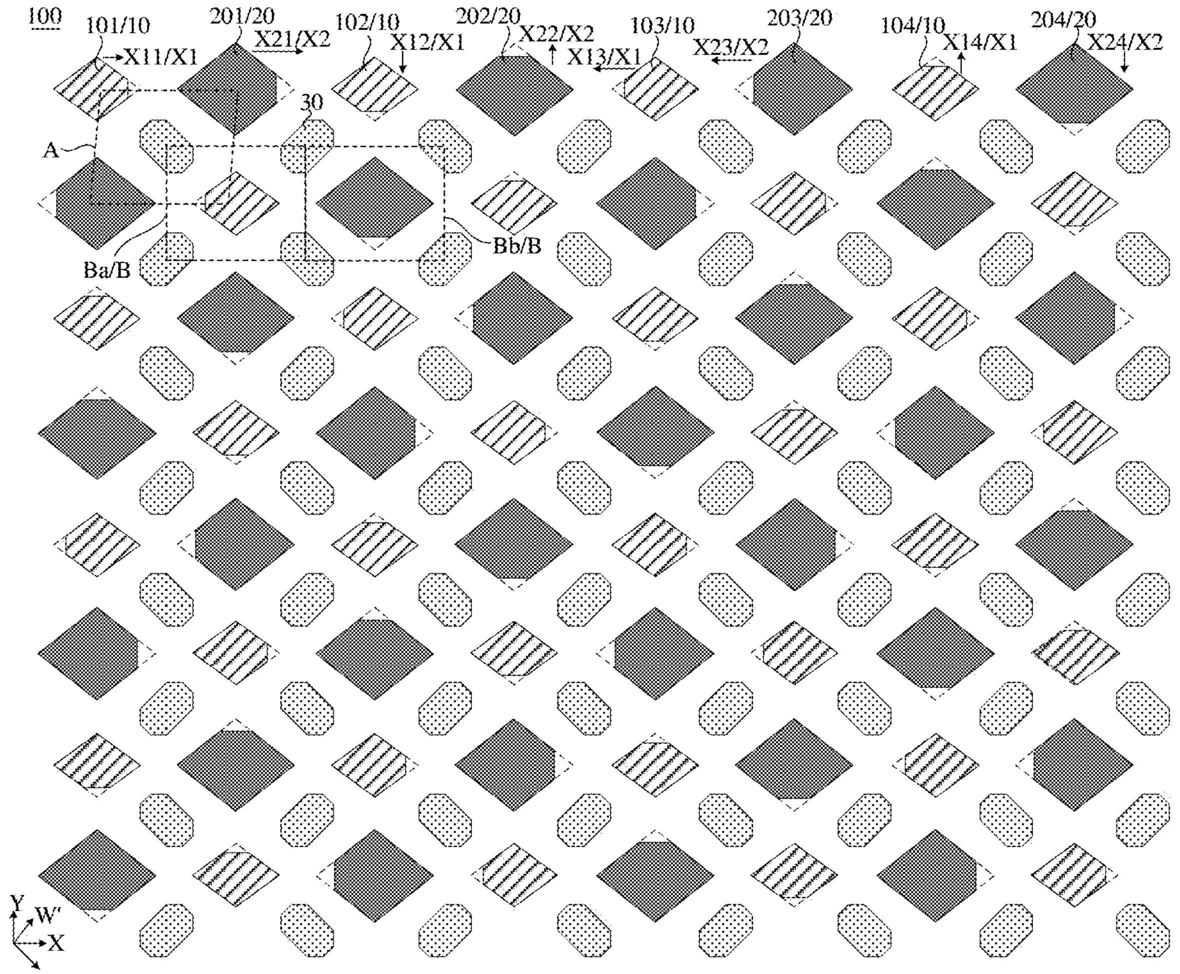
FIG. 10 is a diagram illustrating the structure of yet another display panel according to an embodiment of the present disclosure.

As a feasible embodiment, FIG. 10 is a diagram illustrating the structure of yet another display panel according to an embodiment of the present disclosure. As shown in FIG. 10, the multiple first sub-pixels 10 and the multiple second sub-pixels 20 are alternately arranged along the first direction X; first pointing directions X1 of any four first sub-pixels 10 that are adjacent and arranged sequentially along the first direction X are different; the value range of an included angle β11 between first pointing directions of two first sub-pixels that are adjacent and arranged sequentially along the first direction is 0°<β11<135°, for example, the value of β11 may be 80°, 85°, 90°, 95°, or 100°, which is not specifically limited in the embodiment of the present disclosure, and the value of β11 may be 90° in an optional embodiment; and the value range of an included angle β12 between first pointing directions of two first sub-pixels that are arranged sequentially along the first direction and located on opposite sides of the same first sub-pixel is 135°<β12<270°, for example, the value of β12 may be 170°, 175°, 180°, 185°, or 190°, which is not specifically limited in the embodiment of the present disclosure, and the value of β12 may be 180° in an optional embodiment.

Exemplarily, using β11 being 90° and β12 being 180° as an example, the any four first sub-pixels 10 that are adjacent and arranged sequentially along the first direction X are a first sub-pixel 101, a second first sub-pixel 102, a third first sub-pixel 103 and a fourth first sub-pixel 104 respectively, and if an included angle between the first pointing direction X11 of the first sub-pixel 101 and a reference direction is 0°, the included angle β11 between the first pointing direction X12 of the second first sub-pixel 102 and the first pointing direction X11 of the first sub-pixel 101 is 90°, that is, an included angle between the first pointing direction X12 of the second first sub-pixel 102 and the reference direction is 90°; an included angle between a first pointing direction X13 of the third first sub-pixel 103 and the first pointing direction X12 of the second first sub-pixel 102 is also 90°, and the included angle β12 between the first pointing direction X13 of the third first sub-pixel 103 and the first pointing direction X11 of the first sub-pixel 101 is 180° so that an included angle between the first pointing direction X13 of the third first sub-pixel 103 and the reference direction can be 180°; and an included angle between a first pointing direction X14 of the fourth first sub-pixel 104 and the first pointing direction X13 of the third first sub-pixel 103 is 90°, and an included angle between the first pointing direction X14 of the fourth first sub-pixel 104 and the first pointing direction X12 of the second first sub-pixel 102 is 180° so that an included angle between the first pointing direction X14 of the fourth first sub-pixel 104 and the first pointing direction X11 of the first sub-pixel 101 can be 270°, that is, an included angle between the first pointing direction X14 of the fourth first sub-pixel 104 and the reference direction is 270°. In this case, among the any four first sub-pixels 10 that are adjacent and arranged sequentially along the first direction X, the first pointing direction X11 of the first sub-pixel 101 and the first pointing direction X13 of the third first sub-pixel 103 are parallel to the first direction X, and the first pointing direction X12 of the second first sub-pixel 102 and the first pointing direction X14 of the fourth first sub-pixel 104 are parallel to the second direction Y. In this way, included angles between the any four first sub-pixels 10 that are adjacent and arranged sequentially along the first direction X and the reference direction increase sequentially, and an included angle between the two adjacent first sub-pixels 10 differs by 90° so that chamfer orientations of the any four first sub-pixels 10 that are adjacent and arranged sequentially along the first direction X can be four directions on the plane respectively, further balancing the configured positions of the any four first sub-pixels 10 that are adjacent and arranged sequentially along the first direction X, facilitating the improvement in the color deviation in the four directions of the display panel 100 and improving the display uniformity of the multiple first sub-pixels 10 and the entire display panel 100.

Optionally, with continued reference to FIG. 10, when the multiple first sub-pixels 10 and the multiple second sub-pixels 20 are further alternately arranged along the second direction Y intersecting the first direction X, first pointing directions X1 of any four first sub-pixels 10 that are adjacent and arranged sequentially along the second direction Y are different; the value range of an included angle β13 between first pointing directions of two first sub-pixels that are adjacent and arranged sequentially along the second direction is 0°<β13<135°, for example, the value of −13 may be 80°, 85°, 90°, 95°, or 100°, which is not specifically limited in the embodiment of the present disclosure, and the value of β13 may be 90° in an optical embodiment; and the value range of an included angle β14 between first pointing directions X1 of two first sub-pixels 10 that are arranged sequentially along the second direction and located on opposite sides of the same first sub-pixel is 135°<β14<270°, for example, the value of β14 may be 170°, 175°, 180°, 185°, or 190°, which is not specifically limited in the embodiment of the present disclosure, and the value of β14 may be 180° in an optional embodiment.

With the preceding arrangement manner adopted, among the any four first sub-pixels 10 that are adjacent and arranged sequentially along the second direction Y, first pointing directions X1 of two first sub-pixels 10 can be parallel to the first direction X while first pointing directions X1 of the other two first sub-pixels 10 can be parallel to the second direction Y. In this case, chamfer orientations of the any four first sub-pixels 10 that are adjacent and arranged sequentially along the second direction Y may be four directions on the plane respectively so that the configured positions of the any four first sub-pixels 10 that are adjacent and arranged sequentially along the second direction Y can be balanced, thereby facilitating the improvement in the color deviation in the four directions of the display panel 100 and improving the display uniformity of the multiple first sub-pixels 10 and the entire display panel 100.

It is to be noted that FIG. 10 is solely an exemplary drawing of the embodiment of the present disclosure, and on the premise that the first pointing directions of the any four first sub-pixels that are adjacent and arranged along the first direction can be different, and the first pointing directions of the any four first sub-pixels that are adjacent and arranged along the second direction can be different, included angles between first pointing directions of the multiple first sub-pixels and the reference direction are not specifically limited in the embodiment of the present disclosure.

In another optional embodiment, with continued reference to FIG. 10, second pointing directions X2 of any four second sub-pixels 20 that are adjacent and arranged sequentially along the first direction X are different; the value range of an included angle β21 between second pointing directions X2 of two second sub-pixels 20 that are adjacent and arranged sequentially along the first direction X is 0°<β21<135°, for example, the value of β21 may be 80°, 85°, 90°, 95°, or 100°, which is not specifically limited in the embodiment of the present disclosure, and the value of β21 may be 90° in an optional embodiment; and the value range of an included angle β22 between second pointing directions X2 of two second sub-pixels 20 that are arranged sequentially along the first direction X and located on opposite sides of the same second sub-pixel 20 is 135°<β22<270°, for example, the value of β22 may be 170°, 175°, 180°, 185°, or 190°, which is not specifically limited in the embodiment of the present disclosure, and the value of β22 may be 180° in an optional embodiment.

Exemplarily, using β21 being 90° and β22 being 180° as an example, the any four second sub-pixels 20 that are adjacent and arranged sequentially along the first direction X are a first second sub-pixel 201, a second second sub-pixel 202, a third second sub-pixel 203 and a fourth second sub-pixel 204 respectively, and if an included angle between the second pointing direction X21 of the first second sub-pixel 201 and a reference direction is 0°, the included angle β21 between the second pointing direction X22 of the second second sub-pixel 202 and the second pointing direction X21 of the first second sub-pixel 201 is 90°, that is, an included angle between the second pointing direction X22 of the second second sub-pixel 202 and the reference direction is 90°; an included angle between a second pointing direction X23 of the third second sub-pixel 203 and the second pointing direction X22 of the second second sub-pixel 202 is also 90°, and the included angle β22 between the second pointing direction X23 of the third second sub-pixel 203 and the second pointing direction X21 of the first second sub-pixel 201 is 180° so that an included angle between the second pointing direction X23 of the third second sub-pixel 203 and the reference direction can be 180°; and an included angle between a second pointing direction X24 of the fourth second sub-pixel 204 and the second pointing direction X23 of the third second sub-pixel 203 is 90°, and an included angle between the second pointing direction X24 of the fourth second sub-pixel 204 and the second pointing direction X22 of the second second sub-pixel 202 is 180° so that an included angle between the second pointing direction X24 of the fourth second sub-pixel 204 and the second pointing direction X21 of the first second sub-pixel 201 can be 270°, that is, an included angle between the second pointing direction X24 of the fourth second sub-pixel 204 and the reference direction is 270°. In this case, among the any four second sub-pixels 20 that are adjacent and arranged sequentially along the first direction X, the second pointing direction X21 of the first second sub-pixel 201 and the second pointing direction X23 of the third second sub-pixel 203 are parallel to the first direction X, and the second pointing direction X22 of the second second sub-pixel 202 and the second pointing direction X24 of the fourth second sub-pixel 204 are parallel to the second direction Y. In this way, included angles between the any four second sub-pixels 20 that are adjacent and arranged sequentially along the first direction X and the reference direction increase sequentially, and an included angle between the two adjacent second sub-pixels 20 differs by 90° so that chamfer orientations of the any four second sub-pixels 20 that are adjacent and arranged sequentially along the first direction X can be four directions on the plane respectively, further balancing the configured positions of the any four second sub-pixels 20 that are adjacent and arranged sequentially along the first direction X, facilitating the improvement in the color deviation in the four directions of the display panel 100 and improving the display uniformity of the multiple second sub-pixels 20 and the entire display panel 100.

Optionally, with continued reference to FIG. 10, second pointing directions X2 of any four second sub-pixels 20 that are adjacent and arranged sequentially along the second direction Y are different; the value range of an included angle β23 between second pointing directions X2 of two second sub-pixels 20 that are adjacent and arranged sequentially along the second direction Y is 0°<β23<135°, for example, the value of β23 may be 80°, 85°, 90°, 95°, or 100°, which is not specifically limited in the embodiment of the present disclosure, and the value of β23 may be 90° in an optional embodiment; and the value range of an included angle β24 between second pointing directions X2 of two second sub-pixels 20 that are arranged sequentially along the second direction Y and located on opposite sides of the same second sub-pixel 20 is 135°<β24<270°, for example, the value of β24 may be 170°, 175°, 180°, 185°, or 190°, which is not specifically limited in the embodiment of the present disclosure, and the value of β24 may be 180° in an optional embodiment.

With the preceding arrangement manner adopted, among the any four second sub-pixels 20 that are adjacent and arranged sequentially along the second direction Y, second pointing directions X2 of two second sub-pixels 20 can be parallel to the first direction X while second pointing directions X2 of the other two second sub-pixels 20 can be parallel to the second direction Y. In this case, chamfer orientations of the any four second sub-pixels 20 that are adjacent and arranged sequentially along the second direction Y may be four directions on the plane respectively so that the configured positions of the any four second sub-pixels 20 that are adjacent and arranged sequentially along the second direction Y can be balanced, thereby facilitating the improvement in the color deviation in the four directions of the display panel 100 and improving the display uniformity of the multiple second sub-pixels 20 and the entire display panel 100.

It is to be noted that FIG. 10 is solely an exemplary drawing of the embodiment of the present disclosure, and on the premise that the first pointing directions of the any four second sub-pixels that are adjacent and arranged along the first direction can be different, and the first pointing directions of the any four second sub-pixels that are adjacent and arranged along the second direction can be different, included angles between first pointing directions of the multiple second sub-pixels and the reference direction are not specifically limited in the embodiment of the present disclosure.

It is to be understood that chamfer orientations of the multiple first sub-pixels and the multiple second sub-pixels can affect the display uniformity of the display panel in various directions, and chamfer magnitudes of the multiple first sub-pixels and the multiple second sub-pixels affect the overall display brightness of the display panel.

Optionally, as shown in FIG. 2, the first virtual shape 10' includes a first virtual edge 11' and a second virtual edge 12' that are connected, and a connection point between the first virtual edge 11' and the second virtual edge 12' is a first virtual point o1'; the first sub-pixel 10 further includes a seventh edge 14 that partially coincides with the first virtual edge 11' and an eighth edge 15 that partially coincides with the second virtual edge 12'; the first edge 11 is connected to the same side of the seventh edge 14 and the eighth edge 15; a connection point between the first edge 11 and the seventh edge 14 is a first connection point o1, and a connection point between the first edge 11 and the eighth edge 15 is a second connection point o2; the minimum distance from the first connection point o1 to the first virtual point o1' is denoted as 111, and the minimum distance from the second connection point o2 to the first virtual point o1' is denoted as 112; and the length of the first virtual edge 11' is denoted as L11, and the length of the second virtual edge 12' is denoted as L12, where 1/40≤111/L11≤1/2, and 1/40≤112/L12≤1/2.

It is to be understood that with respect to the first virtual shape 10', a portion cut along the first edge 11 of the first sub-pixel 10 may be a triangle, the first edge 11 may serve as the base of the triangle, and a connection line between the first connection point o1 and the first virtual point o1' and a connection line between the second connection point o2 and the first virtual point o1' serve as two waists of the triangle, and if the connection line between the first connection point o1 and the first virtual point o1' is a first connection line, and the connection line between the second connection point o2 and the first virtual point o1' is a second connection line, the length of the first connection line may be denoted as 111, and the length of the second connection line may be denoted as 112. In this case, the length of the first connection line and the length of the second connection line can embody the size of the cut triangle, and the larger the size, the larger the offset amount of the center of the first sub-pixel 10 with respect to the center of the first virtual shape 10', the larger the distances from the first sub-pixel 10 to other sub-pixels adjacent to the first sub-pixel 10 so that lateral leakage currents between the first sub-pixel 10 and the other sub-pixels adjacent to the first sub-pixel 10 can be smaller; but when the cut triangle has a relatively large size, the display brightness of the multiple first sub-pixels 10 is reduced so that color deviation can be caused, and the overall display brightness of the display panel can be even reduced.

In conclusion, in this embodiment, the ratio between the minimum distance 111 from the first connection point o1 to the first virtual point o1' and the length L11 of the first virtual edge 11' is limited to be greater than or equal to 1/40 and less than or equal to 1/2, and the ratio between the minimum distance 112 from the second connection point o2 to the first virtual point o1' and the length L12 of the second virtual edge 12' is limited to be greater than or equal to 1/40 and less than or equal to 1/2 so that on the premise that the multiple first sub-pixels 10 are ensured to have enough display brightness, enough small lateral leakage currents can be provided between the first sub-pixel 10 and the other sub-pixels adjacent to the first sub-pixel 10, thereby improving the overall display effect of the display panel. For example, 1/20≤111/L11≤2/5, and 1/20≤112/L12≤2/5.

In an optional embodiment, 111=112, that is, the cut triangle may be an isosceles triangle so that the multiple first sub-pixels 10 can be ensured to have uniform chamfers, thereby improving the light emission effect of the multiple first sub-pixels 10.

Optionally, as shown in FIG. 3, the second virtual shape 20' includes a third virtual edge 21' and a fourth virtual edge 22' that are connected, and a connection point between the third virtual edge 21' and the fourth virtual edge 22' is a second virtual point o2'; the second sub-pixel 20 further includes a ninth edge 24 that partially coincides with the third virtual edge 21' and an tenth edge 25 that partially coincides with the fourth virtual edge 22'; the second edge 21 is connected to the same side of the ninth edge 24 and the tenth edge 25; a connection point between the second edge 21 and the ninth edge 24 is a third connection point o3, and a connection point between the second edge 21 and the tenth edge 25 is a fourth connection point o4; the minimum distance from the third connection point o3 to the second virtual point o2' is denoted as 121, and the minimum distance from the fourth connection point o4 to the second virtual point o2' is denoted as 122; and the length of the third virtual edge 21' is denoted as L21, and the length of the fourth virtual edge 22' is denoted as L22, where 1/40≤121/L21≤1/2, and 1/40≤122/L22≤1/2.

It is also to be understood that with respect to the second virtual shape 20', a portion cut along the second edge 21 of the second sub-pixel 20 may also be a triangle, the second edge 21 may serve as the base of the triangle, and a connection line between the third connection point o3 and the second virtual point o2' and a connection line between the fourth connection point o4 and the second virtual point o2' serve as two waists of the triangle, and if the connection line between the third connection point o3 and the second virtual point o2' is a third connection line, and the connection line between the fourth connection point o4 and the second virtual point o2' is a fourth connection line, the length of the third connection line may be denoted as 121, and the length of the fourth connection line may be denoted as 122. In this case, the length of the third connection line and the length of the fourth connection line can embody the size of the cut triangle, and the larger the size, the larger the offset amount of the center of the second sub-pixel 20 with respect to the center of the second virtual shape 20', the larger the distances from the second sub-pixel 20 to other sub-pixels adjacent to the second sub-pixel 20 so that lateral leakage currents between the second sub-pixel 20 and the other sub-pixels adjacent to the second sub-pixel 20 can be smaller; but when the cut triangle has a relatively large size, the display brightness of the multiple second sub-pixels 20 is reduced so that color deviation can be caused, and the overall display brightness of the display panel can be even reduced. For example, 1/20≤121/L21≤2/5, and 1/20≤122/L22≤2/5.

In conclusion, in this embodiment, the ratio between the minimum distance 121 from the third connection point o3 to the second virtual point o2' and the length L21 of the third virtual edge 21' is limited to be greater than or equal to 1/40 and less than or equal to 1/2, and the ratio between the minimum distance 122 from the fourth connection point o4 to the second virtual point o2' and the length L22 of the fourth virtual edge 22' is limited to be greater than or equal to 1/40 and less than or equal to 1/2 so that on the premise that the multiple second sub-pixels 20 are ensured to have enough display brightness, enough small lateral leakage currents can be provided between the second sub-pixel 20 and the other sub-pixels adjacent to the second sub-pixel 20, thereby improving the overall display effect of the display panel.

In an optional embodiment, 121=122, that is, the cut triangle may be an isosceles triangle so that the multiple second sub-pixels 20 can be ensured to have uniform chamfers, thereby improving the light emission effect of the multiple second sub-pixels 20.

$$\text{Optionally, } 1/3 \le (111*112)/(121*122) \le 1.$$

It is to be understood that the multiple first sub-pixels and the multiple second sub-pixels have different emitted colors so that the multiple first sub-pixels and the multiple second sub-pixels can have different light emission efficiencies, and to ensure the consistent display brightness of the multiple first sub-pixels and the multiple second sub-pixels, when the sub-pixels are designed, the first sub-pixel and the second sub-pixel are configured to have different sizes, for example, for an organic light-emitting diode display panel, when the emitted color of the multiple first sub-pixels is red, and the emitted color of the multiple second sub-pixels is blue, the designed size of the multiple first sub-pixels is greater than the designed size of the multiple second sub-pixels. Meanwhile, since an image in response to a color requires to be displayed on the display panel, the display brightness of the multiple first sub-pixels, the display brightness of the multiple second sub-pixels and the display brightness of the multiple third sub-pixels require to be set separately so that an image of a corresponding color can be presented after the mixture of light rays emitted by the multiple first sub-pixels, the multiple second sub-pixels and the multiple third sub-pixels that have corresponding display brightness. Therefore, when the sizes of a triangle cut in the first sub-pixel and/or a triangle cut in the second sub-pixel are relatively large, or when the sizes of triangles cut in the first sub-pixel and the second sub-pixel are not uniform, the display brightness of the multiple first sub-pixels and/or the multiple second sub-pixels is caused to have a relatively large decrease so that the image of the corresponding color cannot be presented due to color deviation of the display panel.

Referring to FIGS. 2 and 3, the size of the triangle cut in the first sub-pixel 10 may be denoted using 111*112, and the size of the triangle cut in the second sub-pixel 20 may be denoted using 121*122. In this case, the ratio range of (111*112)/(121*122) is configured to be greater than or equal to 1/3 and less than or equal to 1, that is, a difference between the areas of the triangles cut in the first sub-pixel 10 and the second sub-pixel 20 is relatively small, so that the decrease in the display brightness of the multiple first sub-pixels 10 can be ensured to be consistent with the decrease in the display brightness of the multiple second sub-pixels 20, thereby preventing the display color deviation and improving the display uniformity of the display panel. In a preferable embodiment, (111*112)/(121*122) may be equal to 1 so that the cut sizes of the first sub-pixel 10 and the second sub-pixel 20 can be equal.

In an optional embodiment, 111/L11=121/L21, and 112/L12=122/L22. In this way, the proportion of the size of the triangle cut in the first sub-pixel 10 in the first virtual shape 10' can be ensured to be consistent with the proportion of the size of the triangle cut in the second sub-pixel 20 in the second virtual shape 20' so that the decreases in the display brightness of the multiple first sub-pixels 10 and the multiple second sub-pixels 20 can remain consistent, thereby preventing the display color deviation and improving the display brightness of the display panel.

It is to be understood that the preceding solely exemplifies that only one first edge 11 of the first sub-pixel 10 does not coincide with the first virtual shape 10', and in the embodiment of the present disclosure, other edges of the first sub-pixel 10 may also not coincide with the first virtual shape 10'. Similarly, the preceding solely exemplifies that one second edge 21 of the second sub-pixel 20 does not coincide with the second virtual shape 20', and in the embodiment of the present disclosure, other edges of the second sub-pixel 20 may also not coincide with the second virtual shape 20'. This is not specifically limited in the embodiment of the present disclosure on the premise that the core inventive points of the present disclosure can be achieved.

Figure 11:
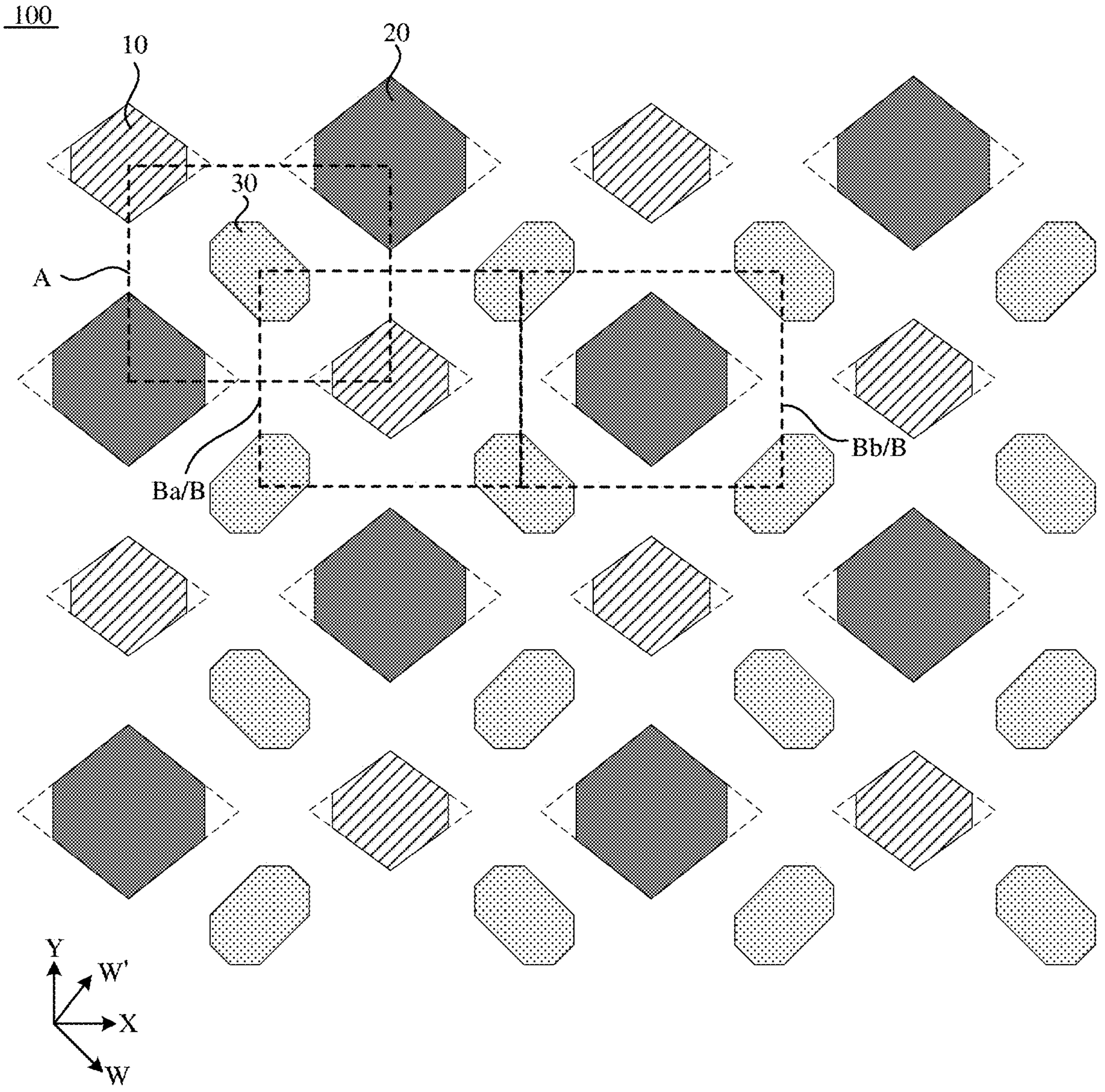
FIG. 11 is a diagram illustrating the structure of yet another display panel according to an embodiment of the present disclosure.
Figure 12:
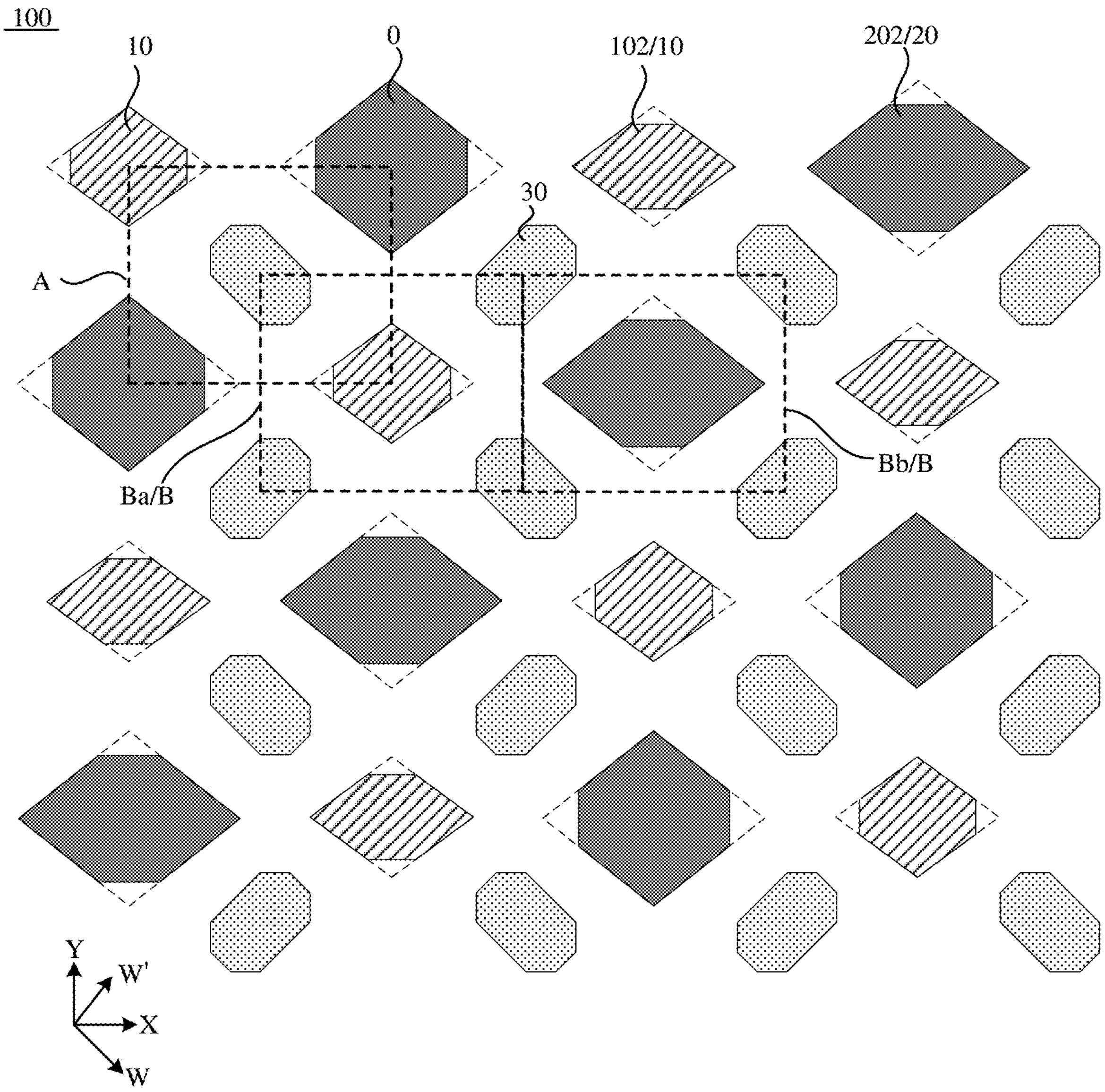
FIG. 12 is a diagram illustrating the structure of yet another display panel according to an embodiment of the present disclosure.
Figure 13:
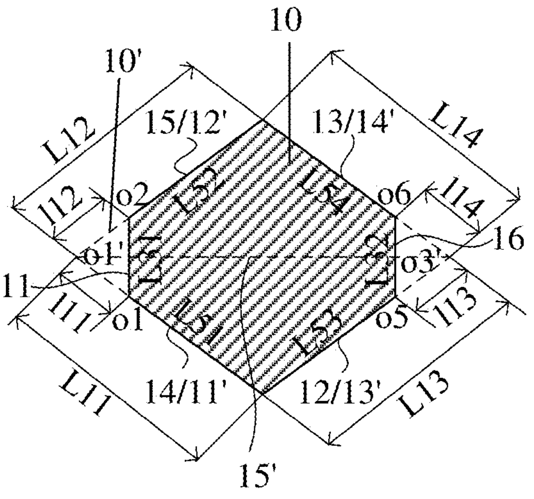
FIG. 13 is a diagram illustrating the structure of another first sub-pixel according to an embodiment of the present disclosure.
Figure 14:
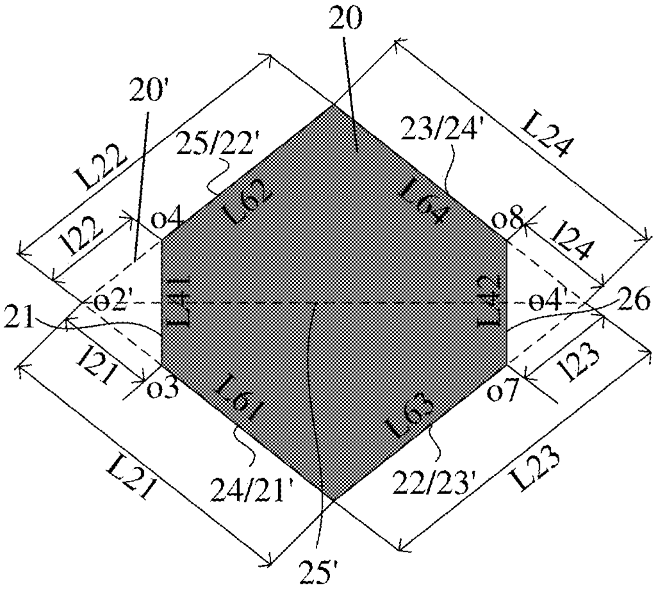
FIG. 14 is a diagram illustrating the structure of another second sub-pixel according to an embodiment of the present disclosure.
Figure 15:
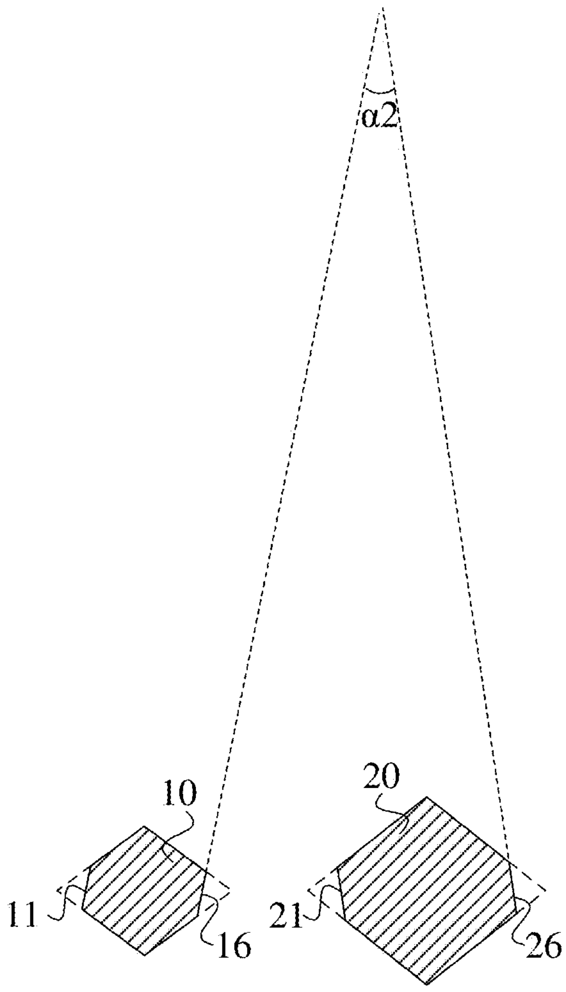
FIG. 15 is a diagram illustrating the structure of another adjacent first sub-pixel and second sub-pixel according to an embodiment of the present disclosure.

As a feasible embodiment, FIG. 11 is a diagram illustrating the structure of yet another display panel according to an embodiment of the present disclosure, FIG. 12 is a diagram illustrating the structure of yet another display panel according to an embodiment of the present disclosure, FIG. 13 is a diagram illustrating the structure of another first sub-pixel according to an embodiment of the present disclosure, FIG. 14 is a diagram illustrating the structure of another second sub-pixel according to an embodiment of the present disclosure, and FIG. 15 is a diagram illustrating the structure of another adjacent first sub-pixel and second sub-pixel according to an embodiment of the present disclosure. In conjunction with FIGS. 11 to 15, the at least one edge of the first sub-pixel 10 that does not coincide with the first virtual shape 10' further includes an eleventh edge 16, the at least one edge of the second sub-pixel 20 that does not coincide with the second virtual shape 20' further includes a twelfth edge 26, and in the at least part of adjacent first sub-pixels 10 and second sub-pixels 20, an included angle between the eleventh edge 16 and the twelfth edge 26 is denoted as $\alpha 2$, and $0° \leq \alpha 2 \leq 45°$.

In the at least part of adjacent first sub-pixels 10 and second sub-pixels 20, the included angle $\alpha 2$ between the eleventh edge 16 and the twelfth edge 26 is an included angle between extension lines of the eleventh edge 16 and the twelfth edge 26, or when an included angle between the eleventh edge 16 and the first direction X is denoted as $\alpha 21$, and an included angle between the twelfth edge 26 and the first direction X is denoted as $\alpha 22$, the included angle $\alpha 2$ between the eleventh edge 16 and the twelfth edge 26 may be equal to $|\alpha 21-\alpha 22|$, that is, that the included angle $\alpha 2$ is provided between the eleventh edge 16 and the twelfth edge 26 does not indicate that the eleventh edge 16 intersects the twelfth edge 26. In other words, eleventh edges 16 of all first sub-pixels 10 do not overlap twelfth edges 26 of all second sub-pixels 20.

In an embodiment, the value range of $\alpha 2$ is $0° \leq \alpha 2 \leq 45°$ so that in the at least part of adjacent first sub-pixels 10 and second sub-pixels 20, the eleventh edge 16 and the twelfth edge 26 can be parallel to each other or can have a relatively small included angle, that is, in the at least part of adjacent first sub-pixels 10 and second sub-pixels 20, the included angle $\alpha 2$ between the eleventh edge 16 and the twelfth edge 26 may be 0°, 5°, 10°, 20°, 30°, 40°, or 45°. On the premise that the core inventive points of the embodiment of the present disclosure can be achieved, this is not specifically limited in the embodiment of the present disclosure. In an optional embodiment, in the at least part of adjacent first sub-pixels 10 and second sub-pixels 20, extension directions of the first edge 11 and the second edge 21 are roughly the same, and extension directions of the eleventh edge 16 and the twelfth edge 26 are roughly the same so that the shapes of the multiple first sub-pixels 10 and the multiple second sub-pixels 20 can remain consistent. In this way, in the at least part of adjacent first sub-pixels 10 and second sub-pixels 20, the value range of the included angle $\alpha 1$ between the first edge 11 and the second edge 12 is $0° \leq \alpha 1 \leq 45°$, and the value range of the included angle $\alpha 2$ between the eleventh edge 16 and the twelfth edge 26 is $0° \leq \alpha 2 \leq 45°$ so that the shapes of the multiple first sub-pixels 10 and the shapes of the multiple second sub-pixels 20 can be similar, and so that the adjacent first sub-pixel 10 and second sub-pixel 20 can have consistent display light emission situations, thereby facilitating the improvement in the display uniformity of the adjacent first sub-pixel 10 and second sub-pixel 20 and the display effect of the display panel 100.

In addition, when the eleventh edge 16 of the first sub-pixel 10 does not coincide with the first virtual shape 10', a relatively large distance is provided from a sub-pixel located on one side of the eleventh edge 16 of the first sub-pixel 10 to the first sub-pixel 10 so that a lateral leakage current distance from the first sub-pixel 10 to the sub-pixel located on the side of the eleventh edge 16 of the first sub-pixel 10 can be relatively large, facilitating the reduction in a lateral leakage current between the first sub-pixel 10 and the sub-pixel located on the side of the eleventh edge 16 of the first sub-pixel 10; when the twelfth edge 26 of the second sub-pixel 20 does not coincide with the second virtual shape 20', a relatively large distance is provided from a sub-pixel located on one side of the twelfth edge 26 of the second sub-pixel 20 to the second sub-pixel 20 so that a lateral leakage current distance from the second sub-pixel 20 to the sub-pixel located on the side of the twelfth edge 26 of the second sub-pixel 20 can be relatively large, facilitating the reduction in a lateral leakage current between the second sub-pixel 20 and the sub-pixel located on the side of the twelfth edge 26 of the second sub-pixel 20; in this way, the eleventh edge 16 of the first sub-pixel 10 does not coincide with the first virtual shape 10', and the twelfth edge 26 of the second sub-pixel 20 does not coincide with the second virtual shape so that the undesired light emission of the sub-pixels and the optical crosstalk can be further improved, thereby ensuring a relatively high display light emission accuracy of the multiple first sub-pixels 10 and the multiple second sub-pixels 20 and further facilitating the improvement in the display quality of the display panel.

In an optional embodiment, the length of the first edge 11 is denoted as L31, the length of the eleventh edge 16 is denoted as L32, the length of the second edge 21 is denoted as L41, the length of the twelfth edge 26 is denoted as L42, and $1/10<(L31+L32)/(L41+L42)\leq 1$.

When two edges of the first sub-pixel 10 do not coincide with the first virtual shape 10', that is, the first edge 11 and the eleventh edge 16, the sizes of the two edges can embody the sizes of two chamfers in the first sub-pixel 10, and the larger the sum of the sizes of the two chamfers, the larger the decrease in the display brightness of the first sub-pixel 10. Similarly, when two edges of the second sub-pixel 20 do not coincide with the second virtual shape 20', that is, the second edge 21 and the twelfth edge 26, the sizes of the two edges can embody the sizes of two chamfers in the second sub-pixel 20, and the larger the sum of the sizes of the two chamfers, and the larger the decrease in the display brightness of the second sub-pixel 20. In addition, when the decreases in the display brightness of the first sub-pixel 10 and the second sub-pixel 20 are different, the display panel may have color deviation so that the display effect of the display panel can be affected.

In this embodiment, the sum (L31+L32) of the first edge 11 and the eleventh edge 16 is used for indicating the sum of the sizes of chamfers cut in the first sub-pixel 10, the sum (L41+L42) of the second edge 21 and the twelfth edge 26 is used for indicating the sum of the sizes of chamfers cut in the second sub-pixel 20, and the value range of (L31+L32)/(L41+L42) is configured to be greater than or equal to 1/10 and less than or equal to 1 so that the sizes of chamfers of the first sub-pixel 10 and chamfers of the second sub-pixel 20 can have a relatively small difference, and so that the decreases in the display brightness of the first sub-pixel 10 and the second sub-pixel 20 can remain consistent, thereby ensuring that the first sub-pixel 10 and the second sub-pixel 20 can have consistent display brightness, preventing the display color deviation and improving the display effect of the display panel. For example, $1/2\leq(L31+L32)/(L41+L42)\leq 4/5$.

It is to be understood that the preceding solely exemplifies a situation in which in the same first sub-pixel 10, an included angle may be present between the first edge 11 and the eleventh edge, and the size of the included angle may be designed according to actual requirements, that is, extension lines of the first edge and the eleventh edge may intersect. In an optional embodiment, when the first edge and the eleventh edge are two opposite edges, a relatively small included angle may be present between the first edge and the eleventh edge so that extension directions of the first edge and the eleventh edge can be roughly the same. Similarly, in the same second sub-pixel 20, an included angle may be present between the second edge and the twelfth edge, and the size of the included angle may be designed according to actual requirements, that is, extension lines of the second edge and the twelfth edge may intersect. In an optional embodiment, when the second edge and the twelfth edge are two opposite edges, a relatively small included angle may be present between the second edge and the twelfth edge so that extension directions of the second edge and the twelfth edge can be roughly the same.

In an optional embodiment, the first edge 11 is parallel to the eleventh edge 16 in the same first sub-pixel 10, and the second edge 21 is parallel to the twelfth edge 26 in the same second sub-pixel 20. In this way, the first edge 11 and the eleventh edge 16 may be two opposite edges in the first sub-pixel 10 so that the first sub-pixel 10 can have the same light emission effect in two opposite directions, thereby facilitating the improvement in the display light emission consistency of the first sub-pixel 10 in the two opposite directions. Similarly, the second edge 21 and the twelfth edge 26 may also be two opposite edges in the second sub-pixel 20 so that the second sub-pixel 20 can also have the same light emission effect in two opposite directions, thereby facilitating the improvement in the display light emission consistency of the second sub-pixel 20 in the two opposite directions.

Optionally, as shown in FIG. 13, the length of the first edge 11 is denoted as L31, the length of the eleventh edge 16 is denoted as L32, and L31+L32. In this way, the size of a triangle cut along the first edge 11 is different from the size of a triangle cut along the eleventh edge 16 so that the size of a cut portion in the first sub-pixel 10 can be configured flexibly, and so that the first sub-pixel 10 can have enough high display brightness on the premise that relatively large distances are ensured to be present between the first sub-pixel 10 and other sub-pixels located on one side of the first sub-pixel 10. In an optional embodiment, $0<L32/L31<0.5$, and in another optional embodiment, $1/3<L32/L31<1$, for example, $1/2<L32/L31<2/3$, that is, the ratio between the first edge 11 and the eleventh edge 16 falls within a relatively small ratio range.

Optionally, referring to FIG. 14, the length of the second edge 21 is denoted as L41, the length of the twelfth edge 26 is denoted as L42, and L31+L42. In this way, the size of a triangle cut along the second edge 21 is different from the size of a triangle cut along the twelfth edge 26 so that the size of a cut portion in the second sub-pixel 20 can be configured flexibly, and so that the second sub-pixel 20 can have enough high display brightness on the premise that relatively large distances are ensured to be present between the second sub-pixel 20 and other sub-pixels located on one side of the second sub-pixel 20. In an optional embodiment, $0<L42/L41<0.5$, and in another optional embodiment, $1/3<L42/L41<1$, for example, $1/2<L42/L41<2/3$, that is, the ratio between the second edge 21 and the twelfth edge 26 falls within a relatively small ratio range.

Optionally, based on the preceding embodiments, with continued reference to FIG. 13, the first sub-pixel 10 further includes the third edge 12, the fourth edge 13, the seventh edge 14 and the eighth edge 15; the first edge 11 is connected to the same side of the seventh edge 13 and the eighth edge 14, and the eleventh edge 16 is connected to the same side of the third edge 12 and the fourth edge 13; the connection point between the first edge 11 and the seventh edge 14 is the first connection point o1, and the connection point between the first edge 11 and the eighth edge 15 is the second connection point o2; a connection point between the eleventh edge 16 and the third edge 12 is the fifth connection point o5, and a connection point between the eleventh edge 16 and the fourth edge 13 is a sixth connection point o6; the first virtual shape 10' includes the first virtual edge 11', the second virtual edge 12', a fifth virtual edge 13' and a sixth virtual edge 14'; the first virtual edge 11' is connected to the second virtual edge 12', and the connection point between the first virtual edge 11' and the second virtual edge 12' is the first virtual point o1'; the fifth virtual edge 13' is connected to the sixth virtual edge 14', and a connection point between the fifth virtual edge 13' and the sixth virtual edge 14' is a third virtual point o3'; the seventh edge 14 partially coincides with the first virtual edge 11', the eighth edge 15 partially coincides with the second virtual edge 12', the third edge 12 partially coincides with the fifth virtual edge 13', and the fourth edge 13 partially coincides with the sixth virtual edge 14'.

The length of the seventh edge 14 is denoted as L51, the length of the eighth edge 15 is denoted as L52, the length of the third edge 12 is denoted as L53, and the length of the fourth edge 13 is denoted as L54; the minimum distance from the first connection point o1 to the first virtual point o1' is denoted as 111, the minimum distance from the second connection point o2 to the first virtual point o1' is denoted as 112, the minimum distance from the fifth connection point o5 to the third virtual point o3' is denoted as 113, and the minimum distance from the sixth connection point o6 to the third virtual point o3' is denoted as 114; 1/40≤111/L51≤1/2; 1/40≤112/L52≤1/2; 1/40≤113/L53≤1/2; and 1/40≤114/L54≤1/2.

It is to be understood that the connection line between the first connection point o1 and the first virtual point o1' may be the first connection line, the connection line between the second connection point o2 and the first virtual point o1' may be the second connection line, and when the length of the first connection line is denoted as 111, and the length of the second connection line is denoted as 112, the length ratio between the first connection line and the seventh edge 14 and the length ratio between the second connection line and the eighth edge 15 can embody the size of the chamfer when chamfering is performed along the first edge 11; a connection line between the fifth connection point o5 and the third virtual point o3' may be a fifth connection line, a connection line between the sixth connection point o6 and the third virtual point o3' may be a sixth connection line, and when the length of the fifth connection line is denoted as 111, and the length of the sixth connection line is denoted as 112, the length ratio between the fifth connection line and the third edge 12 and the length ratio between the sixth connection line and the fourth edge 13 can embody the size of the chamfer when chamfering is performed along the eleventh edge 16. In this way, the value range of 111/L51 is configured to be greater than or equal to 1/40 and less than or equal to 1/2, the value range of 112/L52 is configured to be greater than or equal to 1/40 and less than or equal to 1/2, the value range of 113/L53 is configured to be greater than or equal to 1/40 and less than or equal to 1/2, and the value range of 114/L54 is configured to be greater than or equal to 1/40 and less than or equal to 1/2 so that on the premise that the size of a chamfer in the first sub-pixel 10 is small enough to enable the first sub-pixel 10 to have enough high display brightness, relatively large distances can be present between the first sub-pixel 10 and other sub-pixels located on one side of the first edge 11 and/or the eleventh edge 16 of the first sub-pixel 10, reducing lateral leakage currents, improving the undesired light emission of pixels and improving the display effect of the display panel. For example, 1/20≤111/L51≤2/5, 1/20≤ 112/L52≤2/5, 1/20≤113/L53≤2/5, and 1/20≤114/L54≤2/5.

Optionally, the second sub-pixel 20 further includes the fifth edge 22, the sixth edge 23, the ninth edge 24 and the tenth edge 25; the second edge 21 is connected to the same side of the ninth edge 24 and the tenth edge 25, and the twelfth edge 26 is connected to the same side of the fifth edge 22 and the sixth edge 23; the connection point between the second edge 21 and the ninth edge 24 is the third connection point o3, and the connection point between the second edge 21 and the tenth edge 25 is the fourth connection point o4; a connection point between the twelfth edge 26 and the fifth edge 22 is a seventh connection point o7, and a connection point between the twelfth edge 26 and the sixth edge 23 is an eighth connection point o8; the second virtual shape 20' includes the third virtual edge 21', the fourth virtual edge 22', a seventh virtual edge 23' and an eighth virtual edge 24'; the third virtual edge 21' is connected to the fourth virtual edge 22', and the connection point between the third virtual edge 21' and the fourth virtual edge 22' is the second virtual point o2'; the seventh virtual edge 23' is connected to the eighth virtual edge 24', and a connection point between the seventh virtual edge 23' and the eighth virtual edge 24' is a fourth virtual point o4'; and the ninth edge 24 partially coincides with the third virtual edge 21', the tenth edge 25 partially coincides with the fourth virtual edge 22', the fifth edge 22 partially coincides with the seventh virtual edge 23', and the sixth edge 23 partially coincides with the eighth virtual edge 24'.

The length of the ninth edge 24 is denoted as L61, the length of the tenth edge 25 is denoted as L62, the length of the fifth edge 22 is denoted as L63, and the length of the sixth edge 23 is denoted as L64; the minimum distance from the third connection point o3 to the second virtual point o2' is denoted as 121, the minimum distance from the fourth connection point o4 to the second virtual point o2' is denoted as 122, the minimum distance from the seventh connection point o7 to the fourth virtual point o4' is denoted as 123, and the minimum distance from the eighth connection point o8 to the fourth virtual point o4' is denoted as 124; 1/40≤121/L61≤1/2; 1/40≤122/L62≤1/2; 1/40≤123/L63≤1/2; and 1/40≤124/L64≤1/2.

In this way, based on the same principle as the first sub-pixel 10, the value range of 121/L61 is configured to be greater than or equal to 1/40 and less than or equal to 1/2, the value range of 122/L62 is configured to be greater than or equal to 1/40 and less than or equal to 1/2, the value range of 123/L63 is configured to be greater than or equal to 1/40 and less than or equal to 1/2, and the value range of 124/L64 is configured to be greater than or equal to 1/40 and less than or equal to 1/2 so that on the premise that the size of a chamfer in the second sub-pixel 20 is small enough to enable the second sub-pixel 20 to have enough high display brightness, relatively large distances can be present between the second sub-pixel 20 and other sub-pixels located on one side of the second edge 21 and/or the twelfth edge 26 of the second sub-pixel 20, reducing lateral leakage currents, improving the undesired light emission of pixels and improving the display effect of the display panel. For example, 1/20≤121/L61≤2/5, 1/20≤122/L62≤2/5, 1/20≤123/L63≤2/5, and 1/20≤124/L64≤2/5.

Optionally, the first virtual shape 10' includes a first virtual axis 15', the center of the first virtual shape 10' is located on the first virtual axis 15', the first virtual axis 15' intersects the first edge 11 and the eleventh edge 16, and at least one of a midpoint of the first edge 11 or a midpoint of the eleventh edge 16 is not located on the first virtual axis 15'.

Since the first virtual shape 10' is a parallelogram, the first virtual axis 15' may be one diagonal in the first virtual shape 10' so that the first virtual axis 15' can pass through the center of the first virtual shape 10'. Meanwhile, the at least one of the midpoint of the first edge 11 or the midpoint of the eleventh edge 16 is not located on the first virtual axis 15', that is, only the center of the first edge 11 is not located on the first virtual axis 15', or only the center of the eleventh edge 16 is not located on the first virtual axis 15', or centers of the first edge 11 and the eleventh edge 16 are not located on the first virtual axis 15'. When the center of the first edge 11 is not located on the first virtual axis 15', the first edge 11 is asymmetric with respect to the first virtual axis 15', and the first connection point o1 and the second connection point o2 are located on two opposite sides of the first virtual axis 15'. In this case, the length and inclination degree of the first edge 11 may be configured flexibly according to actual requirements. Correspondingly, when the center of the eleventh edge 16 is not located on the first virtual axis 15', the eleventh edge 16 is asymmetric with respect to the first virtual axis 15', and the fifth connection point o5 and the sixth connection point o6 are located on two opposite sides of the first virtual axis 15'. In this case, the length and inclination degree of the eleventh edge 16 may be configured flexibly according to actual requirements.

Based on the same design idea, the second virtual shape 20' includes a second virtual axis 25', the center of the second virtual shape 20' is located on the second virtual axis 25', the second virtual axis 25' intersects the second edge 21 and the twelfth edge 26, and at least one of a midpoint of the second edge 21 or a midpoint of the twelfth edge 26 is not located on the second virtual axis 25'. In this way, the length and inclination degree of the second edge 21 and the length and inclination degree of the eleventh edge 26 can be configured flexibly according to actual requirements.

In another optional embodiment, when the first virtual shape 10' includes the first virtual axis 15', the center of the first virtual shape 10' is located on the first virtual axis 15', and the first virtual axis 15' intersects the first edge 11 and the eleventh edge 16, midpoints of the first edge 11 and the eleventh edge 16 may also be located on the first virtual axis 15'. In this case, the first edge 11 and the eleventh edge 16 are symmetrical with respect to the first virtual axis 15' so that in the first sub-pixel 10, the removed amounts for the third edge 12 and the fourth edge 13 can remain consistent, and the removed amounts for the seventh edge 14 and the eighth edge 15 can remain consistent, thereby enabling the first sub-pixel 10 to have relatively high display light emission consistency in directions of two opposite sides of the first virtual axis 15' and further facilitating the improvement in the display uniformity of the display panel.

Based on the same design idea, when the second virtual shape 20' includes the second virtual axis 25', the center of the second virtual shape 20' is located on the second virtual axis 25', and the second virtual axis 25' intersects the second edge 21 and the twelfth edge 26, midpoints of the second edge 21 and the twelfth edge 26 may be located on the second virtual axis 25'. In this case, the second edge 21 and the twelfth edge 26 are symmetrical with respect to the second virtual axis 25' so that in the second sub-pixel 20, the removed amounts for the fifth edge 22 and the sixth edge 23 can remain consistent, and the removed amounts for the ninth edge 24 and the tenth edge 25 can remain consistent, thereby enabling the second sub-pixel 20 to have relatively high display light emission consistency in directions of two opposite sides of the second virtual axis 25' and further facilitating the improvement in the display uniformity of the display panel.

It is to be noted that the preceding solely exemplifies the situation in which the first edge 11 is parallel to the eleventh edge 16 in the same first sub-pixel 10, and the second edge 21 is parallel to the twelfth edge 26 in the same second sub-pixel 20, and in the embodiment of the present disclosure, the first edge 11 and the eleventh edge 16 may also intersect in the same first sub-pixel 10, and the second edge 21 and the twelfth edge 26 may also intersect in the same second sub-pixel 20.

Figure 16:
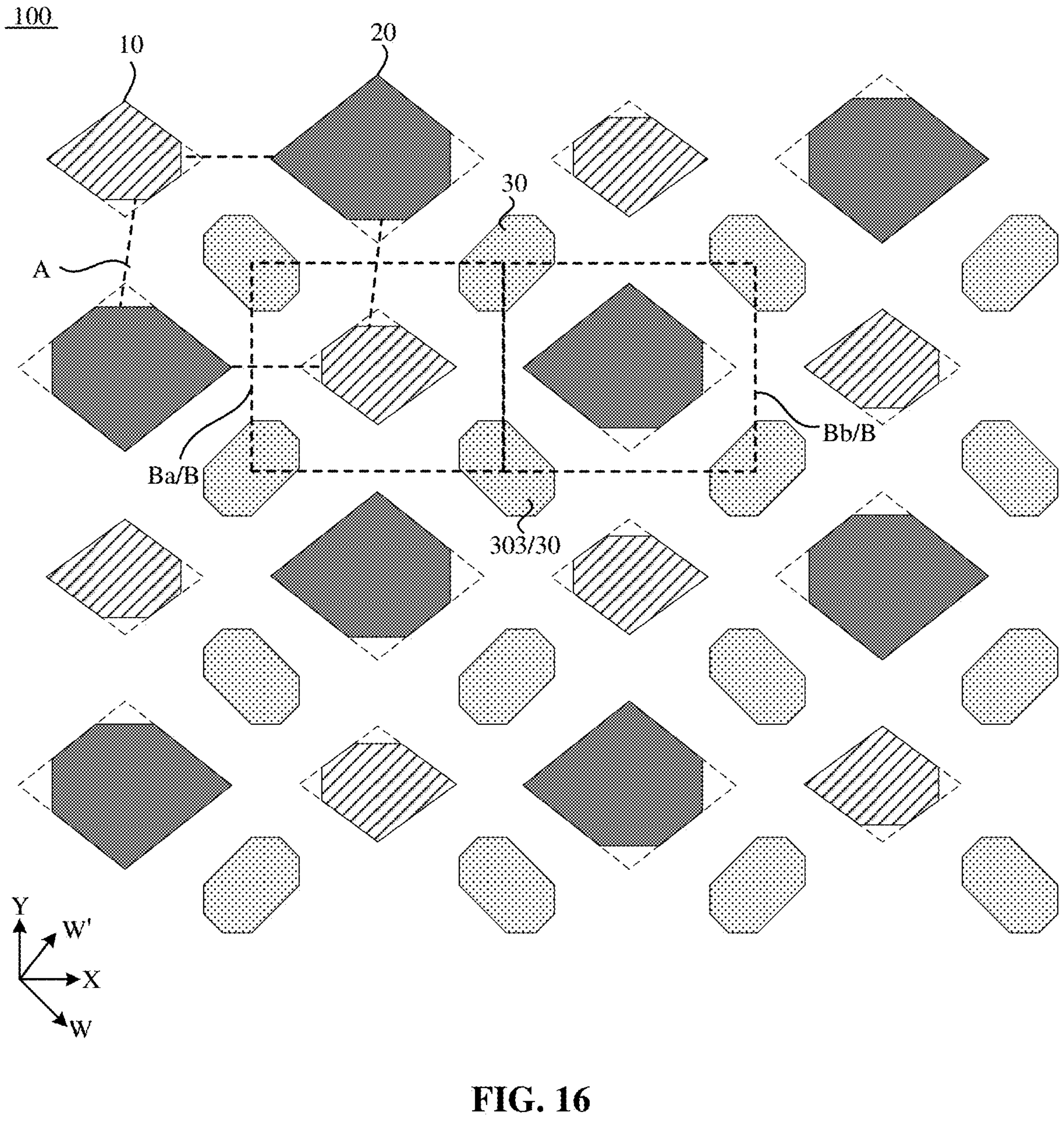
FIG. 16 is a diagram illustrating the structure of yet another display panel according to an embodiment of the present disclosure.
Figure 17:
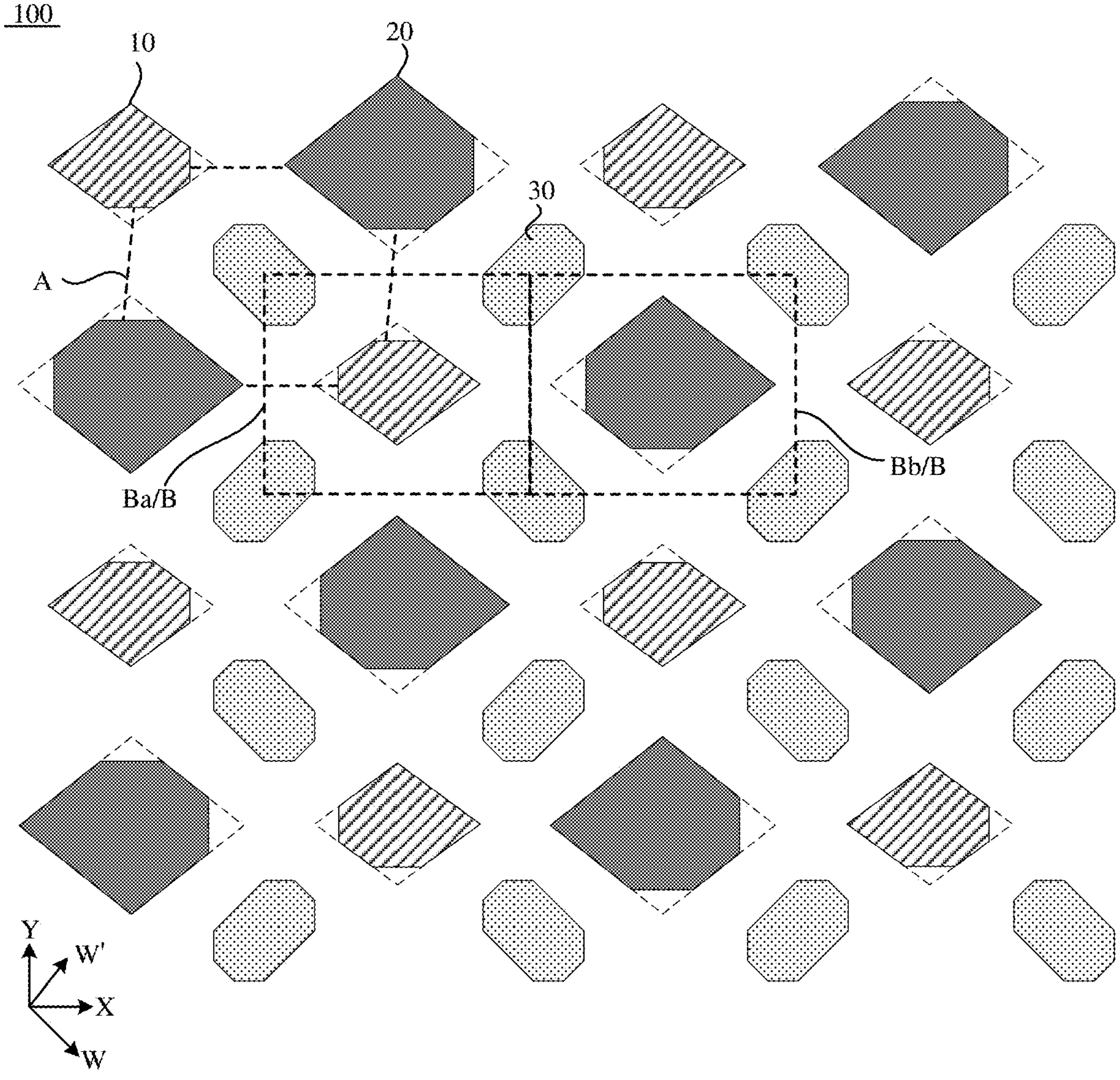
FIG. 17 is a diagram illustrating the structure of yet another display panel according to an embodiment of the present disclosure.
Figure 18:
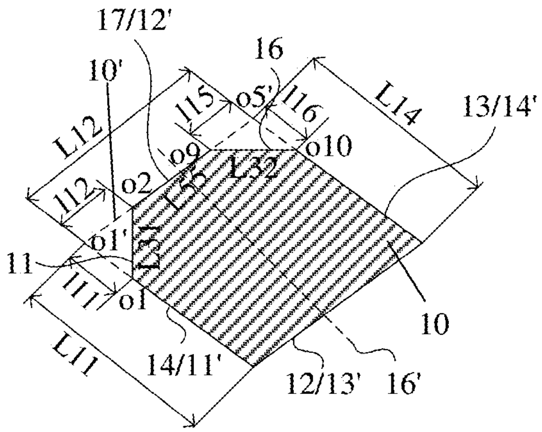
FIG. 18 is a diagram illustrating the structure of yet another first sub-pixel according to an embodiment of the present disclosure.
Figure 19:
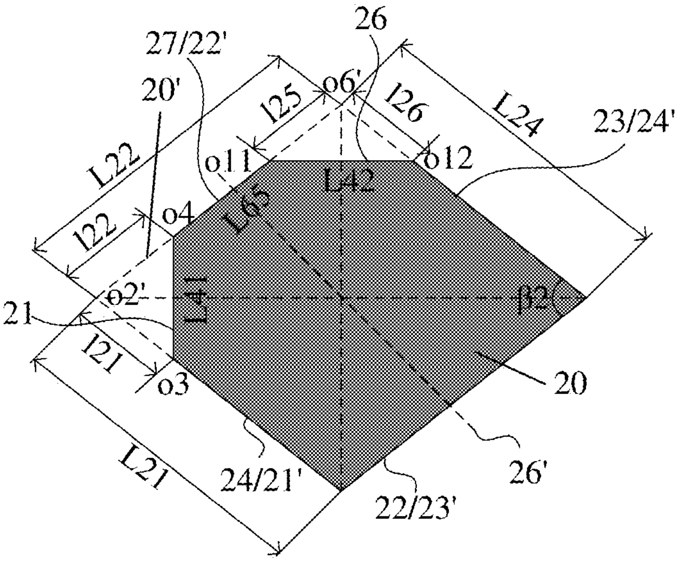
FIG. 19 is a diagram illustrating the structure of yet another second sub-pixel according to an embodiment of the present disclosure.
Figure 20:
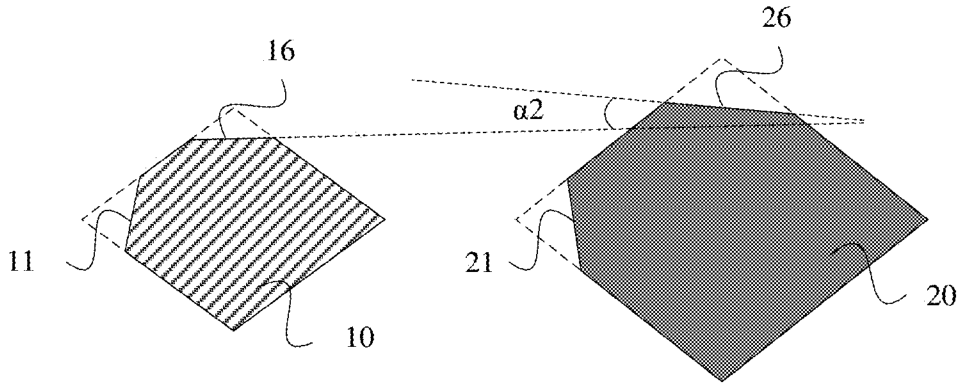
FIG. 20 is a diagram illustrating the structure of yet another adjacent first sub-pixel and second sub-pixel according to an embodiment of the present disclosure.

Optionally, FIG. 16 is a diagram illustrating the structure of yet another display panel according to an embodiment of the present disclosure, FIG. 17 is a diagram illustrating the structure of yet another display panel according to an embodiment of the present disclosure, FIG. 18 is a diagram illustrating the structure of yet another first sub-pixel according to an embodiment of the present disclosure, FIG. 19 is a diagram illustrating the structure of yet another second sub-pixel according to an embodiment of the present disclosure, and FIG. 20 is a diagram illustrating the structure of yet another adjacent first sub-pixel and second sub-pixel according to an embodiment of the present disclosure. In conjunction with FIGS. 16 to 20, the first sub-pixel 10 further includes a thirteenth edge 17 that partially coincides with the first virtual shape 10'; the thirteenth edge 17 is connected to the first edge 11 and the eleventh edge 17; the second sub-pixel 20 further includes a fourteenth edge 27 that partially coincides with the second virtual shape 20'; and the fourteenth edge 27 is connected to the second edge 21 and the twelfth edge 26.

The first virtual shape 10' may include the second virtual edge 12' so that the thirteenth edge 17 can coincide with part of the second virtual edge 12', and the thirteenth edge 17 is connected to the first edge 11 and the eleventh edge 16 so that a corner removed by performing chamfering along the first edge 11 and a corner removed by performing chamfering along the eleventh edge 16 can be two adjacent corners of the first sub-pixel 10 before chamfering is performed. In this way, on the premise that relatively large distances are ensured to be present between other sub-pixels located on one side of the first edge 11 and the eleventh edge 16 and the first sub-pixel 10, relatively small distances can also be present between other sub-pixels located on one side of the thirteenth edge 17 and the first sub-pixel 10 so that lateral leakage currents between the first sub-pixel 10 and more sub-pixels around the first sub-pixel 10 can be reduced.

Similarly, the second virtual shape 20' may include the fourth virtual edge 22' so that the fourteenth edge 27 can coincide with part of the fourth virtual edge 22', and the fourteenth edge 27 is connected to the second edge 21 and the twelfth edge 26 so that a corner removed by performing chamfering along the second edge 21 and a corner removed by performing chamfering along the twelfth edge 26 can be two adjacent corners of the second sub-pixel 20 before chamfering is performed. In this way, on the premise that relatively large distances are ensured to be present between other sub-pixels located on one side of the second edge 21 and the twelfth edge 26 and the second sub-pixel 20, relatively small distances can also be present between other sub-pixels located on one side of the fourteenth edge 27 and the second sub-pixel 20 so that lateral leakage currents between the second sub-pixel 20 and more sub-pixels around the second sub-pixel 20 can be reduced.

In an optional embodiment, the first virtual shape 10' includes a third virtual axis 16', the center of the first virtual shape is located on the third virtual axis 16', the third virtual axis 16' intersects the thirteenth edge 17, and a midpoint of the thirteenth edge 17 is not located on the third virtual axis 16'; and/or the second virtual shape 20' includes a fourth virtual axis 26', the center of the second virtual shape 20' is located on the fourth virtual axis 26', the fourth virtual axis 26' intersects the fourteenth edge 27, and a midpoint of the fourteenth edge 27 is not located on the fourth virtual axis 26'.

Referring to FIG. 18, midpoints of the second virtual edge 12' and the fifth virtual edge 13' in the first virtual shape 10' may be located on the third virtual axis 16', and the center of the first virtual shape 10' (that is, the geometric center of the first virtual shape 10') is also located on the third virtual axis 16'. Based on this, the third virtual axis 16' also intersects the thirteenth edge 17, and the center of the thirteenth edge 17 is not located on the third virtual axis 16'. In this case, the first edge 11 and the eleventh edge 16 that are connected to the thirteenth edge 17 are located on two opposite sides of the third virtual axis 16' and asymmetric with respect to the third virtual axis 16'. In this way, the length and inclination degree of the first edge 11 and the length and inclination degree of the eleventh edge 16 can be designed flexibly.

Similarly, referring to FIG. 19, midpoints of the fourth virtual edge 22' and the seventh virtual edge 23' in the second virtual shape 20' may be located on the fourth virtual axis 26', and the center of the second virtual shape 20' (that is, the geometric center of the second virtual shape 20') is also located on the fourth virtual axis 26'. Based on this, the fourth virtual axis 26' also intersects the fourteenth edge 27, and the center of the fourteenth edge 27 is not located on the fourth virtual axis 26'. In this case, the second edge 21 and the twelfth edge 26 that are connected to the fourteenth edge 27 are located on two opposite sides of the fourth virtual axis 26' and asymmetric with respect to the fourth virtual axis 26'. In this way, the length and inclination degree of the second edge 21 and the length and inclination degree of the twelfth edge 26 can be designed flexibly.

In another optional embodiment, the first virtual shape 10' includes the third virtual axis 16', the center of the first virtual shape is located on the third virtual axis 16', the third virtual axis 16' intersects the thirteenth edge 17, and the midpoint of the thirteenth edge 17 is located on the third virtual axis 16'; and/or the second virtual shape 20' includes the fourth virtual axis 26', the center of the second virtual shape 20' is located on the fourth virtual axis 26', the fourth virtual axis 26' intersects the fourteenth edge 27, and the midpoint of the fourteenth edge 27 is located on the fourth virtual axis 26'.

Referring to FIG. 18, in the first virtual shape 10', the third virtual axis 16' intersects the thirteenth edge 17, and the midpoint of the thirteenth edge 17 is located on the third virtual axis 16' so that the thirteenth edge 17 can coincide with the middle part of the second virtual edge 12'. In this way, when the distance from an endpoint of the thirteenth edge 17 close to the first edge 11 to the connection point between the first virtual edge 11' and the second virtual edge 12' is denoted as 112, and the distance from an endpoint of the thirteenth edge 17 close to the eleventh edge 16 to the connection point between the second virtual edge 12' and the sixth virtual edge 14' is denoted as 115, 112 can be equal to 115 so that a portion removed by performing chamfering along the first edge 11 can remain consistent with a portion removed by performing chamfering along the eleventh edge 16, thereby facilitating the improvement in the display uniformity of the first sub-pixel 10.

Similarly, referring to FIG. 19, in the second virtual shape 20', the fourth virtual axis 26' intersects the fourteenth edge 27, and the midpoint of the fourteenth edge 27 is located on the fourth virtual axis 26' so that the fourteenth edge 27 can coincide with the middle part of the fourth virtual edge 22'. In this way, when the distance from an endpoint of the fourteenth edge 27 close to the second edge 21 to the connection point between the third virtual edge 21' and the fourth virtual edge 22' is denoted as 122, and the distance from an endpoint of the fourteenth edge 27 close to the twelfth edge 26 to the connection point between the third virtual edge 22' and the eighth virtual edge 24' is denoted as 125, 122 can be equal to 125 so that a portion removed by performing chamfering along the second edge 21 can remain consistent with a portion removed by performing chamfering along the twelfth edge 16, thereby facilitating the improvement in the display uniformity of the second sub-pixel 20.

As a feasible embodiment, when the first virtual shape 10' includes the third virtual axis 16', and the center of the first virtual shape 10' is located on the first virtual axis 16', the third virtual axis 16' intersects the thirteenth edge 17, and the first edge 11 and the eleventh edge 16 are symmetrical with respect to the third virtual axis 16'; and/or when the second virtual shape 20' includes the fourth virtual axis 26', and the center of the second virtual shape 20' is located on the fourth virtual axis 26', the fourth virtual axis 26' intersects the fourteenth edge 27, and the second edge 21 and the twelfth edge 26 are symmetrical with respect to the fourth virtual axis 26'.

Referring to FIG. 18, the first edge 11 and the eleventh edge 16 are symmetrical with respect to the third virtual axis 16'. In this case, the first edge 11 and the eleventh edge 16 may be the same line segment, that is, an acute angle between the first edge 11 and the thirteenth edge 17 may be equal to an acute angle between the eleventh edge 16 and the thirteenth edge 17, and the length of the first edge 11 may also be equal to the length of the thirteenth edge 17, so that the first sub-pixel 10 can have a symmetrical structure, thereby facilitating the simplification of the design manner of the first sub-pixel 10.

Similarly, referring to FIG. 19, the second edge 21 and the twelfth edge 26 are symmetrical with respect to the fourth virtual axis 26'. In this case, the second edge 21 and the twelfth edge 26 may be the same line segment, that is, an acute angle between the second edge 21 and the fourteenth edge 27 may be equal to an acute angle between the twelfth edge 26 and the fourteenth edge 27, and the length of the second edge 21 may also be equal to the length of the fourteenth edge 27, so that the second sub-pixel 20 can have a symmetrical structure, thereby facilitating the simplification of the design manner of the second sub-pixel 20.

In an optional embodiment, when the length of the first edge 11 is denoted as L31, the length of the eleventh edge 16 is denoted as L32, and L31=L32; and/or when the length of the second edge 21 is denoted as L41, the length of the twelfth edge 26 is denoted as L42, and L41=L42.

The length of the first edge 11 may denote the size of a chamfer when chamfering is performed along the first edge 11, the length of the eleventh edge 16 may denote the size of a chamfer when chamfering is performed along the eleventh edge 16, and the length L31 of the first edge 11 is equal to the length of the eleventh edge 16 so that the sizes of two adjacent chamfers in the first sub-pixel 10 can remain consistent, thereby facilitating the improvement in the display light emission effect of the first sub-pixel 10. Similarly, the length of the second edge 21 may denote the size of a chamfer when chamfering is performed along the second edge 21, the length of the twelfth edge 26 may denote the size of a chamfer when chamfering is performed along the twelfth edge 26, and the length L41 of the second edge 21 is equal to the length of the twelfth edge 26 so that the sizes of two adjacent chamfers in the second sub-pixel 20 can remain consistent, thereby facilitating the improvement in the display light emission effect of the second sub-pixel 20.

Optionally, the first sub-pixel 10 further includes the seventh edge 14 and the fourth edge 13 that are parallel to each other; the first edge 11 is connected to the seventh edge 14 and the thirteenth edge 17, the connection point between the first edge 11 and the seventh edge 14 is the first connection point o1, and the connection point between the first edge 11 and the thirteenth edge 17 is the second connection point o2; the eleventh edge 16 is connected to the thirteenth edge 17 and the fourth edge 13, a connection point between the eleventh edge 16 and the thirteenth edge 17 is a ninth connection point o9, and a connection point between the eleventh edge 16 and the fourth edge 13 is a tenth connection point o10; the first virtual shape 10' includes the first virtual edge 11', the second virtual edge 12' and the sixth virtual edge 14', the first virtual edge 11' is parallel to the sixth virtual edge 14', the second virtual edge 12' is connected to the first virtual edge 11' and the sixth virtual edge 14', the connection point between the second virtual edge 12' and the first virtual edge 11' is the first virtual point o1', and a connection point between the second virtual edge 12' and the sixth virtual edge 14' is a fifth virtual point o5'; the seventh edge 14 partially coincides with the first virtual edge 11', the thirteenth edge 17 partially coincides with the second virtual edge 12', and the fourth edge 13 partially coincides with the sixth virtual edge 14'.

The minimum distance from the first connection point o1 to the first virtual point o1' is denoted as 111, the minimum distance from the second connection point o2 to the first virtual point o1' is denoted as 112, the minimum distance from the ninth connection point o9 to the fifth virtual point o5' is denoted as 115, the minimum distance from the tenth connection point o10 to the fifth virtual point o5' is denoted as 116, and 111*112=115*116.

It is to be understood that the connection line between the first connection point o1 and the first virtual point o1' may be the first connection line, the connection line between the second connection point o2 and the first virtual point o1' may be the second connection line, and when the length of the first connection line is denoted as 111, and the length of the second connection line is denoted as 112, a product between the length of the first connection line and the length of the second connection line can embody the size of the chamfer when chamfering is performed along the first edge 11; a connection line between the ninth connection point o9 and the fifth virtual point o5' may be a ninth connection line, a connection line between the tenth connection point o10 and the fifth virtual point o5' may be a tenth connection line, and when the length of the ninth connection line is denoted as 115, and the length of the tenth connection line is denoted as 116, a product between the length of the ninth connection line and the length of the tenth connection line can embody the size of the chamfer when chamfering is performed along the eleventh edge 16. In this way, 111*112=115*116 so that the size when chamfering is performed along the first edge 11 can be the same as the size when chamfering is performed along the eleventh edge 16, thereby facilitating the improvement in the display uniformity of the first sub-pixel 10 in various directions.

In an optional embodiment, when the length of the thirteenth edge 17 is denoted as L55, and the length of the second virtual edge 12' is denoted as L12, L55≤L12/2.

The length of the thirteenth edge 17 is equal to the length of the second virtual edge 12' minus the length of the ninth connection line and the length of the second connection line, so the length of the thirteenth edge 17 can also embody the size of a chamfer in the first sub-pixel 10. The length L55 of the thirteenth edge 17 is configured to be less than or equal to ½ of the length L12 of the second virtual edge 12' so that relatively large distances can be ensured to be present between the first sub-pixel 10 after chamfering and other sub-pixels around the first sub-pixel 10, thereby facilitating the reduction in lateral leakage currents, improving the undesired light emission of the sub-pixels and improving the display effect of the display panel.

Optionally, the second sub-pixel 20 further includes the ninth edge 24 and the sixth edge 23 that are parallel to each other; the second edge 21 is connected to the ninth edge 24 and the fourteenth edge 27, the connection point between the second edge 21 and the ninth edge 24 is the third connection point o3, and the connection point between the second edge 21 and the fourteenth edge 27 is the fourth connection point o4; the twelfth edge 26 is connected to the fourteenth edge 27 and the sixth edge 23, a connection point between the twelfth edge 26 and the fourteenth edge 27 is an eleventh connection point o11, and a connection point between the twelfth edge 26 and the sixth edge 23 is a twelfth connection point o12; the second virtual shape 20' includes the third virtual edge 21', the fourth virtual edge 22' and the eighth virtual edge 24', the third virtual edge 21' is parallel to the eighth virtual edge 24', the fourth virtual edge 22' is connected to the third virtual edge 21' and the eighth virtual edge 24', the connection point between the fourth virtual edge 24' and the third virtual edge 21' is the second virtual point o2', and a connection point between the fourth virtual edge 22' and the eighth virtual edge 24' is a sixth virtual point o6'; the ninth edge 24 partially coincides with the third virtual edge 21', the fourteenth edge 27 partially coincides with the fourth virtual edge 22', and the sixth edge 23 partially coincides with the eighth virtual edge 24'.

The minimum distance from the third connection point o3 to the second virtual point o2' is denoted as 121, the minimum distance from the fourth connection point o4 to the second virtual point o2' is denoted as 122, the minimum distance from the eleventh connection point o11 to the sixth virtual point o6' is denoted as 125, the minimum distance from the twelfth connection point o12 to the sixth virtual point o6' is denoted as 126, and 121*122=125*126.

It is to be understood that the connection line between the third connection point o3 and the second virtual point o2' may be the third connection line, the connection line between the fourth connection point o4 and the second virtual point o2' may be the fourth connection line, and when the length of the third connection line is denoted as 121, and the length of the fourth connection line is denoted as 122, a product between the length of the third connection line and the length of the fourth connection line can embody the size of the chamfer when chamfering is performed along the second edge 21; a connection line between the eleventh connection point o11 and the sixth virtual point o6' may be an eleventh connection line, a connection line between the twelfth connection point o12 and the sixth virtual point o6' may be a twelfth connection line, and when the length of the eleventh connection line is denoted as 125, and the length of the twelfth connection line is denoted as 126, a product between the length of the eleventh connection line and the length of the twelfth connection line can embody the size of the chamfer when chamfering is performed along the twelfth edge 26. In this way, 121*122=125*126 so that the size when chamfering is performed along the second edge 21 can be the same as the size when chamfering is performed along the twelfth edge 26, thereby facilitating the improvement in the display uniformity of the second sub-pixel 20 in various directions.

In an optional embodiment, the length of the fourteenth edge is denoted as L65, and the length of the fourth virtual edge is denoted as L22, and L65≤L22/2.

The length of the fourteenth edge 27 is equal to the length of the fourth virtual edge 22' minus the length of the eleventh connection line and the length of the fourth connection line, so the length of the fourteenth edge 27 can also embody the size of a chamfer in the second sub-pixel 20. The length L65 of the fourteenth edge 27 is configured to be less than or equal to ½ of the length L22 of the fourth virtual edge 22' so that relatively large distances can be ensured to be present between the second sub-pixel 20 after chamfering and other sub-pixels around the second sub-pixel 20, thereby facilitating the reduction in lateral leakage currents, improving the undesired light emission of the sub-pixels and improving the display effect of the display panel.

It is to be noted that the preceding solely exemplifies a specific structure of the first sub-pixel and the second sub-pixel in the display panel and the arrangement manner of the first sub-pixel and the second sub-pixel under the structure, and in the embodiment of the present disclosure, the structure of the first sub-pixel and the second sub-pixel is not limited to this and may also be in other configuration manners, for example, three or more edges of the first sub-pixel do not coincide with the first virtual shape, and three or more edges of the second sub-pixel do not coincide with the second virtual shape, and this is not specifically limited in the embodiment of the present disclosure on the premise that the core inventive points of the embodiment of the present disclosure can be achieved. For ease of description, unless otherwise limited, embodiments of the present disclosure are described below using an example in which one first edge of the first sub-pixel does not coincide with the first virtual shape, and one second edge of the second sub-pixel does not coincide with the second virtual shape.

Optionally, the display panel further includes multiple support columns, and along a thickness direction of the display panel, each support column overlaps at least one virtual edge of a respective first virtual quadrilateral, and the at least one virtual edge each intersects at least one of the first edge or the second edge.

Figure 21:
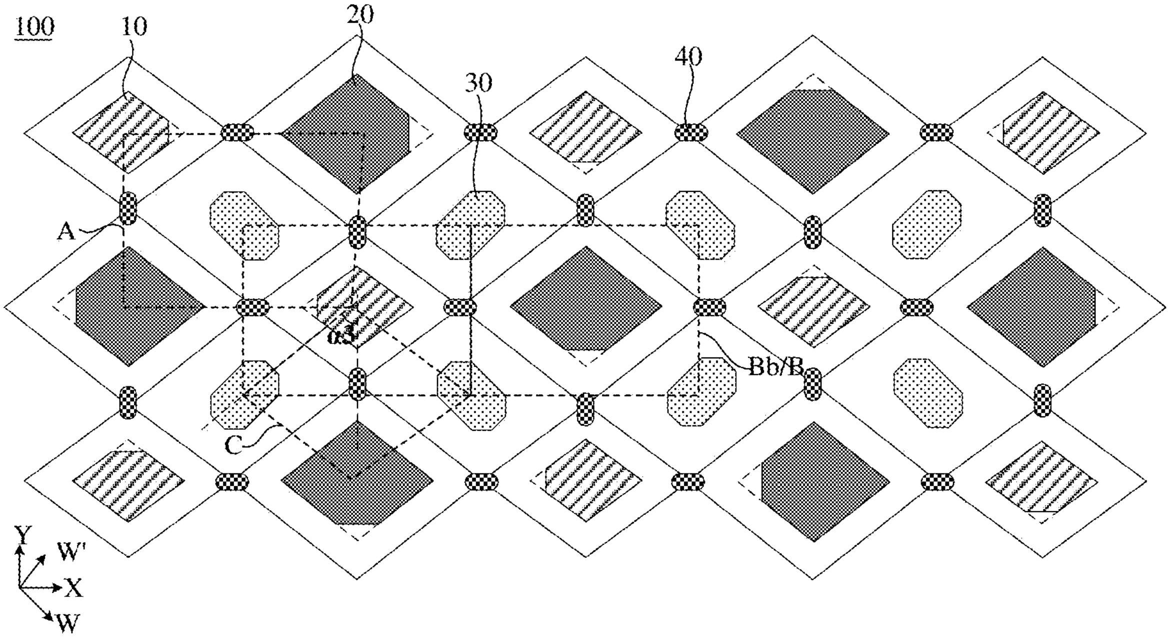
FIG. 21 is a diagram illustrating the structure of yet another display panel according to an embodiment of the present disclosure.

Exemplarily, FIG. 21 is a diagram illustrating the structure of yet another display panel according to an embodiment of the present disclosure. As shown in FIG. 21, the display panel further includes multiple support columns 40. The multiple support columns 40 may be disposed at intervals between the sub-pixels, that is, may be disposed within a non-opening region, so that light rays emitted by the sub-pixels cannot be affected. The multiple support columns 40 are configured to support the display panel in the thickness direction. A projection of the structure of the support column 40 in the thickness direction of the display panel is a rounded-corner rectangle, but is not limited to this.

It is to be understood that lines connecting the centers of two first sub-pixels 10 and two second sub-pixels 20 form a first virtual quadrilateral A. The non-opening region is provided with the multiple support columns 40, and in the thickness direction of the display panel, at least one support column 40 overlaps at least one virtual edge of the respective first virtual quadrilateral A. In an optional embodiment, the support column 40 may be disposed between two adjacent sub-pixels that have a relatively large distance to ensure an enough large space for disposing the support column 40. In this way, while the configuration density of the multiple support columns 40 is ensured, the support effect of the support column 40 on a mask is ensured so that the manufacturing yield and display effect can be improved.

Optionally, with continued reference to FIG. 21, one first sub-pixel 10, one second sub-pixel 20 and two third sub-pixels 30 form a third virtual quadrilateral C, centers of the two third sub-pixels 30 are located at two opposite vertices of the third virtual quadrilateral C, the center of the first sub-pixel 10 and the center of the second sub-pixel 20 are located at the other two opposite vertices of the third virtual quadrilateral C; and an included angle between each extension direction of the two third sub-pixels 30 and an extension direction of a respective support column 40 toward the second sub-pixel 20 is denoted as $\alpha 3$, and $40° \leq \alpha 3 \leq 50°$ It is to be understood that the projection of the support column in the thickness direction of the display panel may be a regular or an irregular pattern, and the extension direction of the support column mentioned in the embodiment of the present disclosure is an extension direction of a long axis or the longest edge of a projection of the support column. For example, when the projection of the structure of the support column 40 in the thickness direction of the display panel may be the rounded corner rectangle, the extension direction of the support column 40 may be parallel to a long edge of the rounded corner rectangle. A projection of the structure of the third sub-pixel 30 in the thickness direction of the display panel is generally rectangle-like, and the extension direction of the third sub-pixel 30 is parallel to a long edge of the rectangle-like. An included angle between the extension direction of the third sub-pixel 30 and an extension direction of an adjacent support column 40 is denoted as $\alpha 3$, and $\alpha 3$ satisfies that $40° \leq \alpha 3 \leq 50°$. For example, $\alpha 3$ may be 41°, 45°, or 49°. Optionally, $\alpha 3 = 45°$. In this way, the extension direction of the long axis of the support column 40 is pointed toward a respective third sub-pixel 30 so that an included angle between a short edge (which is perpendicular to the extension direction) of the support column 40 and a corresponding overlapped virtual edge can be very small. After the non-opening region between the multiple first sub-pixels 10 and the multiple second sub-pixels 20 are provided with the multiple support columns 40, the manufacturing yield and display effect can be improved, and high pixels per inch (PPI) of the display panel can be achieved.

Figure 22:
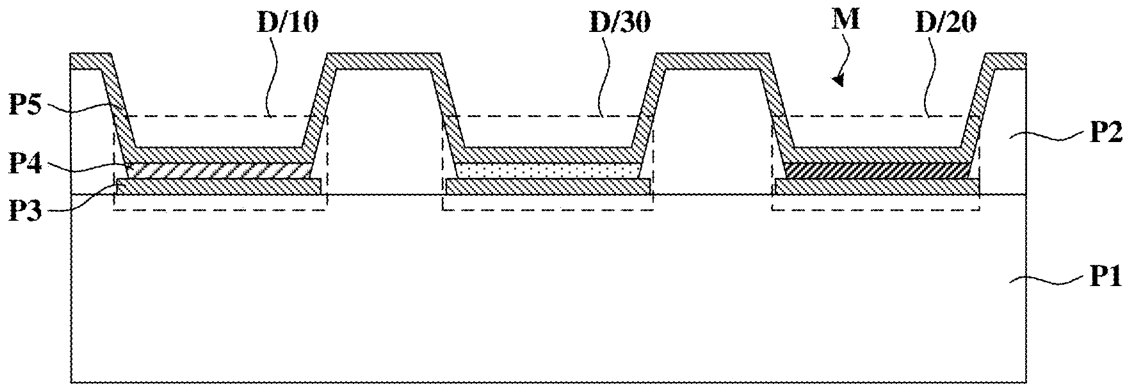
FIG. 22 is a diagram illustrating the structure of films of a display panel according to an embodiment of the present disclosure.

Optionally, FIG. 22 is a diagram illustrating the structure of films of a display panel according to an embodiment of the present disclosure. As shown in FIG. 22, the display panel further includes a substrate P1, and a pixel defining layer P2 and multiple light-emitting elements D that are located on one side of the substrate P1, the pixel defining layer P2 includes multiple pixel openings M, and each light-emitting element D includes a first electrode P3, a second electrode P5 and a light-emitting layer P4 located between the first electrode P3 and the second electrode P5; the light-emitting element D includes the multiple first sub-pixels 10, the multiple second sub-pixels 20 and the multiple third sub-pixels 30; and in at least ones of the multiple first sub-pixels 10 or the multiple second sub-pixels 20, the shape of the first electrode P3 is roughly the same as the shape of a respective pixel opening M.

Figure 23:
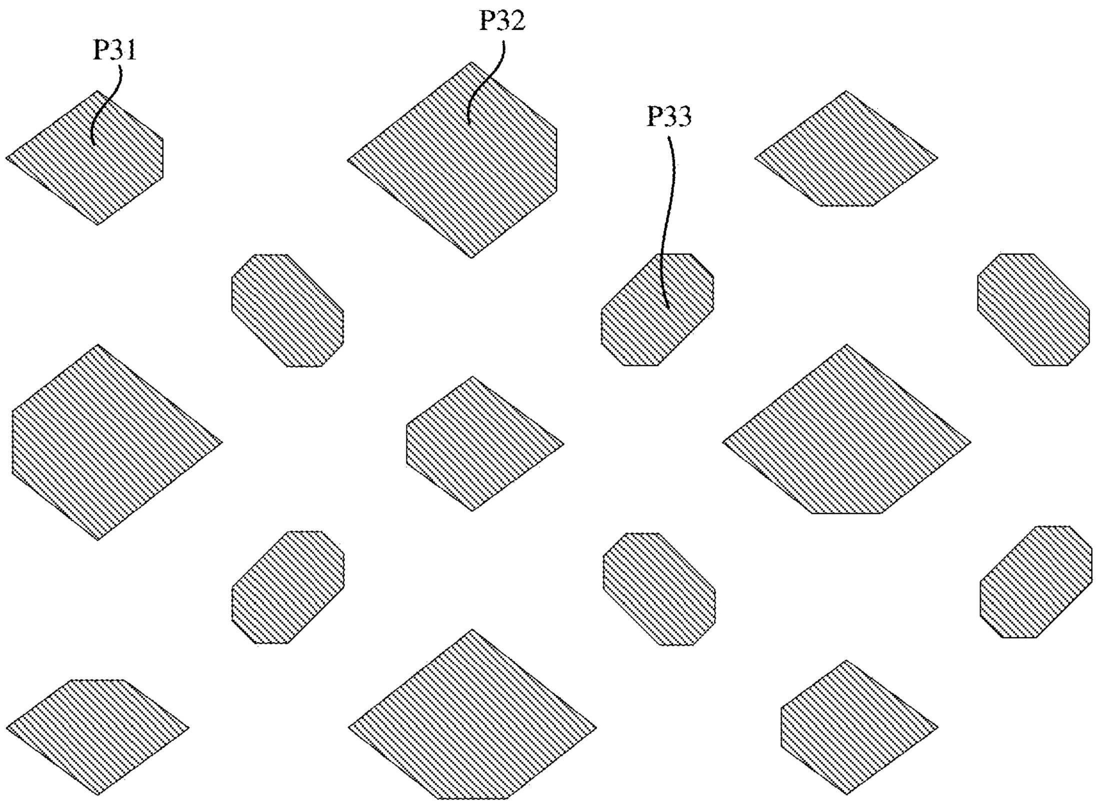
FIG. 23 is a diagram illustrating the structure of yet another display panel according to an embodiment of the present disclosure.

Exemplarily, FIG. 23 is a diagram illustrating the structure of yet another display panel according to an embodiment of the present disclosure. In conjunction with FIGS. 21 to 23, the shape of the first electrode P3 is roughly the same as the shape of the corresponding pixel opening M. It is to be understood that when the first electrode P3 includes a first electrode P31 of the first sub-pixel 10, a first electrode P32 of the second sub-pixel 20 and a first electrode P33 of the third sub-pixel 30, in this case, the shape of the first electrode 31 may be roughly the same as the shape of an opening of the first sub-pixel 10, the shape of the first electrode P32 may be roughly the same as the shape of an opening of the second sub-pixel 20, and the shape of the first electrode P33 may be roughly the same as the shape of an opening of the third sub-pixel 30. In this way, the first electrode P31 can satisfy the subsequent design of the shape of the first sub-pixel 10, the first electrode P32 can satisfy the subsequent design of the shape of the second sub-pixel 20, and the first electrode P33 can satisfy the subsequent design of the shape of the third sub-pixel 30. Meanwhile, the preparation of the first electrode P3 and formation of the opening of the first sub-pixel 11 may use the same parameter or tools such as a mask so that the production cost can be reduced, and the production efficiency can be improved.

Optionally, with continued reference to FIG. 22, the display panel further includes the substrate P1, and the pixel defining layer P2 and the multiple light-emitting elements D that are located on the side of the substrate P1, the pixel defining layer P2 includes the multiple pixel openings M, and the light-emitting element D includes the first electrode P3, the second electrode P5 and the light-emitting layer P4 located between the first electrode P3 and the second electrode P5; the light-emitting elements D include the multiple first sub-pixels 10, the multiple second sub-pixels 20 and the multiple third sub-pixels 30; and in the at least one of the first sub-pixel 10 or the second sub-pixel 20, the shape of the light-emitting layer P4 is roughly the same as the shape of a corresponding pixel opening M.

Figure 24:
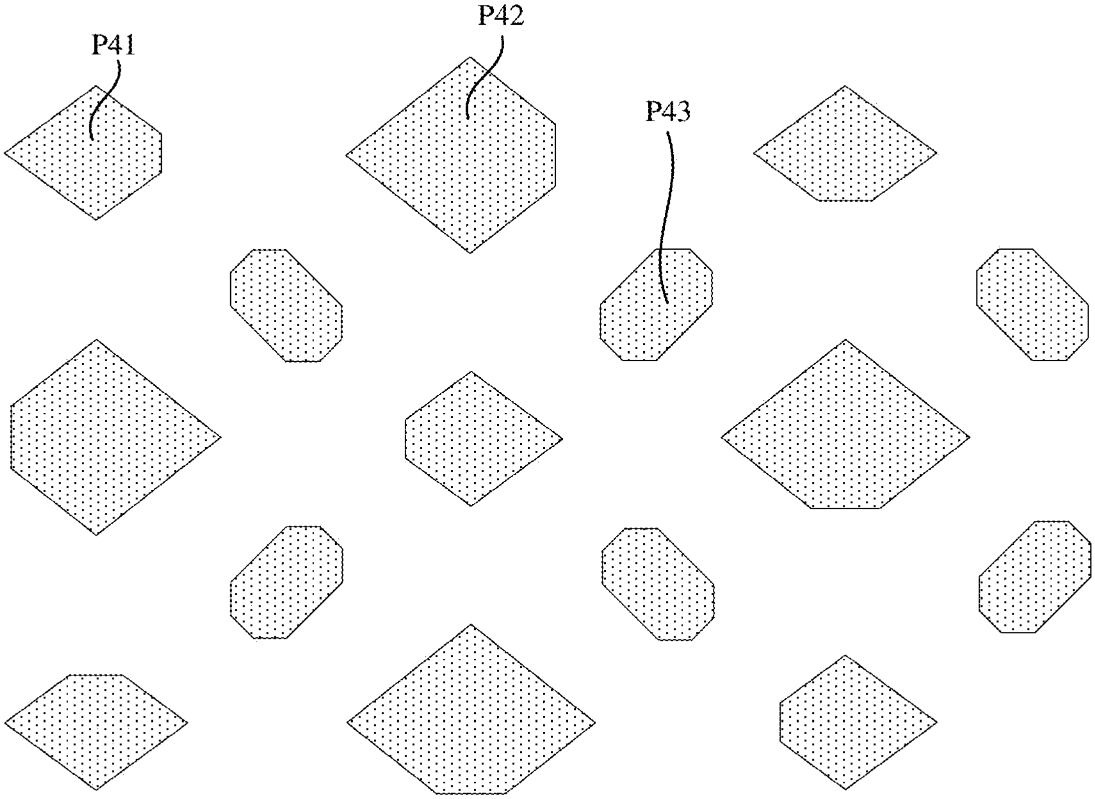
FIG. 24 is a diagram illustrating the structure of yet another display panel according to an embodiment of the present disclosure.

Exemplarily, FIG. 24 is a diagram illustrating the structure of yet another display panel according to an embodiment of the present disclosure. In conjunction with FIGS. 21 to 22 and 24, the shape of the light-emitting layer P4 is roughly the same as the shape of the corresponding pixel opening M. It is to be understood that when the light-emitting layer P4 includes a light-emitting layer P41 of the first sub-pixel 10, a light-emitting layer P42 of the second sub-pixel 20 and a light-emitting layer P43 of the third sub-pixel 30, in this case, the shape of the light-emitting layer P41 may be roughly the same as the shape of an opening of the first sub-pixel 10, the shape of the light-emitting layer P42 may be roughly the same as the shape of an opening of the second sub-pixel 20, and the shape of the light-emitting layer P43 may be roughly the same as the shape of an opening of the third sub-pixel 30. In this way, the light-emitting layer P41 can satisfy the subsequent design of the shape of the first sub-pixel 10, the light-emitting layer P42 can satisfy the subsequent design of the shape of the second sub-pixel 20, and the light-emitting layer P43 can satisfy the subsequent design of the shape of the third sub-pixel 30. Meanwhile, the preparation of the light-emitting layer P4 and formation of the opening of the first sub-pixel 11 may use the same parameter or tools such as a mask so that the production cost can be reduced, and the production efficiency can be improved.

It is to be understood that the substrate P1 of the display panel may include a thin-film transistor array substrate. The pixel defining layer P2 is generally an insulating layer and has the multiple pixel openings M. A region corresponding to a lower opening in each pixel opening M is a light-emitting region for a sub-pixel. A region other than the multiple pixel openings M in the pixel defining layer P2 may be the non-opening region for disposing the multiple support columns. In the light-emitting element D, the first electrode P3 may be an anode, and the second electrode P5 may be a cathode, but this is not limited to this, and positions of the anode and the cathode are not limited to this in other embodiments. The light-emitting layer P4 is located between the first electrode P3 and the second electrode P5. The light-emitting layer P4 of the first sub-pixel 10 may be configured to include a red light emission material, the light-emitting layer P4 of the second sub-pixel 20 may be configured to include a blue light emission material, and the light-emitting layer P4 of the third sub-pixel 30 may be configured to include a green light emission material, but this is not limited herein.

In addition, in the light-emitting element D, a first function layer may also be included between the first electrode P3 and the light-emitting layer P4, and a second function layer may also be included between the second electrode P5 and the light-emitting layer P4. If the first electrode P3 is an anode, and the second electrode P4 is a cathode, the first function layer may include a hole injection layer and a hole transport layer, and the second function layer may include an electron transport layer and a hole blocking layer. The structure of the films of the display panel further includes a protective layer located on one side of the second electrode P5 facing away from the first electrode P3. Details are not specifically shown and described herein.

Based on the same inventive concept, an embodiment of the present disclosure further provides a display device. The display device includes the display panel provided in the embodiments of the present disclosure. Therefore, the display device has the technical features of the display panel and driving methods that are provided in the embodiments of the present disclosure and can achieve the beneficial effects of the display panel provided in the embodiments of the present disclosure. Similarities may be referred to the preceding description of the display panel provided in the embodiments of the present disclosure and are not repeated herein.

Figure 25:
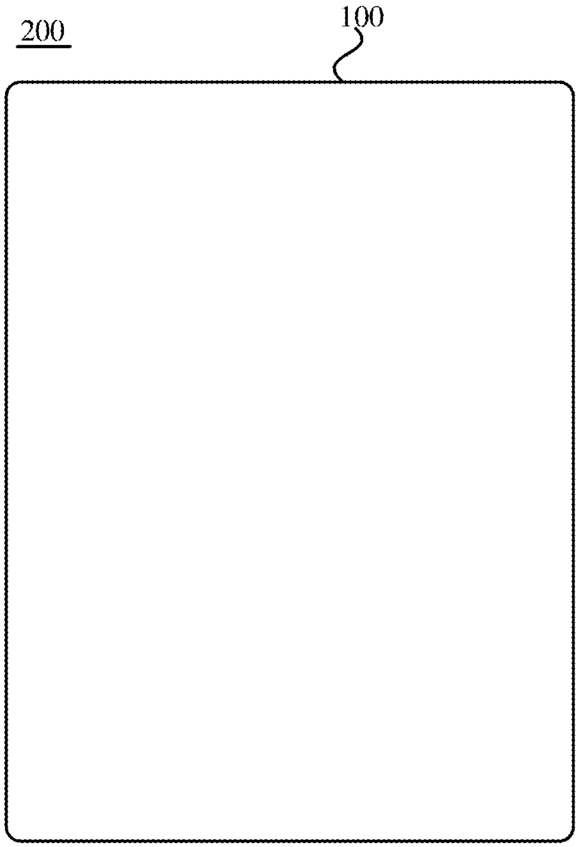
FIG. 25 is a diagram illustrating the structure of a display device according to an embodiment of the present disclosure.

Exemplarily, FIG. 25 is a diagram illustrating the structure of a display device according to an embodiment of the present disclosure. As shown in FIG. 25, the display device 200 includes the display panel 100 provided in the embodiments of the present disclosure. The display device 200 provided in the embodiment of the present disclosure may be any electronic product having a display function, including, but not limited to, the following categories: a phone, a television, a laptop, a desktop display, a tablet computer, a digital camera, a smart bracelet, smart glasses, a vehicle-mounted display, medical equipment, industrial control equipment, a touch interactive terminal. No special limitations are made thereto in the embodiment of the present disclosure.

It is to be understood that operation processes of various forms of pixel circuits shown in the preceding may be adopted with steps reordered, added, or deleted. For example, the steps of the operation processes of the pixel circuits described in the present disclosure may be performed in parallel, sequentially, or in different sequences, as long as the desired results of the technical solutions of the present disclosure can be achieved, and no limitation is imposed herein.

The preceding embodiments do not limit the scope of the present disclosure. It is to be understood by those skilled in the art that various modifications, combinations, sub-combinations and substitutions may be performed according to design requirements and other factors. Any modification, equivalent substitution, improvement or the like made within the spirit and principle of the present disclosure is within the scope of the present disclosure.

What is claimed is:

1. A display panel, comprising: a plurality of first sub-pixels, a plurality of second sub-pixels and a plurality of third sub-pixels, wherein the plurality of first sub-pixels and the plurality of second sub-pixels form first virtual quadrilaterals, centers of the plurality of first sub-pixels are located at first vertices of the first virtual quadrilaterals, centers of the plurality of second sub-pixels are located at second vertices of the first virtual quadrilaterals, the first vertices and the second vertices are alternated and spaced apart, and the plurality of third sub-pixels are located within the first virtual quadrilaterals;

wherein the plurality of third sub-pixels form second virtual quadrilaterals, centers of the plurality of third sub-pixels are located at vertices of the second virtual quadrilaterals, and one of a first sub-pixel of the plurality of first sub-pixels or a second sub-pixel of the plurality of second sub-pixels is located within a second virtual quadrilateral of the second virtual quadrilaterals;

wherein a circumscribed parallelogram of the first sub-pixel is a first virtual shape, at least one edge of the first sub-pixel does not coincide with the first virtual shape, a center of the first sub-pixel does not coincide with a center of the first virtual shape, a circumscribed parallelogram of the second sub-pixel is a second virtual shape, at least one edge of the second sub-pixel does not coincide with the second virtual shape, and a center of the second sub-pixel does not coincide with a center of the second virtual shape; and wherein the at least one edge of the first sub-pixel that does not coincide with the first virtual shape comprises a first edge, the at least one edge of the second sub-pixel that does not coincide with the second virtual shape comprises a second edge, and in at least part of adjacent first sub-pixels and second sub-pixels among the plurality of first sub-pixels and the plurality of second sub-pixels, an included angle between the first edge and the second edge is denoted as $\alpha 1$, and $0° \leq \alpha 1 \leq 45°$.

2. The display panel according to claim 1, wherein the first sub-pixel further comprises a third edge and a fourth edge that coincide with the first virtual shape, the third edge and the fourth edge are connected, a first included angle is formed at a joint between the third edge and the fourth edge, and the first included angle is opposite to the first edge; and the second sub-pixel further comprises a fifth edge and a sixth edge that coincide with the second virtual shape, the fifth edge and the sixth edge are connected, a second included angle is formed at a joint between the fifth edge and the sixth edge, and the second included angle is opposite to the second edge.

3. The display panel according to claim 2, wherein a direction pointed from the first included angle to the first edge is a first pointing direction, and a direction pointed from the second included angle to the second edge is a second pointing direction; and in at least part of the adjacent first sub-pixels and second sub-pixels, the first pointing direction is same as the second pointing direction.

4. The display panel according to claim 3, wherein the plurality of first sub-pixels and the plurality of second sub-pixels are alternately arranged along a first direction, and among the plurality of first sub-pixels and the plurality of second sub-pixels, a first sub-pixel and a second sub-pixel that are adjacent and arranged along the first direction form a first pixel group;

in a same first pixel group, the first pointing direction is the same as the second pointing direction; and in two first pixel groups that are adjacent and arranged along the first direction, first pointing directions and second pointing directions are opposite.

5. The display panel according to claim 4, wherein the plurality of first sub-pixels and the plurality of second sub-pixels are further alternately arranged along a second direction, and the first direction intersects the second direction; and among the plurality of first sub-pixels and the plurality of second sub-pixels, in a first sub-pixel and a second sub-pixel that are adjacent and arranged along the second direction, the first pointing direction is opposite to the second pointing direction.

6. The display panel according to claim 5, wherein at least one of following is satisfied:

among the plurality of first sub-pixels, first sub-pixels that are arranged along the second direction have a same first pointing direction; or among the plurality of second sub-pixels, second sub-pixels that are arranged along the second direction have a same second pointing direction.

7. The display panel according to claim 3, wherein at least one of following is satisfied:

the plurality of first sub-pixels and the plurality of third sub-pixels are alternately arranged along a third direction; among the plurality of first sub-pixels, two first sub-pixels that are adjacent and arranged along the third direction form a second pixel group; and in a same second pixel group, first pointing directions of the two first sub-pixels are opposite; or the plurality of second sub-pixels and the plurality of third sub-pixels are alternately arranged along the third direction; among the plurality of second sub-pixels, two second sub-pixels that are adjacent and arranged along the third direction form a third pixel group; and in a same third pixel group, second pointing directions of the two second sub-pixels are opposite.

8. The display panel according to claim 7, wherein when the two first sub-pixels that are adjacent and arranged along the third direction form the second pixel group, first pointing directions of two first sub-pixels that are adjacent and belong to different second pixel groups are the same; and when the two second sub-pixels that are adjacent and arranged along the third direction form the third pixel group, second pointing directions of two second sub-pixels that are adjacent and belong to different third pixel groups are the same.

9. The display panel according to claim 7, further comprising a plurality of scan lines and a plurality of data lines that intersect, wherein an extension direction of the plurality of scan lines is a first direction, an extension direction of the plurality of data lines is a second direction, and the third direction intersects each of the first direction and the second direction.

10. The display panel according to claim 1, wherein at least one of following is satisfied:

the plurality of first sub-pixels and the plurality of third sub-pixels are alternately arranged along a third direction; and an extension direction of a third sub-pixel located between two adjacent first sub-pixels is parallel to the third direction; or the plurality of second sub-pixels and the plurality of third sub-pixels are alternately arranged along the third direction; and an extension direction of a third sub-pixel located between two adjacent second sub-pixels intersects the third direction.

11. The display panel according to claim 3, wherein the plurality of first sub-pixels and the plurality of second sub-pixels are alternately arranged along a first direction; and wherein at least one of following is satisfied:

among the plurality of first sub-pixels, first pointing directions of any four first sub-pixels that are adjacent and arranged sequentially along the first direction are different; a value range of an included angle β11 between first pointing directions of two first sub-pixels that are adjacent and arranged sequentially along the first direction is $0° < β11 < 135°$; and a value range of an included angle β12 between first pointing directions of two first sub-pixels that are arranged sequentially along the first direction and are located on two opposite sides of a same first sub-pixel is $135° < β12 < 270°$; or among the plurality of second sub-pixels, second pointing directions of any four second sub-pixels that are adjacent and arranged sequentially along the first direction are different; a value range of an included angle β21 between second pointing directions of two second sub-pixels that are adjacent and arranged sequentially along the first direction is $0° < β21 < 135°$;

and a value range of an included angle β22 between second pointing directions of two second sub-pixels that are arranged sequentially along the first direction and are located on two opposite sides of a same second sub-pixel is $135° < β22 < 270°$.

12. The display panel according to claim 11, wherein the plurality of first sub-pixels and the plurality of second sub-pixels are further alternately arranged along a second direction, and the first direction intersects the second direction;

wherein at least one of following is satisfied:

among the plurality of first sub-pixels, first pointing directions of any four first sub-pixels that are adjacent and arranged sequentially along the second direction are different; a value range of an included angle β13 between first pointing directions of two first sub-pixels that are adjacent and arranged sequentially along the second direction is $0° < β13 < 135°$; and a value range of an included angle β14 between first pointing directions of two first sub-pixels that are arranged sequentially along the second direction and are located on two opposite sides of a same first sub-pixel is $135° < β14 < 270°$; or among the plurality of second sub-pixels, second pointing directions of any four second sub-pixels that are adjacent and arranged sequentially along the second direction are different; a value range of an included angle β23 between second pointing directions of two second sub-pixels that are adjacent and arranged sequentially along the second direction is $0° < β23 < 135°$; and a value range of an included angle β24 between second pointing directions of two second sub-pixels that are arranged sequentially along the second direction and are located on two opposite sides of a same second sub-pixel is $135° < β24 < 270°$.

13. The display panel according to claim 1, wherein the first virtual shape comprises a first virtual edge and a second virtual edge that are connected, and a connection point between the first virtual edge and the second virtual edge is a first virtual point; the first sub-pixel further comprises a seventh edge that partially coincides with the first virtual edge and an eighth edge that partially coincides with the second virtual edge; the first edge is connected to a same side of the seventh edge and the eighth edge; a connection point between the first edge and the seventh edge is a first connection point, and a connection point between the first edge and the eighth edge is a second connection point; a minimum distance from the first connection point to the first virtual point is denoted as 111, and a minimum distance from the second connection point to the first virtual point is denoted as 112; and a length of the first virtual edge is denoted as L11, and a length of the second virtual edge is denoted as L12; and the second virtual shape comprises a third virtual edge and a fourth virtual edge that are connected, and a connection point between the third virtual edge and the fourth virtual edge is a second virtual point; the second sub-pixel further comprises a ninth edge that partially coincides with the third virtual edge and a tenth edge that partially coincides with the fourth virtual edge; the second edge is connected to a same side of the ninth edge and the tenth edge; a connection point between the second edge and the ninth edge is a third connection point, and a connection point between the second edge and the tenth edge is a fourth connection point; a minimum distance from the third connection point to the second virtual point is denoted as 121, and a minimum distance from the fourth connection point to the second virtual point is denoted as 122; and a length of the third virtual edge is denoted as L21, and a length of the fourth virtual edge is denoted as L22, wherein at least one of following is satisfied:

$$1/40 \le 111/L11 \le 1/2, \text{ and } 1/40 \le 112/L12 \le 1/2; \text{ or}$$

$$1/40 \le 121/L21 \le 1/2, \text{ and } 1/40 \le 122/L22 \le 1/2.$$

14. The display panel according to claim 13, wherein at least one of following is satisfied: 111=112, or 121=122.

15. The display panel according to claim 13, wherein $1/3 \le (111*112)/(121*122) \le 1$.

16. The display panel according to claim 13, wherein 111/L11=121/L21, and 112/L12=122/L22.

17. The display panel according to claim 1, wherein the at least one edge of the first sub-pixel that does not coincide with the first virtual shape further comprises an eleventh edge; the at least one edge of the second sub-pixel that does not coincide with the second virtual shape further comprises a twelfth edge; and in at least part of the adjacent first sub-pixels and second sub-pixels, an included angle between the eleventh edge and the twelfth edge is denoted as α2, and $0° \le α2 \le 45°$.

18. The display panel according to claim 17, wherein in a same one of the plurality of first sub-pixels, the first edge is parallel to the eleventh edge; and in a same one of the plurality of second sub-pixels, the second edge is parallel to the twelfth edge.

19. The display panel according to claim 18, wherein a length of the first edge is denoted as L31, and a length of the eleventh edge is denoted as L32, wherein $L31 \neq L32$; and a length of the second edge is denoted as L41, and a length of the twelfth edge is denoted as L42, wherein $L41 \neq L42$.

20. The display panel according to claim 19, wherein $0 < L32/L31 < 0.5$, and $0 < L42/L41 < 0.5$.

21. The display panel according to claim 19, wherein the first sub-pixel further comprises a third edge, a fourth edge, a seventh edge and an eighth edge; the first edge is connected to a same side of the seventh edge and the eighth edge, and the eleventh edge is connected to a same side of the third edge and the fourth edge; a connection point between the first edge and the seventh edge is a first connection point, and a connection point between the first edge and the eighth edge is a second connection point; and a connection point between the eleventh edge and the third edge is a fifth connection point, and a connection point between the eleventh edge and the fourth edge is a sixth connection point; and the first virtual shape comprises a first virtual edge, a second virtual edge, a fifth virtual edge and a sixth virtual edge; the first virtual edge is connected to the second virtual edge, and a connection point between the first virtual edge and the second virtual edge is a first virtual point; the fifth virtual edge is connected to the sixth virtual edge, and a connection point between the fifth virtual edge and the sixth virtual edge is a third virtual point; the seventh edge partially coincides with the first virtual edge, the eighth edge partially coincides with the second virtual edge, the third edge partially coincides with the fifth virtual edge, and the fourth edge partially coincides with the sixth virtual edge, wherein a length of the seventh edge is denoted as L51, a length of the eighth edge is denoted as L52, a length of the third edge is denoted as L53, and a length of the fourth edge is denoted as L54; a minimum distance from the first connection point to the first virtual point is denoted as 111, a minimum distance from the second connection point to the first virtual point is denoted as 112, a minimum distance from the fifth connection point to the third virtual point is denoted as 113, and a minimum distance from the sixth connection point to the third virtual point is denoted as 114; and $$1/40 \leq 111/L51 \leq 1/2,\ 1/40 \leq 112/L52 \leq 1/2,$$

$$1/40 \leq 113/L53 \leq 1/2 \text{ and } 1/40 \leq 114/L54 \leq 1/2.$$

22. The display panel according to claim 19, wherein the second sub-pixel further comprises a fifth edge, a sixth edge, a ninth edge and a tenth edge; the second edge is connected to a same side of the ninth edge and the tenth edge, and the twelfth edge is connected to a same side of the fifth edge and the sixth edge; a connection point between the second edge and the ninth edge is a third connection point, and a connection point between the second edge and the tenth edge is a fourth connection point; and a connection point between the twelfth edge and the fifth edge is a seventh connection point, and a connection point between the twelfth edge and the sixth edge is an eighth connection point; and the second virtual shape comprises a third virtual edge, a fourth virtual edge, a seventh virtual edge and an eighth virtual edge; the third virtual edge is connected to the fourth virtual edge, and a connection point between the third virtual edge and the fourth virtual edge is a second virtual point; the seventh virtual edge is connected to the eighth virtual edge, and a connection point between the seventh virtual edge and the eighth virtual edge is a fourth virtual point; the ninth edge partially coincides with the third virtual edge, the tenth edge partially coincides with the fourth virtual edge, the fifth edge partially coincides with the seventh virtual edge, and the sixth edge partially coincides with the eighth virtual edge, wherein a length of the ninth edge is denoted as L61, a length of the tenth edge is denoted as L62, a length of the fifth edge is denoted as L63, and a length of the sixth edge is denoted as L64; a minimum distance from the third connection point to the second virtual point is denoted as 121, a minimum distance from the fourth connection point to the second virtual point is denoted as 122, a minimum distance from the seventh connection point to the fourth virtual point is denoted as 123, and a minimum distance from the eighth connection point to the fourth virtual point is denoted as 124; and $$1/40 \leq 121/L61 \leq 1/2,\ 1/40 \leq 122/L62 \leq 1/2,$$

$$1/40 \leq 123/L63 \leq 1/2 \text{ and } 1/40 \leq 124/L64 \leq 1/2.$$

23. The display panel according to claim 18, wherein at least one of following is satisfied:

the first virtual shape comprises a first virtual axis, the center of the first virtual shape is located on the first virtual axis, the first virtual axis intersects the first edge and the eleventh edge, and at least one of a midpoint of the first edge or a midpoint of the eleventh edge is not located on the first virtual axis; or the second virtual shape comprises a second virtual axis, the center of the second virtual shape is located on the second virtual axis, the second virtual axis intersects the second edge and the twelfth edge, and at least one of a midpoint of the second edge or a midpoint of the twelfth edge is not located on the second virtual axis.

24. The display panel according to claim 18, wherein at least one of following is satisfied:

the first virtual shape comprises a first virtual axis, the center of the first virtual shape is located on the first virtual axis, the first virtual axis intersects the first edge and the eleventh edge, and both midpoints of the first edge and the eleventh edge are located on the first virtual axis; or the second virtual shape comprises a second virtual axis, the center of the second virtual shape is located on the second virtual axis, the second virtual axis intersects the second edge and the twelfth edge, and both midpoints of the second edge and the twelfth edge are located on the second virtual axis.

25. The display panel according to claim 17, wherein the first sub-pixel further comprises a thirteenth edge that partially coincides with the first virtual shape, and the thirteenth edge is connected to the first edge and the eleventh edge; and the second sub-pixel further comprises a fourteenth edge that partially coincides with the second virtual shape, and the fourteenth edge is connected to the second edge and the twelfth edge.

26. The display panel according to claim 25, wherein at least one of following is satisfied:

a length of the first edge is denoted as L31, a length of the eleventh edge is denoted as L32, and L31=L32; or a length of the second edge is denoted as L41, a length of the twelfth edge is denoted as L42, and L41=L42.

27. The display panel according to claim 25, wherein the first sub-pixel further comprises a seventh edge and a fourth edge that are parallel to each other; the first edge is connected to the seventh edge and the thirteenth edge, a connection point between the first edge and the seventh edge is a first connection point, and a connection point between the first edge and the thirteenth edge is a second connection point; and the eleventh edge is connected to the thirteenth edge and the fourth edge, a connection point between the eleventh edge and the thirteenth edge is a ninth connection point, and a connection point between the eleventh edge and the fourth edge is a tenth connection point; and the first virtual shape comprises a first virtual edge, a second virtual edge and a sixth virtual edge, the first virtual edge is parallel to the sixth virtual edge, the second virtual edge is connected to the first virtual edge and the sixth virtual edge, a connection point between the second virtual edge and the first virtual edge is a first virtual point, and a connection point between the second virtual edge and the sixth virtual edge is a fifth virtual point; and the seventh edge partially coincides with the first virtual edge, the thirteenth edge partially coincides with the second virtual edge, and the fourth edge partially coincides with the sixth virtual edge, wherein a minimum distance from the first connection point to the first virtual point is denoted as 111, a minimum distance from the second connection point to the first virtual point is denoted as 112, a minimum distance from the ninth connection point to the fifth virtual point is denoted as 115, a minimum distance from the tenth connection point to the fifth virtual point is denoted as 116, and 111*112=115*116.

28. The display panel according to claim 25, wherein the second sub-pixel further comprises a ninth edge and a sixth edge that are parallel to each other; the second edge is connected to the ninth edge and the fourteenth edge, a connection point between the second edge and the ninth edge is a third connection point, and a connection point between the second edge and the fourteenth edge is a fourth connection point; and the twelfth edge is connected to the fourteenth edge and the sixth edge, a connection point between the twelfth edge and the fourteenth edge is an eleventh connection point, and a connection point between the twelfth edge and the sixth edge is a twelfth connection point; and the second virtual shape comprises a third virtual edge, a fourth virtual edge and an eighth virtual edge, the third virtual edge is parallel to the eighth virtual edge, the fourth virtual edge is connected to the third virtual edge and the eighth virtual edge, a connection point between the fourth virtual edge and the third virtual edge is a second virtual point, and a connection point between the fourth virtual edge and the eighth virtual edge is a sixth virtual point; and the ninth edge partially coincides with the third virtual edge, the fourteenth edge partially coincides with the fourth virtual edge, and the sixth edge partially coincides with the eighth virtual edge, wherein a minimum distance from the third connection point to the second virtual point is denoted as 121, a minimum distance from the fourth connection point to the second virtual point is denoted as 122, a minimum distance from the eleventh connection point to the sixth virtual point is denoted as 125, a minimum distance from the twelfth connection point to the sixth virtual point is denoted as 126, and 121*122=125*126.

29. The display panel according to claim 27, wherein a length of the thirteenth edge is denoted as L55, a length of the second virtual edge is denoted as L12, and L55≤L12/2.

30. The display panel according to claim 28, wherein a length of the fourteenth edge is denoted as L65, a length of the fourth virtual edge is denoted as L22, and L65≤L22/2.

31. The display panel according to claim 25, wherein at least one of following is satisfied:

the first virtual shape comprises a third virtual axis, the center of the first virtual shape is located on the third virtual axis, the third virtual axis intersects the thirteenth edge, and a midpoint of the thirteenth edge is not located on the third virtual axis; or the second virtual shape comprises a fourth virtual axis, the center of the second virtual shape is located on the fourth virtual axis, the fourth virtual axis intersects the fourteenth edge, and a midpoint of the fourteenth edge is not located on the fourth virtual axis.

32. The display panel according to claim 25, wherein at least one of following is satisfied:

the first virtual shape comprises a third virtual axis, the center of the first virtual shape is located on the third virtual axis, the third virtual axis intersects the thirteenth edge, and a midpoint of the thirteenth edge is located on the third virtual axis; or the second virtual shape comprises a fourth virtual axis, the center of the second virtual shape is located on the fourth virtual axis, the fourth virtual axis intersects the fourteenth edge, and a midpoint of the fourteenth edge is located on the fourth virtual axis.

33. The display panel according to claim 25, wherein at least one of following is satisfied:

the first virtual shape comprises a third virtual axis, the center of the first virtual shape is located on the third virtual axis, the third virtual axis intersects the thirteenth edge, and the first edge and the eleventh edge are symmetrical with respect to the third virtual axis; or the second virtual shape comprises a fourth virtual axis, the center of the second virtual shape is located on the fourth virtual axis, the fourth virtual axis intersects the fourteenth edge, and the second edge and the twelfth edge are symmetrical with respect to the fourth virtual axis.

34. The display panel according to claim 17, wherein a length of the first edge is denoted as L31, a length of the eleventh edge is denoted as L32, a length of the second edge is denoted as L41, and a length of the twelfth edge is denoted as L42; and $$1/10 \le (L31 + L32)/(L41 + L42) \le 1.$$

35. The display panel according to claim 1, wherein a center of a first virtual quadrilateral of the first virtual quadrilaterals does not coincide with a center of a third sub-pixel that is located within the first virtual quadrilateral.

36. The display panel according to claim 1, wherein a center of the second virtual quadrilaterals does not coincide with a center of a first sub-pixel that is located within the second virtual quadrilateral; or a center of the second virtual quadrilateral does not coincide with a center of a second sub-pixel that is located within the second virtual quadrilateral.

37. The display panel according to claim 1, wherein the plurality of first sub-pixels and the plurality of second sub-pixels are alternately arranged along a first direction and a second direction, and the first direction intersects the second direction;

the display panel further comprises a plurality of first virtual groups, a first virtual group of the plurality of first virtual groups comprises four first virtual quadrilaterals arranged along the first direction, and adjacent first virtual quadrilaterals have a common edge;

in a same one of the plurality of first virtual groups, the four first virtual quadrilaterals are a first-type virtual quadrilateral, a second-type virtual quadrilateral, a third-type virtual quadrilateral and a fourth-type virtual quadrilateral respectively that are arranged along the first direction; and each of the first-type virtual quadrilateral and the third-type virtual quadrilateral is a parallelogram; and each of the second-type virtual quadrilateral and the fourth-type virtual quadrilateral is an isosceles trapezoid.

38. The display panel according to claim 1, further comprising a plurality of support columns, wherein along a thickness direction of the display panel, a support column of the plurality of support columns overlaps at least one virtual edge of a corresponding one of the first virtual quadrilaterals, and a virtual edge of the at least one virtual edge intersects at least one of the first edge or the second edge.

39. The display panel according to claim 38, wherein one of the plurality of first sub-pixels, one of the plurality of second sub-pixels and two of the plurality of third sub-pixels form a third virtual quadrilateral, centers of the two of the plurality of third sub-pixels are located at two opposite vertices of the third virtual quadrilateral, and a center of the one of the plurality of first sub-pixels and a center of the one of the plurality of second sub-pixels are located at other two opposite vertices of the third virtual quadrilateral respectively; and an included angle between each extension direction of the two of the plurality of third sub-pixels and an extension direction of a respective one of the plurality of support columns toward the one of the plurality of second sub-pixels is denoted as $\alpha 3$, and $40° \leq \alpha 3 \leq 50°$.

40. The display panel according to claim 1, further comprising:

a substrate; and a pixel defining layer and a plurality of light-emitting elements that are located on a side of the substrate, wherein the pixel defining layer comprises a plurality of pixel openings, and a light-emitting element of the plurality of light-emitting elements comprises a first electrode, a second electrode and a light-emitting layer located between the first electrode and the second electrode;

wherein the plurality of light-emitting elements comprise the plurality of first sub-pixels, the plurality of second sub-pixels and the plurality of third sub-pixels; and wherein in at least one of the plurality of first sub-pixels or the plurality of second sub-pixels, a shape of the first electrode is roughly same as a shape of a respective one of the plurality of pixel openings.

41. The display panel according to claim 1, further comprising:

a substrate; and a pixel defining layer and a plurality of light-emitting elements that are located on a side of the substrate, wherein the pixel defining layer comprises a plurality of pixel openings, and a light-emitting element of the plurality of light-emitting elements comprises a first electrode, a second electrode and a light-emitting layer located between the first electrode and the second electrode;

wherein the plurality of light-emitting elements comprise the plurality of first sub-pixels, the plurality of second sub-pixels and the plurality of third sub-pixels; and wherein in at least one of the plurality of first sub-pixels or the plurality of second sub-pixels, a shape of the light-emitting layer is roughly same as a shape of a corresponding one of the plurality of pixel openings.

42. A display device, comprising a display panel, wherein the display panel comprises: a plurality of first sub-pixels, a plurality of second sub-pixels and a plurality of third sub-pixels, wherein the plurality of first sub-pixels and the plurality of second sub-pixels form first virtual quadrilaterals, centers of the plurality of first sub-pixels are located at first vertices of the first virtual quadrilaterals, centers of the plurality of second sub-pixels are located at second vertices of the first virtual quadrilaterals, the first vertices and the second vertices are alternated and spaced apart, and the plurality of third sub-pixels are located within the first virtual quadrilaterals;

wherein the plurality of third sub-pixels form second virtual quadrilaterals, centers of the plurality of third sub-pixels are located at vertices of the second virtual quadrilaterals, and one of a first sub-pixel of the plurality of first sub-pixels or a second sub-pixel of the plurality of second sub-pixels is located within a second virtual quadrilateral of the second virtual quadrilaterals;

wherein a circumscribed parallelogram of the first sub-pixel is a first virtual shape, at least one edge of the first sub-pixel does not coincide with the first virtual shape, a center of the first sub-pixel does not coincide with a center of the first virtual shape, a circumscribed parallelogram of the second sub-pixel is a second virtual shape, at least one edge of the second sub-pixel does not coincide with the second virtual shape, and a center of the second sub-pixel does not coincide with a center of the second virtual shape; and wherein the at least one edge of the first sub-pixel that does not coincide with the first virtual shape comprises a first edge, the at least one edge of the second sub-pixel that does not coincide with the second virtual shape comprises a second edge, and in at least part of adjacent first sub-pixels and second sub-pixels among the plurality of first sub-pixels and the plurality of second sub-pixels, an included angle between the first edge and the second edge is denoted as $\alpha 1$, and $0° \leq \alpha 1 \leq 45°$.

* * * * *